United States Patent
Chiou et al.

(10) Patent No.: US 12,484,323 B2
(45) Date of Patent: Nov. 25, 2025

(54) STACKED IMAGE SENSOR DEVICE AND METHOD OF FORMING SAME

(71) Applicant: Taiwan Semiconductor Manufacturing Co., Ltd., Hsinchu (TW)

(72) Inventors: Wen-Chih Chiou, Zhunan Township (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 78 days.

(21) Appl. No.: 18/174,095

(22) Filed: Feb. 24, 2023

(65) Prior Publication Data

US 2023/0197760 A1    Jun. 22, 2023

Related U.S. Application Data

(63) Continuation of application No. 16/890,019, filed on Jun. 2, 2020, now Pat. No. 11,594,571.

(60) Provisional application No. 62/982,250, filed on Feb. 27, 2020.

(51) Int. Cl.
  *H10F 39/18* (2025.01)
  *H10B 20/00* (2023.01)

(52) U.S. Cl.
  CPC ......... *H10F 39/1895* (2025.01); *H10B 20/65* (2023.02)

(58) Field of Classification Search
  CPC ........................... H01L 27/14661; H10B 20/65
  USPC ...................................................... 257/431
  See application file for complete search history.

(56) References Cited

U.S. PATENT DOCUMENTS

| | | | |
|---|---|---|---|
| 2006/0231928 A1* | 10/2006 | Dotta | H01L 21/76898 257/E21.597 |
| 2007/0161266 A1 | 7/2007 | Nishizawa | |
| 2011/0155893 A1* | 6/2011 | Endo | H10F 39/199 257/292 |
| 2012/0018885 A1* | 1/2012 | Lee | H01L 23/481 257/738 |
| 2012/0282735 A1 | 11/2012 | Ahn et al. | |
| 2013/0020468 A1* | 1/2013 | Mitsuhashi | H01L 27/14636 257/E21.585 |
| 2013/0062761 A1 | 3/2013 | Lin et al. | |
| 2013/0075902 A1 | 3/2013 | Chow et al. | |
| 2013/0235262 A1* | 9/2013 | Chao | H01L 27/14618 348/E5.026 |
| 2013/0285180 A1* | 10/2013 | Wang | H01L 27/14618 257/E31.127 |

(Continued)

FOREIGN PATENT DOCUMENTS

| CN | 103000593 A | 3/2013 |
|---|---|---|
| CN | 206134684 U | 4/2017 |

(Continued)

*Primary Examiner* — Sheng-Bai Zhu
(74) *Attorney, Agent, or Firm* — Slater Matsil, LLP

(57) ABSTRACT

A semiconductor device and a method of forming the same are provided. The semiconductor device includes a first logic die including a first through via, an image sensor die hybrid bonded to the first logic die, and a second logic die bonded to the first logic die. A front side of the first logic die facing a front side of the image sensor die. A front side of the second logic die facing a backside of the first logic die. The second logic die comprising a first conductive pad electrically coupled to the first through via.

19 Claims, 44 Drawing Sheets

(56) References Cited

U.S. PATENT DOCUMENTS

| | | | |
|---|---|---|---|
| 2014/0035083 A1* | 2/2014 | Wan | H10F 39/807 |
| | | | 257/E31.124 |
| 2015/0228550 A1* | 8/2015 | Yu | H01L 22/20 |
| | | | 257/48 |
| 2015/0228584 A1* | 8/2015 | Huang | H01L 25/50 |
| | | | 438/618 |
| 2015/0303174 A1* | 10/2015 | Yu | H01L 24/19 |
| | | | 438/109 |
| 2016/0020235 A1 | 1/2016 | Yamashita | |
| 2016/0071820 A1* | 3/2016 | Yu | H01L 23/3107 |
| | | | 257/737 |
| 2016/0358966 A1 | 12/2016 | Borthakur et al. | |
| 2017/0207197 A1* | 7/2017 | Yu | H01L 24/92 |
| 2018/0082988 A1 | 3/2018 | Cheng et al. | |
| 2018/0278869 A1 | 9/2018 | Fan | |
| 2018/0330969 A1* | 11/2018 | Chen | H01L 25/105 |
| 2018/0331066 A1* | 11/2018 | Uzoh | H01L 23/3185 |
| 2019/0103425 A1 | 4/2019 | Yoon et al. | |
| 2019/0123088 A1* | 4/2019 | Kwon | H01L 27/14609 |
| 2019/0157333 A1 | 5/2019 | Tsai | |
| 2019/0221577 A1 | 7/2019 | Kim et al. | |
| 2019/0355706 A1* | 11/2019 | Enquist | H01L 21/76898 |
| 2019/0363074 A1* | 11/2019 | Sukekawa | G11C 5/066 |
| 2020/0105814 A1 | 4/2020 | Hashiguchi et al. | |

FOREIGN PATENT DOCUMENTS

| | | |
|---|---|---|
| DE | 102018122234 A1 | 4/2019 |
| KR | 20180030755 A | 3/2018 |
| KR | 20190038031 A | 4/2019 |
| KR | 20190045642 A | 5/2019 |
| TW | 201839967 A | 11/2018 |
| TW | 201926483 A | 7/2019 |
| TW | 201933585 A | 8/2019 |
| WO | 2019108945 A1 | 6/2019 |

* cited by examiner

STACKED IMAGE SENSOR DEVICE AND METHOD OF FORMING SAME

PRIORITY CLAIM AND CROSS-REFERENCE

This application is a continuation of U.S. application Ser. No. 16/890,019, filed on Jun. 2, 2020, now U.S. Pat. No. 11,594,571, issued Feb. 28, 2023, which claims the benefit of U.S. Provisional Application No. 62/982,250, filed on Feb. 27, 2020, each application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
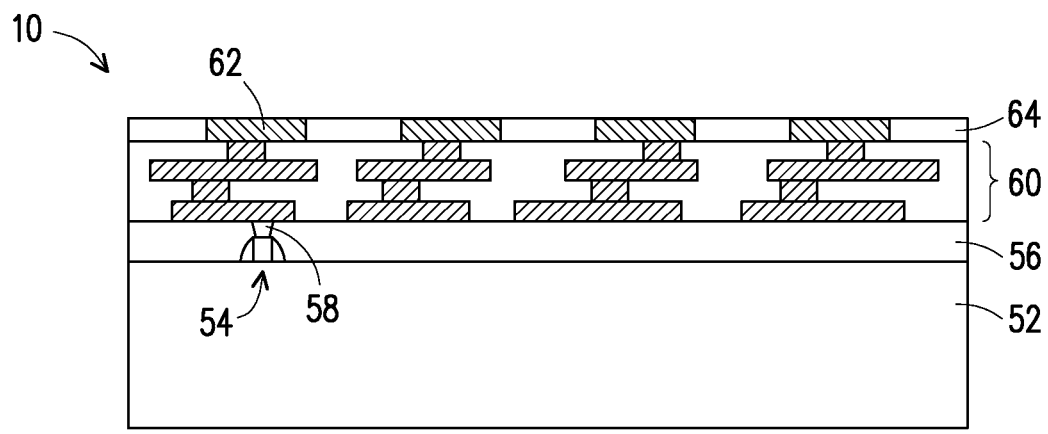
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a package, such as a multi-tier stacked image sensor package, and a method of forming the same. Various embodiments presented herein allow for forming packages for edge artificial intelligence (AI) applications, such as autonomous cars, that may require fast processing speed. Embodiments such as those disclosed herein integrate the logic die and/or the memory (e.g., DRAM chip(s)) within the multi-tier stacked image sensor package for processing the image information, thereby increasing the processing speed to meet functionality and processing speed requirements of edge AI applications.

FIG. 1 illustrates a cross-sectional view of an integrated circuit die 10 in accordance with some embodiments. The integrated circuit die 10 will be packaged in subsequent processing to form an integrated circuit package. The integrated circuit die 10 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 10 may be formed in a wafer, which may include different device regions that are singulated in subsequent steps to form a plurality of integrated circuit dies. The integrated circuit die 10 may be processed according to applicable manufacturing processes to form integrated circuits. For example, the integrated circuit die 10 includes a substrate 52, such as silicon, doped or undoped, or an active layer of a semiconductor-on-insulator (SOI) substrate. The substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 has an active surface (e.g., the surface facing upwards in FIG. 1), sometimes called a front side, and an inactive surface (e.g., the surface facing downwards in FIG. 1), sometimes called a backside.

Devices (represented by a transistor) 54 may be formed at the front surface of the substrate 52. The devices 54 may be active devices (e.g., transistors, diodes, etc.), capacitors, resistors, inductors, the like, or combinations thereof. An inter-layer dielectric (ILD) 56 is over the front surface of the substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, and may be formed using spin coating, lamination, atomic layer deposition (ALD), chemical vapor deposition (CVD), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and the conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. In some embodiments, the interconnect structure 60 may be formed of alternating layers of dielectric (e.g., low-k dielectric material) and conductive (e.g., copper) materials with vias interconnecting the layers of the conductive material and may be formed through any suitable process (such as deposition, damascene, dual damascene, or the like). The metallization patterns of the interconnect structure 60 are electrically coupled to the devices 54 by the conductive plugs 58.

The integrated circuit die 10 further includes pads 62, such as aluminum pads, to which external connections are made. The pads 62 are on the active side of the integrated circuit die 10, such as in and/or on the interconnect structure 60. An insulating layer 64 is on the integrated circuit die 10, such that the pads 62 are embedded in the insulating layer 64. The insulating layer 64 may also be referred to as a passivation layer. In some embodiments, the insulating layer 64 may comprise one or more layers of silicon oxide, silicon nitride, silicon oxynitride, the like, or combinations thereof, and may be formed using ALD, CVD, or the like. In some embodiments, the pads 62 and the insulating layer 64 may be formed by forming and patterning a conductive material over the interconnect structure 60 to form the pads 62, forming an insulating material of the insulating layer 64 over the interconnect structure 60 and the pads 62, and planarizing the insulating material to expose the pads 62.

In other embodiments, the pads 62 and the insulating layer 64 may be formed by forming an insulating material of the insulating layer 64 over the interconnect structure 60, patterning the insulating material to form openings for the pads 62, depositing a conductive material of the pads 62 in the openings, and planarizing the conductive material to remove portions of the conductive material overfilling the openings. Portions of the conductive material remaining in the openings form pads 62. In some embodiments, the planarization process may comprise a chemical mechanical polishing (CMP), grinding, etching, a combination thereof, or the like. In some embodiments, a top surface of the insulating layer 64 and top surfaces of the pads 62 are substantially level or substantially coplanar within process variations of the planarization process.

In some embodiments, a chip probe (CP) testing is performed on the integrated circuit die 10. The CP testing may be performed on the integrated circuit die 10 to ascertain whether the integrated circuit die 10 is a known good die (KGD). Thus, only integrated circuit dies 10, which are KGDs, undergo subsequent processing and are packaged, and dies, which fail the CP testing, are not packaged.

In some embodiments, the integrated circuit die 10 is a stacked device that includes multiple substrates 52. For example, the integrated circuit die 10 may be a memory device such as a hybrid memory cube (HMC) module, a high bandwidth memory (HBM) module, or the like that includes multiple memory dies. In such embodiments, the integrated circuit die 10 includes multiple substrates 52 interconnected by through-substrate vias (TSVs) (not shown). Each of the substrates 52 may (or may not) have an interconnect structure 60.

Figure 2:
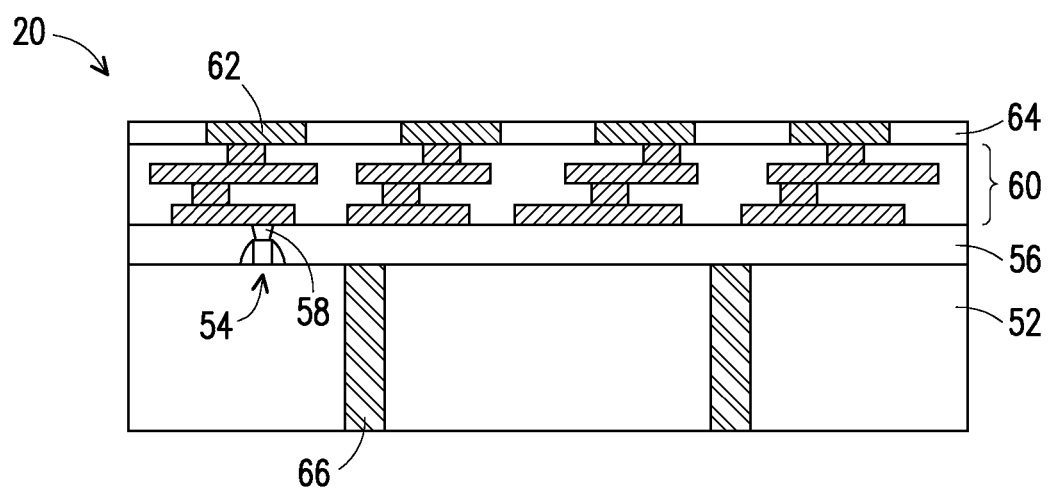
FIG. 2 illustrates a cross-sectional view of an integrated circuit die in accordance with some embodiments.

FIG. 2 illustrates a cross-sectional view of an integrated circuit die 20 in accordance with some embodiments. The integrated circuit die 20 will be packaged in subsequent processing to form an integrated circuit package. In some embodiments, the integrated circuit die 20 is similar to the integrated circuit die 10 (see FIG. 1), with similar features being labeled with similar numerical references, and descriptions of the similar features are not repeated herein. In some embodiments, the integrated circuit die 20 may be formed using the process steps described above with reference to FIG. 1 and the description is not repeated herein. In the illustrated embodiment, the integrated circuit die 20 comprises TSVs 66 extending through the substrate 52. In some embodiments, the TSVs 66 may comprise a suitable conductive material, such as copper, or the like.

Figure 3:
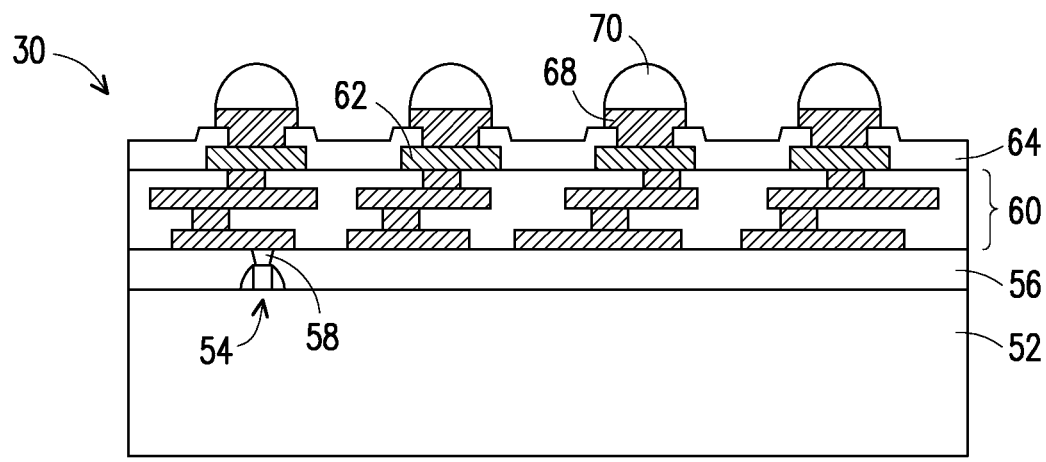
FIG. 3 illustrates a cross-sectional view of an integrated circuit die in accordance with some embodiments.

FIG. 3 illustrates a cross-sectional view of an integrated circuit die 30 in accordance with some embodiments. The integrated circuit die 30 will be packaged in subsequent processing to form an integrated circuit package. In some embodiments, the integrated circuit die 30 is similar to the integrated circuit die 10 (see FIG. 1), with similar features being labeled with similar numerical references, and descriptions of the similar features are not repeated herein.

In some embodiments, the integrated circuit die 30 may be formed using the process steps described above with reference to FIG. 1 and the description is not repeated herein.

In the illustrated embodiment, the insulating layer 64 is on the integrated circuit die 30, such as on portions of the interconnect structure 60 and the pads 62. Openings extend through the insulating layer 64 to the pads 62. Under-bump metallizations (UBMs) 68 extend through the openings in the insulating layer 64 and are physically and electrically coupled to respective ones of the pads 62. The UBMs 68 may be formed of one or more suitable conductive materials.

After forming the UBMs 68, conductive connectors 70 are formed on the UBMs 68. The conductive connectors 70 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 70 may include a conductive material such as solder, copper, aluminum, gold, nickel, silver, palladium, tin, the like, or a combination thereof. In some embodiments, the conductive connectors 70 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 70 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 4:
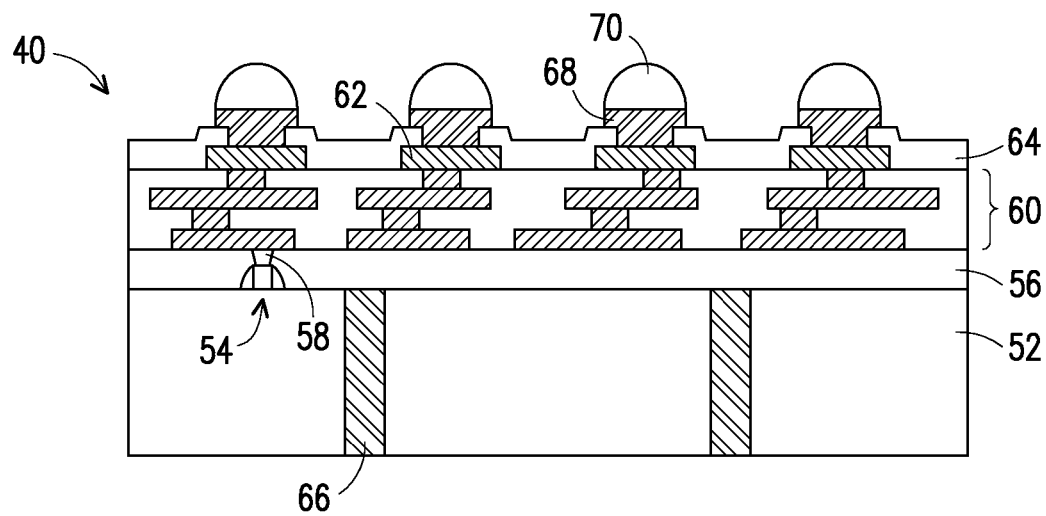
FIG. 4 illustrates a cross-sectional view of an integrated circuit die in accordance with some embodiments.

FIG. 4 illustrates a cross-sectional view of an integrated circuit die 40 in accordance with some embodiments. The integrated circuit die 40 will be packaged in subsequent processing to form an integrated circuit package. In some embodiments, the integrated circuit die 40 is similar to the integrated circuit die 30 (see FIG. 3), with similar features being labeled with similar numerical references, and descriptions of the similar features are not repeated herein. In some embodiments, the integrated circuit die 40 may be formed using the process steps described above with reference to FIGS. 1 and 3, and the description is not repeated herein. In the illustrated embodiment, the integrated circuit die 40 comprises TSVs 66 extending through the substrate 52. In some embodiments, the TSVs 66 may comprise a suitable conductive material, such as copper, or the like.

Figure 5:
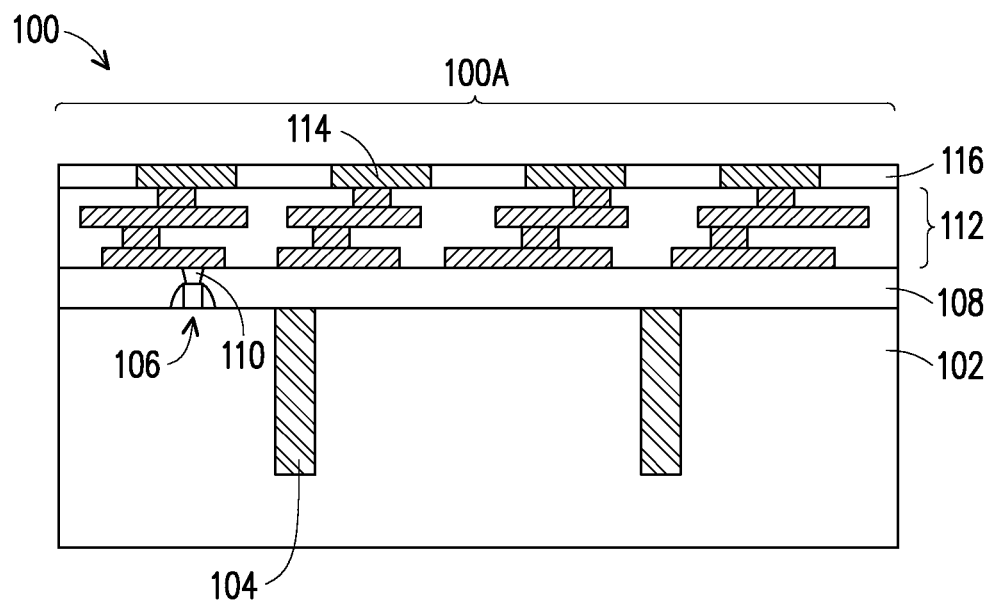
FIGS. 5-18 illustrate cross-sectional views of intermediate steps during a process for forming a package in accordance with some embodiments.

FIGS. 5-18 illustrate cross-sectional views of intermediate steps during a process for forming a package 1000 in accordance with some embodiments. FIG. 5 illustrate cross-sectional view of a die region 100A of a wafer 100 in accordance with some embodiments. The wafer 100 may be also referred to as a logic wafer. In some embodiments, the wafer 100 comprises a plurality of die regions (such as the die region 100A). In some embodiments, the wafer 100 includes a substrate 102. The substrate 102 may be formed using similar materials and methods as the substrate 52 described above with reference to FIG. 1 and the description is not repeated herein. The substrate 102 has an active surface (e.g., the surface facing upwards in FIG. 5), sometimes called a front side, and an inactive surface (e.g., the surface facing downwards in FIG. 5), sometimes called a backside. In some embodiments, the TSVs 104 are formed in the substrate 102. In some embodiments, the TSVs 104 may comprise a suitable conductive material, such as copper, or the like. The TSVs 104 extend from the front side of the substrate 102 toward the backside of the substrate 102.

Devices (represented by a transistor) 106 may be formed at the front surface of the substrate 102. The devices 106 may be active devices (e.g., transistors, diodes, etc.), capacitors, resistors, inductors, the like, or combinations thereof. An ILD 108 is over the front surface of the substrate 102. The ILD 108 surrounds and may cover the devices 106. The ILD 108 may be formed using similar materials and methods as the ILD 56 described above with reference to FIG. 1 and the description is not repeated herein.

Conductive plugs 110 extend through the ILD 108 to electrically and physically couple the devices 106. For example, when the devices 106 are transistors, the conductive plugs 110 may couple the gates and source/drain regions of the transistors. The conductive plugs 110 may be formed using similar materials and methods as the conductive plugs 58 described above with reference to FIG. 1 and the description is not repeated herein.

An interconnect structure 112 is over the ILD 108 and the conductive plugs 110. The interconnect structure 112 interconnects the devices 106 to form an integrated circuit. The interconnect structure 112 may be formed by, for example, metallization patterns in dielectric layers on the ILD 108. The metallization patterns include metal lines and vias formed in one or more low-k dielectric layers. The interconnect structure 112 may be formed using similar materials and methods as the interconnect structure 6o described above with reference to FIG. 1 and the description is not repeated herein.

In some embodiments, the wafer 100 further includes an insulating layer 116 and pads 114 embedded in the insulating layer 116. The pads 114 may be formed using similar materials and methods as the pads 62 described above with reference to FIG. 1 and the description is not repeated herein. The insulating layer 116 may be formed using similar materials and methods as the insulating layer 64 described above with reference to FIG. 1 and the description is not repeated herein. In some embodiments, a top surface of the insulating layer 116 and top surfaces of the pads 114 are substantially level or substantially coplanar within process variations of the planarization process.

Figure 6:
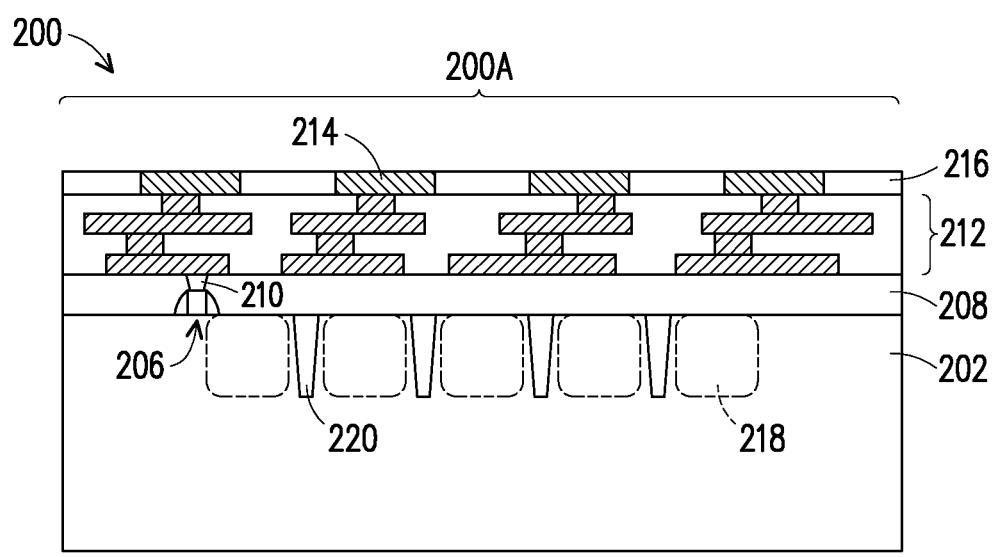

FIG. 6 illustrate cross-sectional view of a die region 200A of a wafer 200 in accordance with some embodiments. The wafer 200 may be also referred to as an image sensor wafer. In some embodiments, the wafer 200 comprises a plurality of die regions (such as the die region 200A). In some embodiments, the wafer 200 includes a substrate 202. The substrate 202 may be formed using similar materials and methods as the substrate 52 described above with reference to FIG. 1 and the description is not repeated herein. The substrate 202 has an active surface (e.g., the surface facing upwards in FIG. 6), sometimes called a front side, and an inactive surface (e.g., the surface facing downwards in FIG. 6), sometimes called a backside.

A plurality of photosensitive pixels 218 are formed at the front surface (an upper surface) of the substrate 202. The photosensitive pixels 218 include respective photosensitive devices (not illustrated), which may be formed, for example, by implanting suitable impurity ions into the substrate 202. The photosensitive devices are configured to convert light signals (e.g., photons) to electrical signals, and may be PN junction photo-diodes, PNP photo-transistors, NPN photo-transistors, or the like. For example, the photosensitive devices may include an n-type implantation region formed within a p-type semiconductor layer (e.g., at least a portion of the substrate 202). In such embodiments, the p-type substrate may isolate and reduce electrical cross-talk between adjacent photo-active regions of the photosensitive pixels 218. In an embodiment, the photosensitive pixels 218 extend from the front surface of the substrate 202 towards the back surface of the substrate 202 and form a photosensitive pixel array. In some embodiments, the photosensitive pixels 218 form a two-dimensional rectangular array as viewed from top. In some embodiments, each photosensitive pixel 218 may further include a transfer gate transistor (not illustrated) and a floating diffusion capacitor (not illustrated). In each photosensitive pixel 218, a first source/drain region of the corresponding transfer gate transistor is electrically coupled to a respective photosensitive device, and a second source/drain region of the corresponding transfer gate transistor is electrically coupled to a respective floating diffusion capacitor.

In some embodiments, isolation regions 220 are formed in the substrate 202 between neighboring photosensitive pixels 218 to prevent electrical cross-talk between the photosensitive pixels 218. In some embodiments, the isolation regions 220 may include shallow trench isolation (STI) structures. In some embodiments, the STI structures may be formed by patterning the front surface of the substrate 202 to form trenches in the substrate 202 and filling the trenches with suitable dielectric materials to form the STI structures. In some embodiments, the substrate 202 is patterned using suitable photolithography and etching processes. In other embodiments, the isolation regions 220 may include various doping regions formed using suitable implantation processes.

Devices (represented by a transistor) 206 may be formed at the front surface of the substrate 202. The devices 206 may be active devices (e.g., transistors, diodes, etc.), capacitors, resistors, inductors, the like, or combinations thereof. An ILD 208 is over the front surface of the substrate 202. The ILD 208 surrounds and may cover the devices 206. The ILD 208 may be formed using similar materials and methods as the ILD 56 described above with reference to FIG. 1 and the description is not repeated herein.

Conductive plugs 210 extend through the ILD 208 to electrically and physically couple the devices 206. For example, when the devices 206 are transistors, the conductive plugs 210 may couple the gates and source/drain regions of the transistors. The conductive plugs 210 may be formed using similar materials and methods as the conductive plugs 58 described above with reference to FIG. 1 and the description is not repeated herein.

An interconnect structure 212 is over the ILD 208 and the conductive plugs 210. The interconnect structure 212 interconnects the devices 206 to form an integrated circuit. The interconnect structure 212 may be formed by, for example, metallization patterns in dielectric layers on the ILD 208. The metallization patterns include metal lines and vias formed in one or more low-k dielectric layers. The interconnect structure 212 may be formed using similar materials and methods as the interconnect structure 60 described above with reference to FIG. 1 and the description is not repeated herein.

In some embodiments, the wafer 200 further includes an insulating layer 216 and pads 214 embedded in the insulating layer 216. The pads 214 may be formed using similar materials and methods as the pads 62 described above with reference to FIG. 1 and the description is not repeated herein. The insulating layer 216 may be formed using similar materials and methods as the insulating layer 64 described above with reference to FIG. 1 and the description is not repeated herein. In some embodiments, a top surface of the insulating layer 216 and top surfaces of the pads 214 are substantially level or substantially coplanar within process variations of the planarization process.

Figure 7:
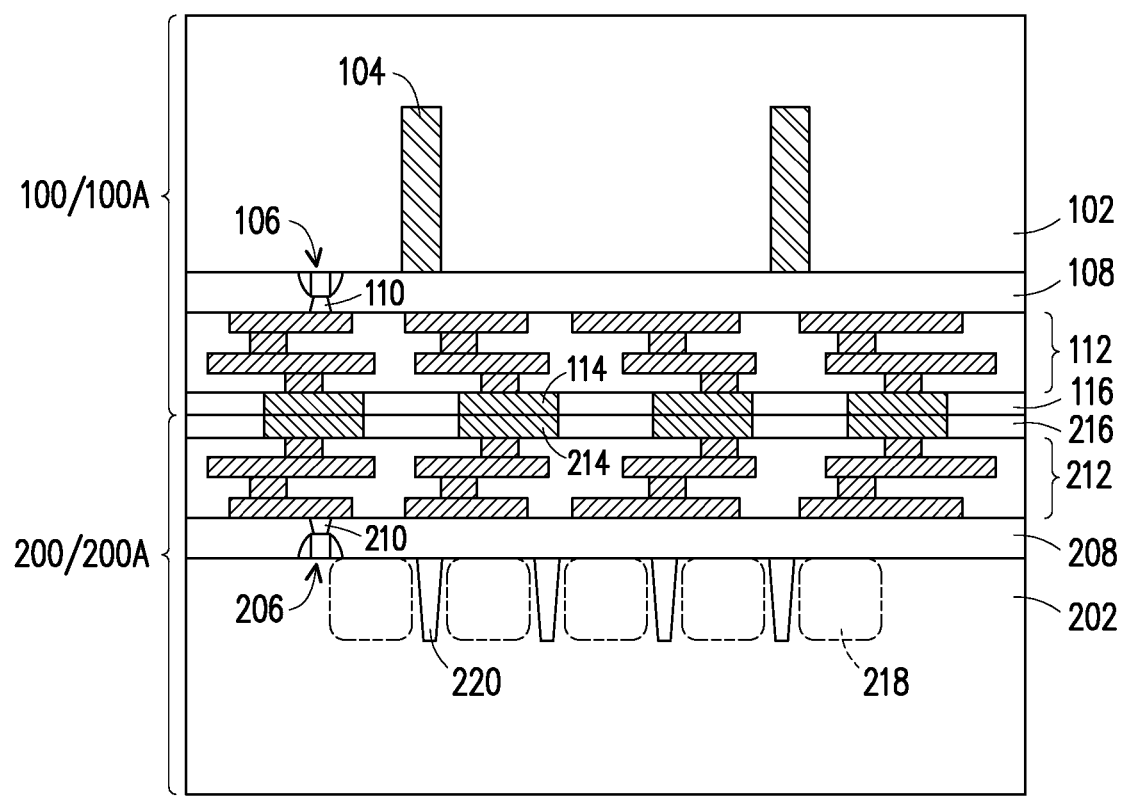

FIG. 7 illustrates bonding the wafer 100 to the wafer 200. In some embodiments, the wafer 100 is bonded to the wafer 200 using a hybrid bonding method. The hybrid bonding method includes direct bonding the pads 114 of the wafer 100 to the respective pads 214 of the wafer 200, and direct boding the insulating layer 116 of the wafer 100 to the insulating layer 216 of the wafer 200. In some embodiments, the wafer 100 is bonded to the wafer 200 such that die regions (such as the die region 100A) of the wafer 100 are bonded to respective die regions (such as the die region 200A) of the wafer 200.

Figure 8:
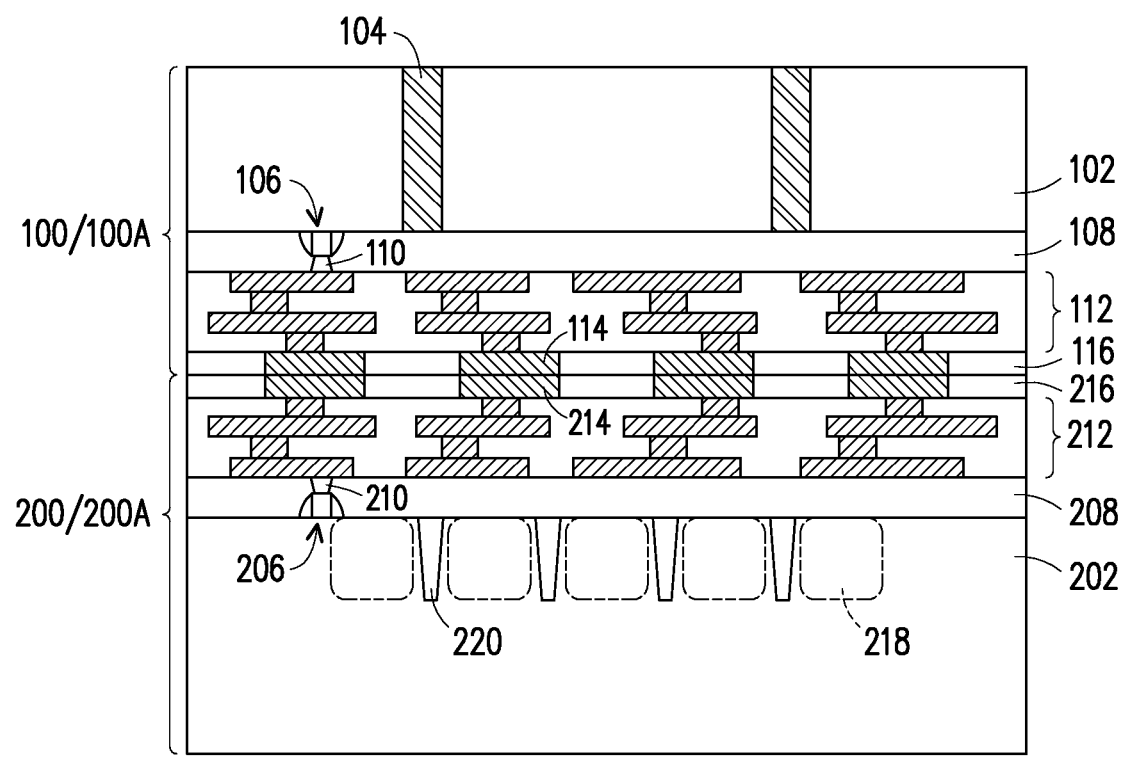

FIG. 8 illustrates a thinning process performed on the backside of the substrate 102 of the wafer 100. In some embodiments, the thinning process comprises CMP, grinding, etching, a combination thereof, or the like. The thinning process removes a portion of the substrate 102 and exposes the TSVs 104 formed within the substrate 102. In some embodiments, the back surface of the substrate 102 and exposed surfaces of the TSVs 104 are substantially level or substantially coplanar within process variations of the thinning process.

FIGS. 9-14 illustrate a formation of a wafer-level packaged structure 3000 on the backside of the wafer 100. The wafer-level packaged structure 3000 may be also referred to as a wafer-level integrated fan-out (InFO) structure. The wafer-level packaged structure 3000 comprises a plurality of die regions, such as the die region 3000A. The die region 3000A of the wafer-level packaged structure 3000 corresponds to the die region 100A of the wafer 100 and the die region 200A of the wafer 200.

Figure 9:
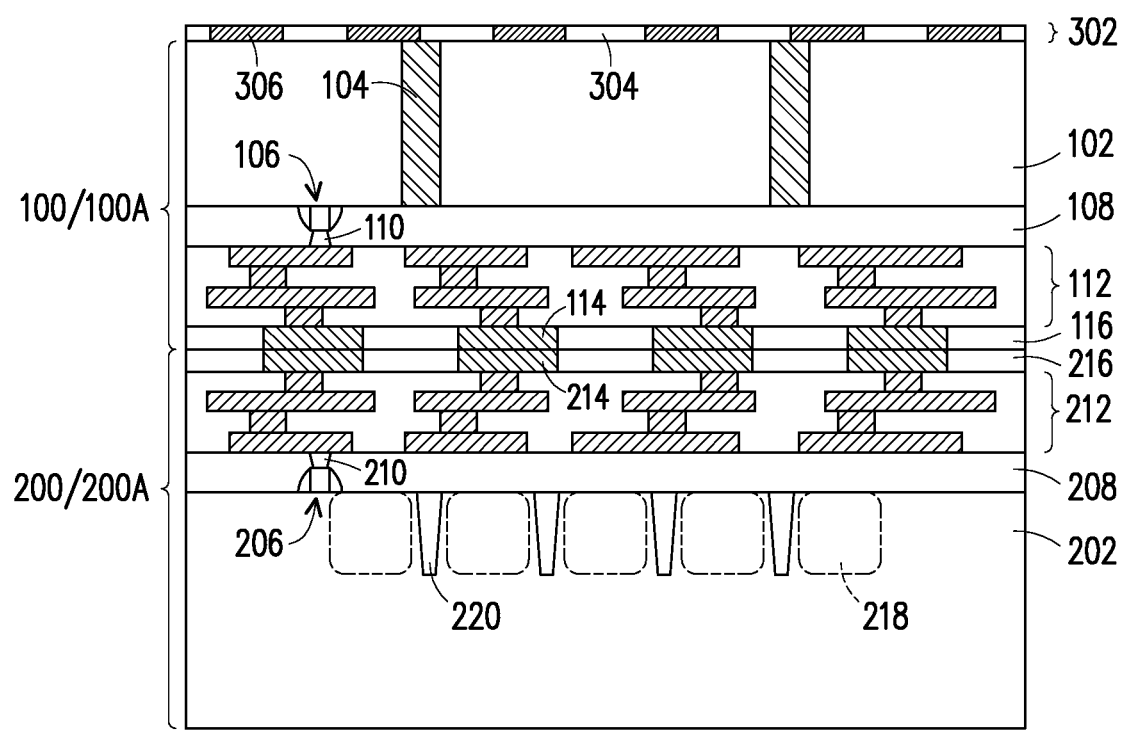

FIG. 9 illustrates a formation of an insulating layer 304 and pads 306 on the backside of the wafer 100. The pads 306 may be formed using similar materials and methods as the pads 62 described above with reference to FIG. 1 and the description is not repeated herein. The insulating layer 304 may be formed using similar materials and methods as the insulating layer 64 described above with reference to FIG. 1 and the description is not repeated herein. In some embodiments, a top surface of the insulating layer 304 and top surfaces of the pads 306 are substantially level or substantially coplanar within process variations of the planarization process. In some embodiments, the insulating layer 304 and the pads 306 form a redistribution structure 302. In the illustrated embodiment, the redistribution structure 302 comprises a single conductive layer and a single insulating layer. In other embodiments, the redistribution structure 302 may comprises a plurality of conductive layers and a plurality of insulating layers.

Figure 10:
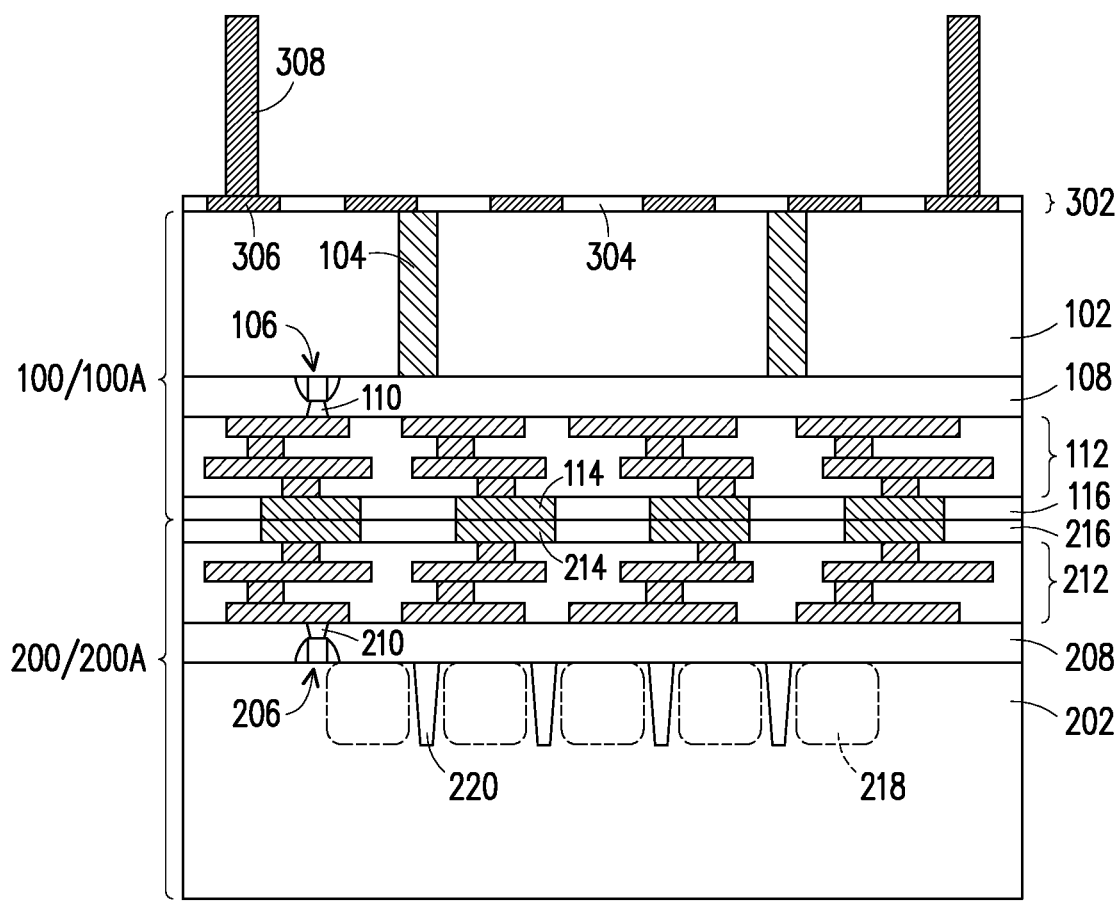

FIG. 10 illustrates a formation of through vias 308 over the pads 306 of the redistribution structure 302. As an example to form the through vias 308, a seed layer (not shown) is formed over the insulating layer 304 and the pads 306. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 308.

Figure 11:
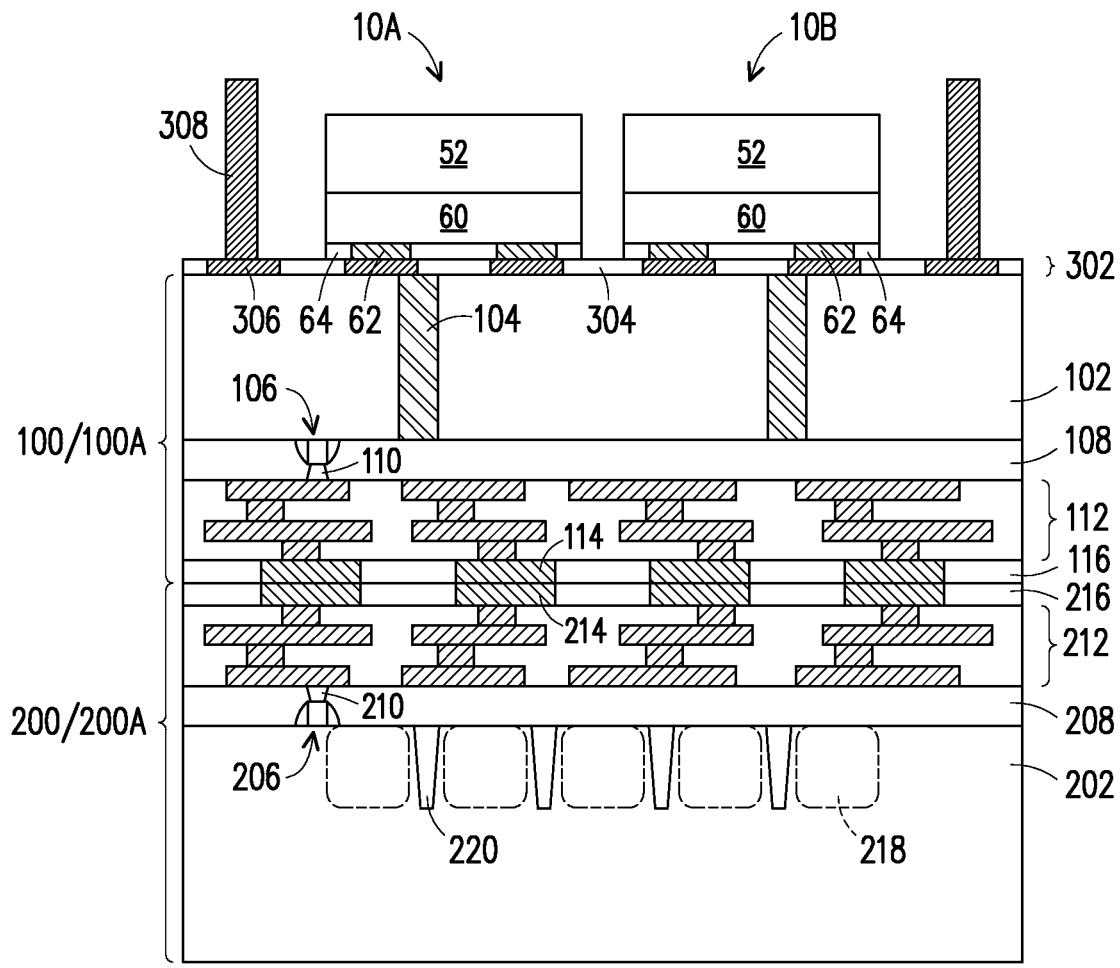

In FIG. 11, a plurality of integrated circuit dies 10 (e.g., a first integrated circuit die 10A and a second integrated circuit die 10B) are bonded to the backside of the wafer 100. A desired type and quantity of integrated circuit dies 10 are bonded in each of the die-level regions. In the illustrated embodiment, the first integrated circuit die 10A and the second integrated circuit die 10B are bonded adjacent one another. The first integrated circuit die 10A may be a logic device, such as a central processing unit (CPU), graphics processing unit (GPU), system-on-a-chip (SoC), microcontroller, or the like. In some embodiments, the first integrated circuit die 10A may comprise integrated circuits that are configured for edge AI applications.

The second integrated circuit die 10B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 10A and 10B may be the same type of dies, such as SoC dies. The first integrated circuit die 10A and the second integrated circuit die 10B may be formed in processes of a same technology node, or may be formed in processes of different technology nodes. For example, the first integrated circuit die 10A may be of a more advanced process node than the second integrated circuit die 10B. The integrated circuit dies 10A and 10B may have different sizes (e.g., different heights and/or surface areas), or may have the same size (e.g., same heights and/or surface areas).

In some embodiments, the integrated circuit dies 10A and 10B are bonded to the insulating layer 304 and the pads 306 of the redistribution structure 302 using a hybrid bonding method. The hybrid bonding method includes direct bonding the pads 62 of the integrated circuit dies 10A and 10B to the respective pads 306 of the redistribution structure 302, and direct boding the insulating layers 64 of the integrated circuit dies 10A and 10B to the insulating layer 304 of the redistribution structure 302.

Figure 12:
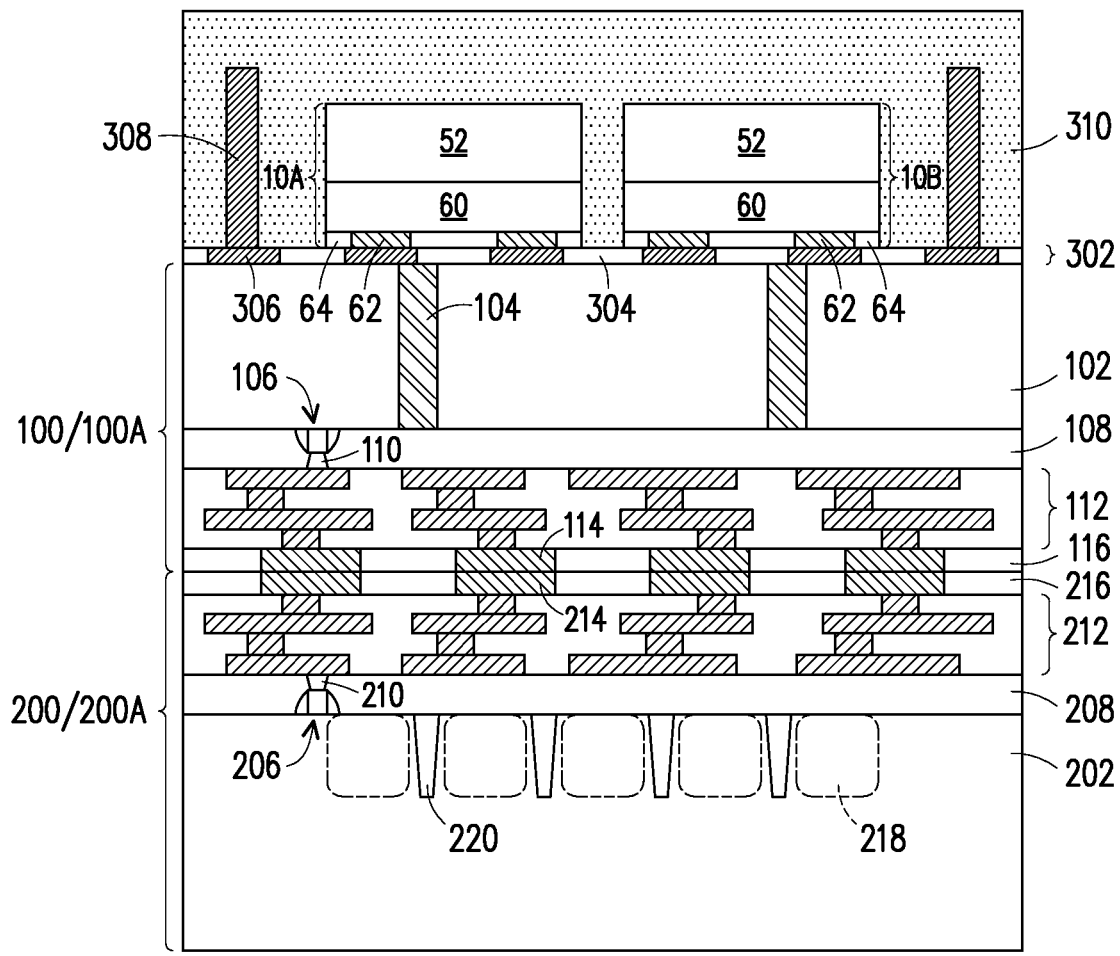

In FIG. 12, an encapsulant 310 is formed on and around the integrated circuit dies 10A and 10B, and through vias 308. The encapsulant 310 may be a molding compound, epoxy, or the like. The encapsulant 310 may be applied by compression molding, transfer molding, or the like, and may be formed over the bonded wafers 100 and 200 such that the integrated circuit dies 10A and 10B and the through vias 308 are buried or covered. The encapsulant 310 may be applied in liquid or semi-liquid form and then subsequently cured.

Figure 13:
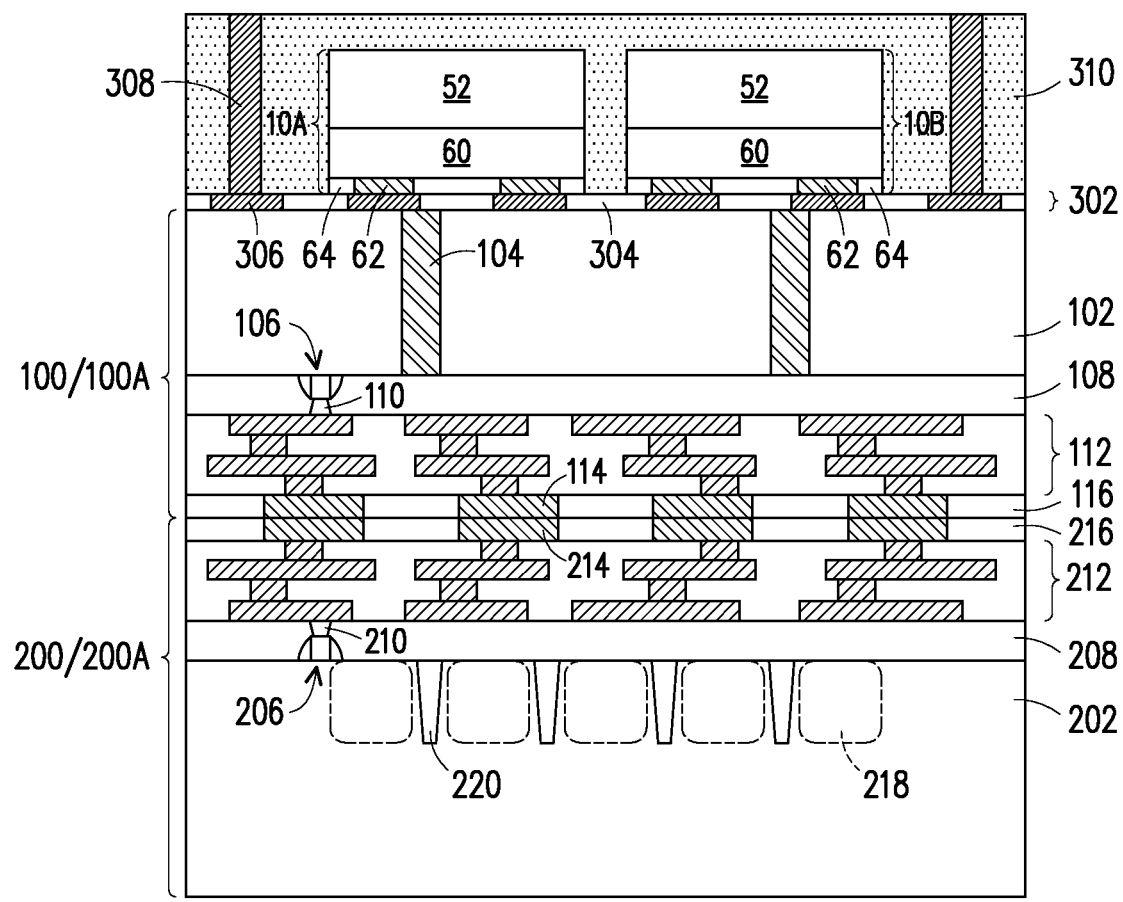

In FIG. 13, a planarization process is performed on the encapsulant 310 to expose the through vias 308. The planarization process may also remove portions of the through vias 308. In the illustrated embodiment, the backside surfaces of the integrated circuit dies 10A and 10B are covered by the encapsulant 310 after performing the planarization process. In other embodiments, the backside surfaces of the integrated circuit dies 10A and 10B are exposed after performing the planarization process. A top surface of the encapsulant 310 and top surfaces of the through vias 308 are substantially coplanar within process variations of the planarization process. The planarization process may comprise CMP, grinding, etching, a combination thereof, or the like. In some embodiments, the planarization may be omitted, for example, if the through vias 308 are already exposed.

Figure 14:
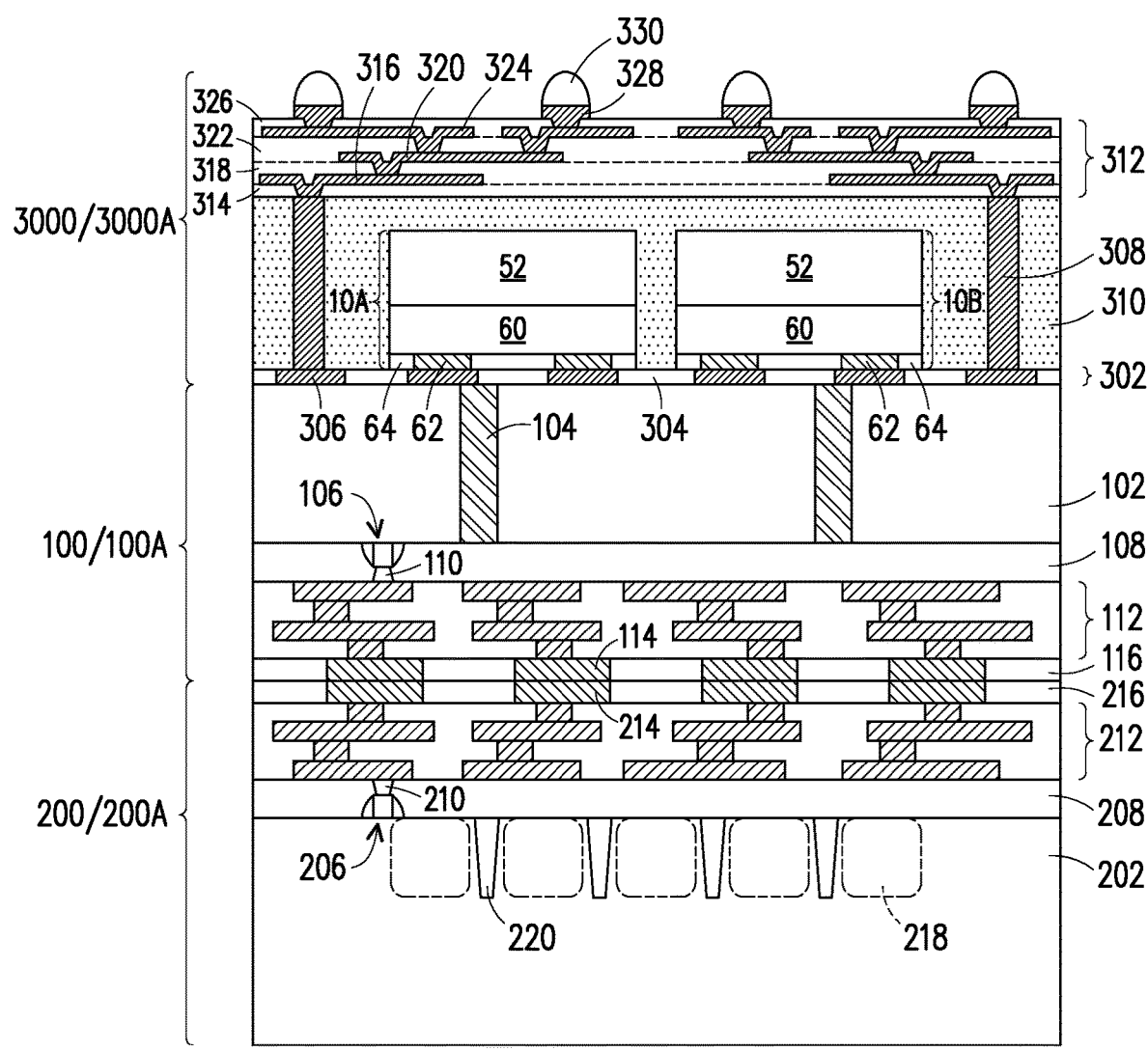

In FIG. 14, a redistribution structure 312 is formed over the encapsulant 310, the integrated circuit dies 10A and 10B, and the through vias 308. The redistribution structure 312 includes insulating layers 314, 318, 322, and 326; and metallization patterns 316, 320, and 324. The metallization patterns may also be referred to as redistribution layers or redistribution lines. The redistribution structure 312 is shown as an example having three layers of metallization patterns. More or fewer insulating layers and metallization patterns may be formed in the redistribution structure 312. If fewer insulating layers and metallization patterns are to be formed, steps and process discussed below may be omitted. If more insulating layers and metallization patterns are to be formed, steps and processes discussed below may be repeated.

In some embodiments, the insulating layer 314 is deposited on the encapsulant 120, the integrated circuit die 10A and 10B, and the through vias 308. In some embodiments, the insulating layer 314 is formed of a photo-sensitive material, such as polybenzoxazole (PBO), polyimide, benzocyclobutene (BCB), or the like, which may be patterned using a lithography mask. The insulating layer 314 may be formed by spin coating, lamination, CVD, the like, or a combination thereof. In other embodiments, the insulating layer 314 may comprise non-photo-sensitive materials such as silicon oxide, silicon nitride, silicon oxynitride, or the like, and may be formed by ALD, CVD, the like, or a combination thereof. The insulating layer 314 is then patterned. The patterning forms openings in the insulating layer 314 exposing portions of the through vias 308. The patterning may be by an acceptable process, such as by exposing and developing the insulating layer 314 to light when the insulating layer 314 is a photo-sensitive material or by etching using, for example, an anisotropic etch when the insulating layer 314 is a non-photo-sensitive material.

The metallization pattern 316 is then formed. The metallization pattern 316 includes conductive elements extending along the major surface of the insulating layer 314 and extending through the insulating layer 314 to physically and electrically couple to the through vias 308. As an example to form the metallization pattern 316, a seed layer is formed over the insulating layer 314 and in the openings extending through the insulating layer 314. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 316. The patterning forms openings through the photoresist to expose the seed layer. A conductive material is then formed in the openings of the photoresist and on the exposed portions of the seed layer. The conductive material may be formed by plating, such as electroplating, electroless plating, or the like. The conductive material may comprise a metal, such as copper, titanium, tungsten, aluminum, or the like. The combination of the conductive material and underlying portions of the seed layer form the metallization pattern 316. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After forming the metallization pattern 316, the insulating layer 318 is deposited on the metallization pattern 316 and the insulating layer 314. The insulating layer 318 may be formed using similar material and methods as the insulating layer 314.

The metallization pattern 320 is then formed. The metallization pattern 320 includes portions on and extending along the major surface of the insulating layer 318. The metallization pattern 320 further includes portions extending through the insulating layer 318 to physically and electrically couple to the metallization pattern 316. The metallization pattern 320 may be formed using similar materials and methods as the metallization pattern 316. In some embodiments, the metallization pattern 320 has a different size than the metallization pattern 316. For example, the conductive lines and/or vias of the metallization pattern 320 may be wider or thicker than the conductive lines and/or vias of the metallization pattern 316. Further, the metallization pattern 320 may be formed to a greater pitch than the metallization pattern 316.

After forming the metallization pattern 320, the insulating layer 322 is deposited on the metallization pattern 320 and the insulating layer 318. The insulating layer 322 may be formed using similar materials and methods as the insulating layer 314.

The metallization pattern 324 is then formed. The metallization pattern 324 includes portions on and extending along the major surface of the insulating layer 322. The metallization pattern 324 further includes portions extending through the insulating layer 322 to physically and electrically couple to the metallization pattern 320. The metallization pattern 324 may be formed using similar materials and methods as the metallization pattern 316. The metallization pattern 324 is the topmost metallization pattern of the redistribution structure 312. As such, all of the intermediate metallization patterns of the redistribution structure 312 (e.g., the metallization patterns 316 and 320) are disposed between the metallization pattern 324 and the encapsulant 310. In some embodiments, the metallization pattern 324 has a different size than the metallization patterns 316 and 320. For example, the conductive lines and/or vias of the metallization pattern 324 may be wider or thicker than the conductive lines and/or vias of the metallization patterns 316 and 320. Further, the metallization pattern 324 may be formed to a greater pitch than the metallization pattern 316 and 320.

After forming the metallization pattern 324, the insulating layer 326 is deposited on the metallization pattern 324 and insulating layer 322. The insulating layer 326 may be formed using similar materials and methods as insulating layer 314. The insulating layer 326 is the topmost insulating layer of the redistribution structure 312. As such, all of the metallization patterns of the redistribution structure 312 (e.g., the metallization patterns 316, 320, and 324) are disposed between the insulating layer 326 and the encapsulant 310. Further, all of the intermediate insulating layers of the redistribution structure 312 (e.g., the insulating layers 314, 318, 322) are disposed between the insulating layer 326 and the encapsulant 310.

Further in FIG. 14, after forming redistribution structure 312, UBMs 328 are formed for external connection to the redistribution structure 312. The UBMs 328 have bump portions on and extending along the major surface of the insulating layer 326, and have via portions extending through the insulating layer 326 to physically and electrically couple to the metallization pattern 324. As a result, the UBMs 328 are electrically coupled to the through vias 308 and the integrated circuit dies 10A and 10B through the redistribution structure 312. The UBMs 328 may be formed of the same material as the metallization pattern 324. In some embodiments, the UBMs 328 has a different size than the metallization patterns 316, 320, and 324.

After forming the UBMs 328, conductive connectors 330 are formed on the UBMs 328. The conductive connectors 330 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 330 may be formed using similar materials and methods as the conductive connectors 70 described above with reference to FIG. 3 and the description is not repeated herein.

Figure 15:
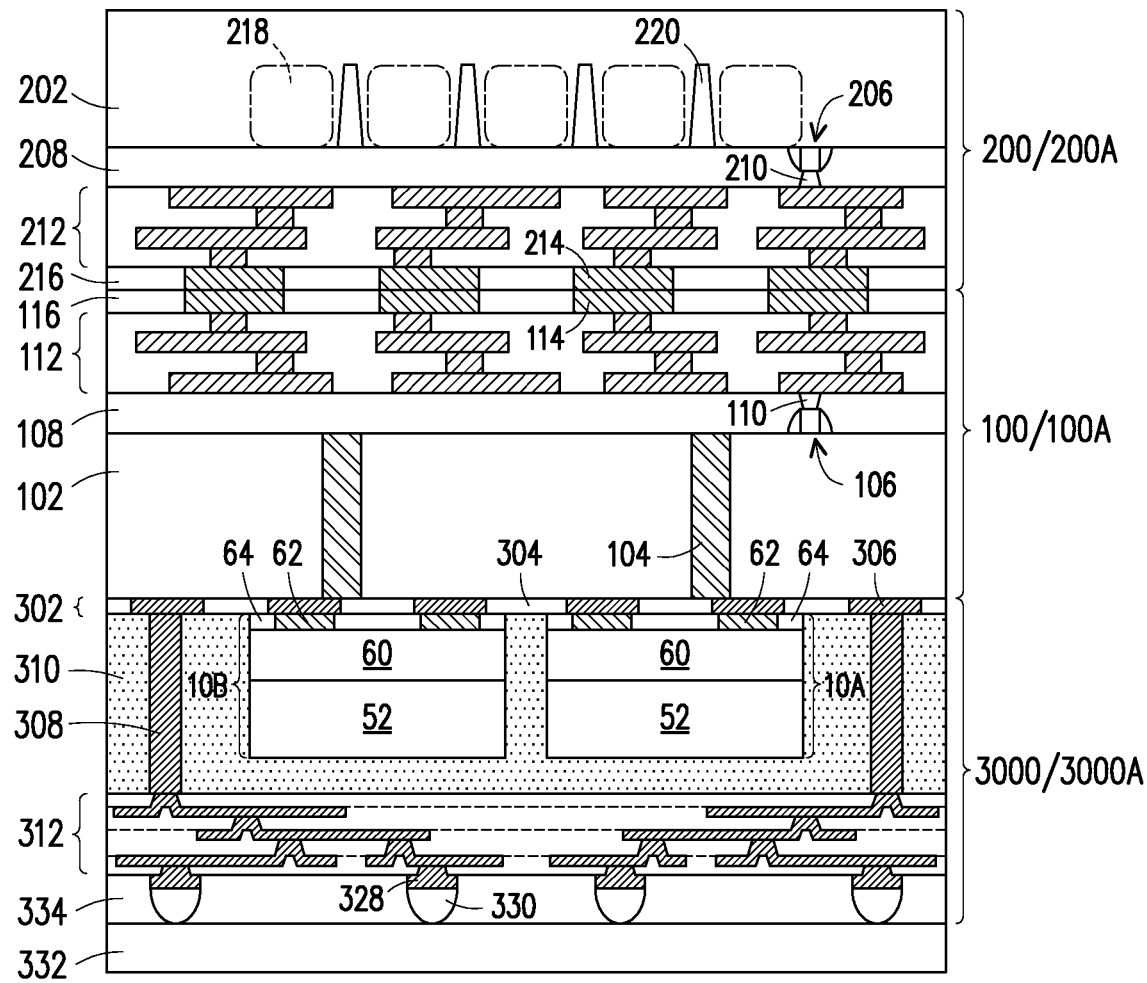

In FIG. 15, the stacked wafer-level structure of FIG. 14 is flipped and is attached to a carrier substrate 332 using an adhesive 334. The carrier substrate 332 may be a glass carrier substrate, a ceramic carrier substrate, or the like. Subsequently, a thinning process is performed on the backside of the substrate 202 of the wafer 200. In some embodiments, the thinning process comprises CMP, grinding, etching, a combination thereof, or the like. The thinning process removes a portion of the substrate 202 and reduces a distance between the backside surface of the substrate 202 and the photosensitive pixels 218.

Figure 16:
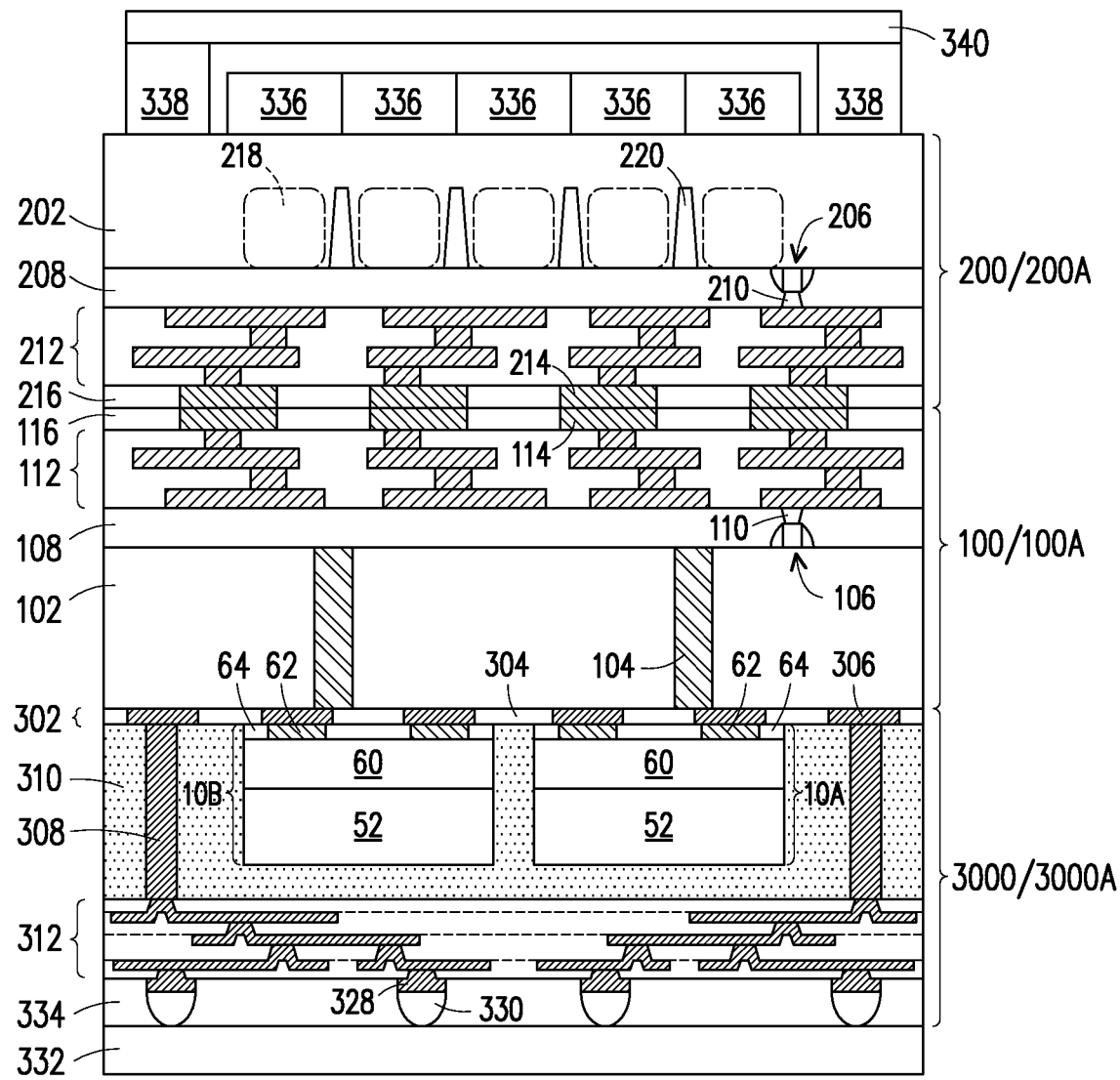

In FIG. 16, color filters 336 are formed over the backside surface of the substrate 202 of the wafer 200. In some embodiments, the color filters 336 are aligned with the photosensitive pixels 218. The color filters 336 may be used to allow specific wavelengths of light to pass while reflecting other wavelengths, thereby allowing the image sensor to determine the color of the light being received by the photosensitive pixels 218. The color filters 336 may vary, such as being a red, green, and blue filter as used in a Bayer pattern. Other combinations, such as cyan, yellow, and magenta, may also be used. The number of different colors of the color filters 336 may also vary. The color filters 336 may comprise a polymeric material or resin, such as polymethyl-methacrylate (PMMA), polyglycidyl-methacrylate (PGMA), or the like, that includes colored pigments. In some embodiments, reflective guide layers (not shown) are formed along sidewalls of the color filters 336. The reflective guide layers are formed of a metal or other high refractive index material that is capable of reflecting light, such as copper, aluminum, tantalum nitride, titanium nitride, tungsten, silicon nitride, the like, or a combination thereof.

Further in FIG. 16, a dam structure 338 is formed over the backside surface of the substrate 202 of the wafer 200 and surrounding the color filters 336. In some embodiments, the dam structure 338 has an annular structure in a plan view. In some embodiments, the annular structure may be a ring, a square-shaped annular structure, or the like. The dam structure 338 may comprise epoxy, silicone, the like, or a combination thereof. In some embodiments, the dam structure 338 disposed is within the die region 200A of the wafer 200. Subsequently, a cover 340 is attached to the dam structure 338. The cover 340 may comprise a transparent material, such as glass, or the like. In some embodiments, the cover 340 is attached to the dam structure 338 using an adhesive (not shown).

Figure 17:
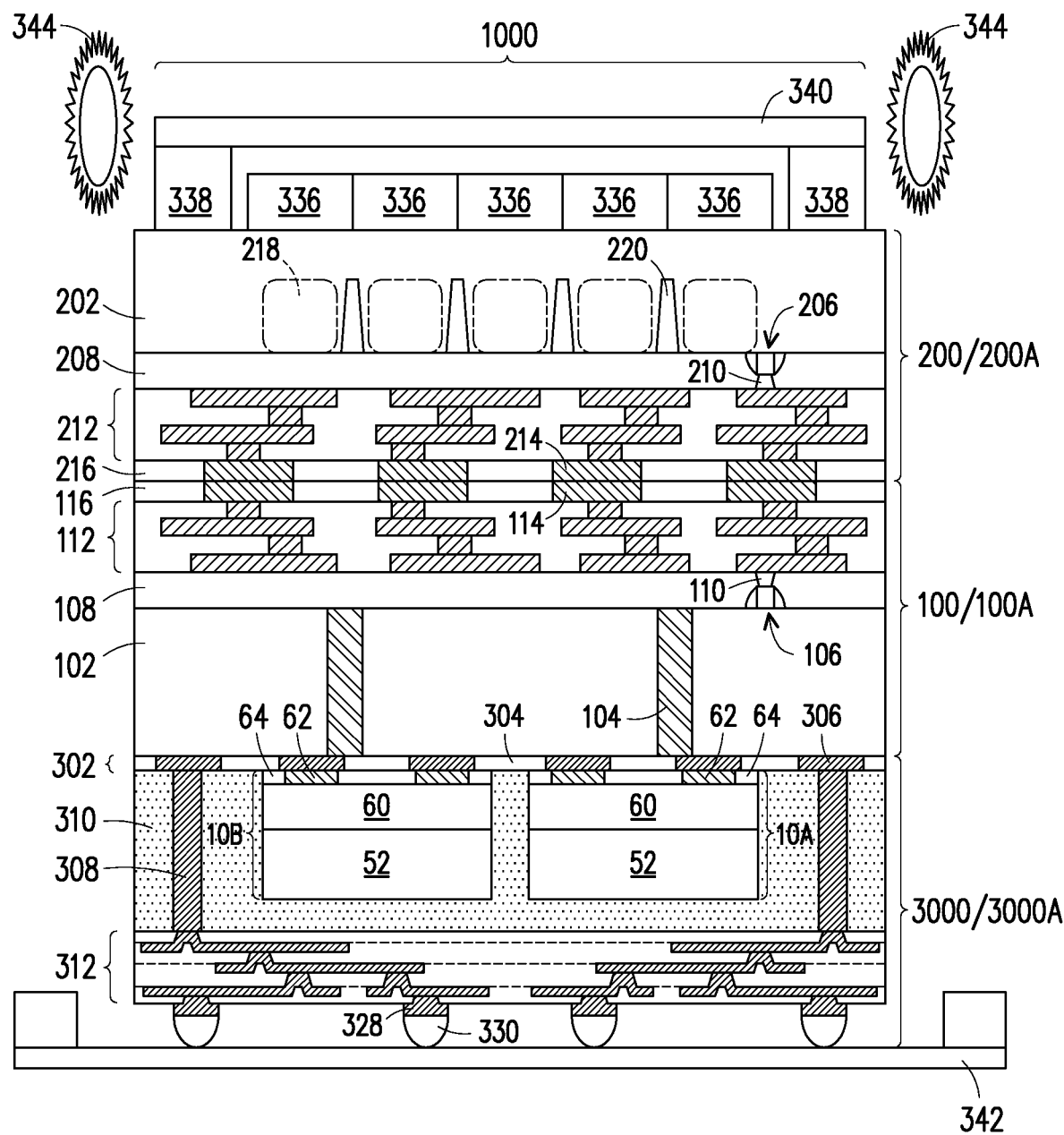

In FIG. 17, the stacked wafer-level structure of FIG. 16 is debonded from the carrier substrate 332 (see FIG. 16) and is placed on a dicing tape 342. Subsequently, a singulation process 344 is performed by sawing along scribe line regions, e.g., between adjacent die regions of the stacked wafer-level structure. The sawing singulates the die regions from the stacked wafer-level structure and forms a plurality of packages 1000. Each of the packages 1000 comprises the die region 100A of the wafer 100, the die region 200A of the wafer 200, and the die region 3000A of the wafer-level packaged structure 3000.

Figure 18:
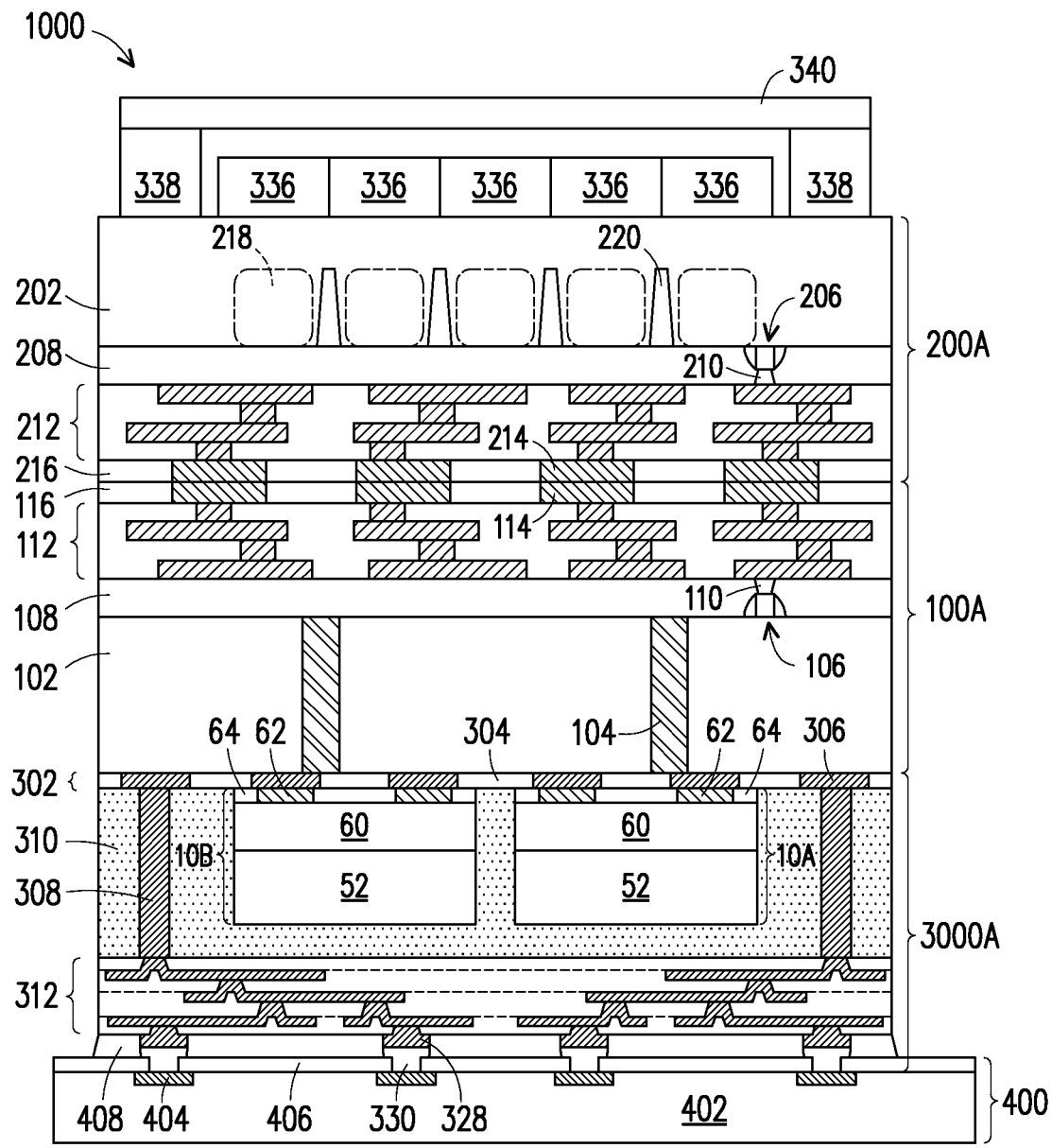

In FIG. 18, the package 1000 is mounted to a package substrate 400 using the conductive connectors 330. In some embodiments, the package substrate 400 includes a substrate core 402 and bond pads 404 over the substrate core 402. The substrate core 402 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 402 may be a SOI substrate. Generally, an SOI substrate includes a layer of a semiconductor material such as epitaxial silicon, germanium, silicon germanium, SOI, SGOI, or combinations thereof. The substrate core 402 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as ABF or other laminates may be used for the substrate core 402.

The substrate core 402 may include active and passive devices (not shown). A wide variety of devices such as transistors, capacitors, resistors, combinations of these, and the like may be used to generate the structural and functional requirements of the design for the resulting device. The devices may be formed using any suitable methods.

The substrate core 402 may also include metallization layers and vias (not shown), with the bond pads 404 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 402 is substantially free of active and passive devices.

In some embodiments, the conductive connectors 330 are reflowed to attach the package 1000 to the bond pads 404. The conductive connectors 330 electrically and/or physically couple the package substrate 400, including metallization layers in the substrate core 402, to the package 1000. In some embodiments, a solder resist 406 is formed on the substrate core 402. The conductive connectors 330 may be disposed in openings in the solder resist 406 to be electrically and mechanically coupled to the bond pads 404. The solder resist 406 may be used to protect areas of the substrate core 402 from external damage.

In some embodiments, an underfill 408 may be formed between the package 1000 and the package substrate 400 and surrounding the conductive connectors 330. The underfill 408 may be formed by a capillary flow process after the package 1000 is attached to the package substrate 400 or may be formed by a suitable deposition method before the package 1000 is attached to the package substrate 400.

In some embodiments, passive devices (e.g., surface mount devices (SMDs), not shown) may also be attached to the package 1000 (e.g., to the UBMs 328) or to the package substrate 400 (e.g., to the bond pads 404). For example, the passive devices may be bonded to a same surface of the package 1000 or the package substrate 400 as the conductive connectors 330. The passive devices may be attached to the package 1000 prior to mounting the package 1000 on the package substrate 400, or may be attached to the package substrate 400 prior to or after mounting the package 1000 on the package substrate 400.

Figure 19:
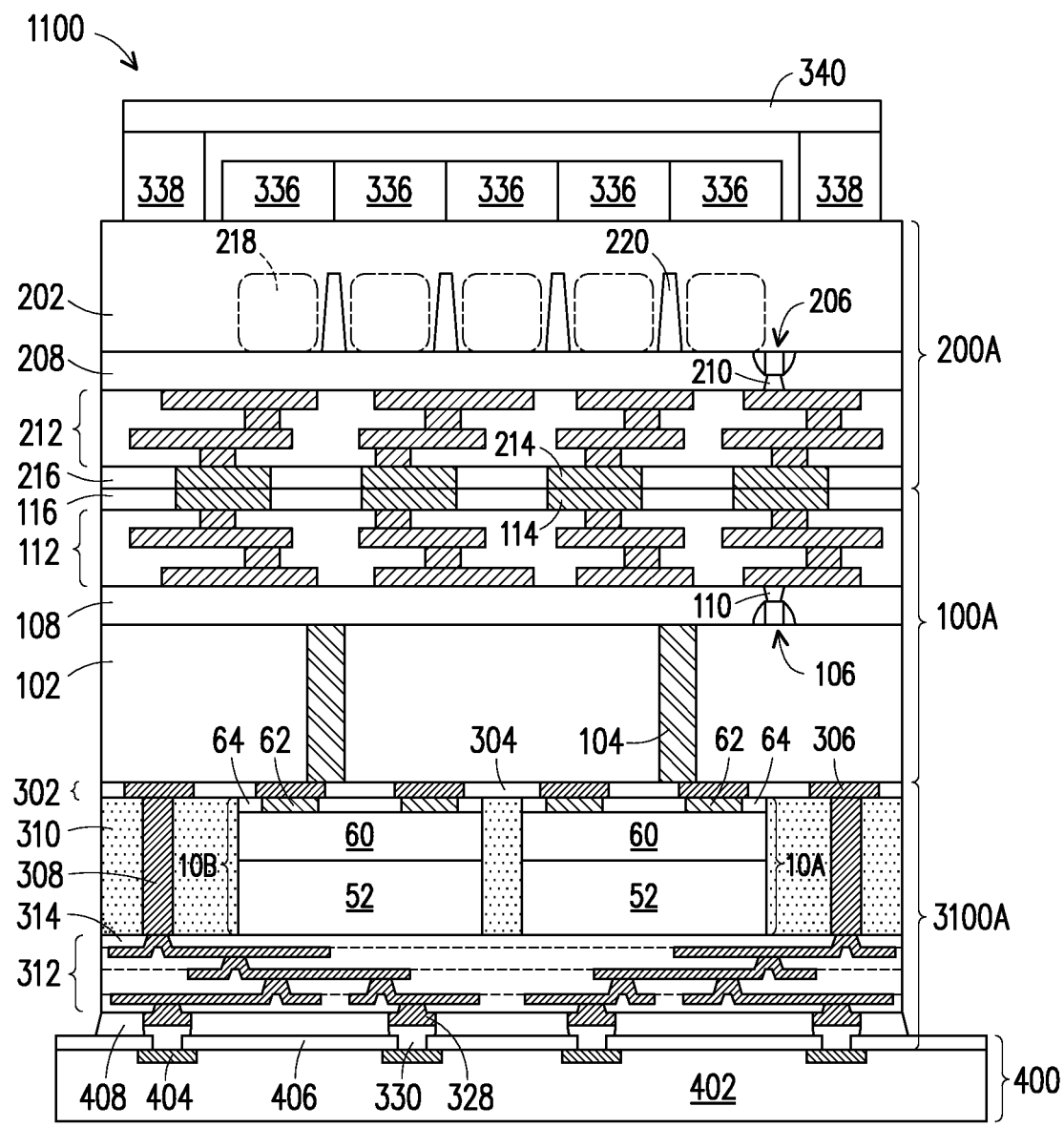
FIG. 19 illustrates a cross-sectional view of a package in accordance with some embodiments.

FIG. 19 illustrates a cross-sectional view of a package 1100 bonded to a package substrate 400 in accordance with some embodiments. In some embodiments, the package 1100 is similar to the package 1000 illustrated in FIG. 18, with similar features being labeled by similar numerical reference, and the detailed descriptions of the similar features are not repeated herein. In some embodiments, the package 1100 may be formed using process steps described above with reference to FIGS. 5-18 and the description is not repeated herein. The die region 3100A of the package 1100 is similar to the die region 3000A of the package 1000, with the distinction that a lower surface of the encapsulant 310 of the die region 3100A is substantially level with lower surfaces of the through vias and the backside surfaces of the integrated circuit dies 10A and 10B within process variations. In the illustrated embodiment, the insulating layer 314 of the redistribution structure 312 is in physical contact with the backside surfaces of the integrated circuit dies 10A and 10B. In some embodiments, the encapsulant 310 is planarized such that, in addition to the through vias 308, the backside surfaces of the integrated circuit dies 10A and 10B are also exposed.

Figure 20:
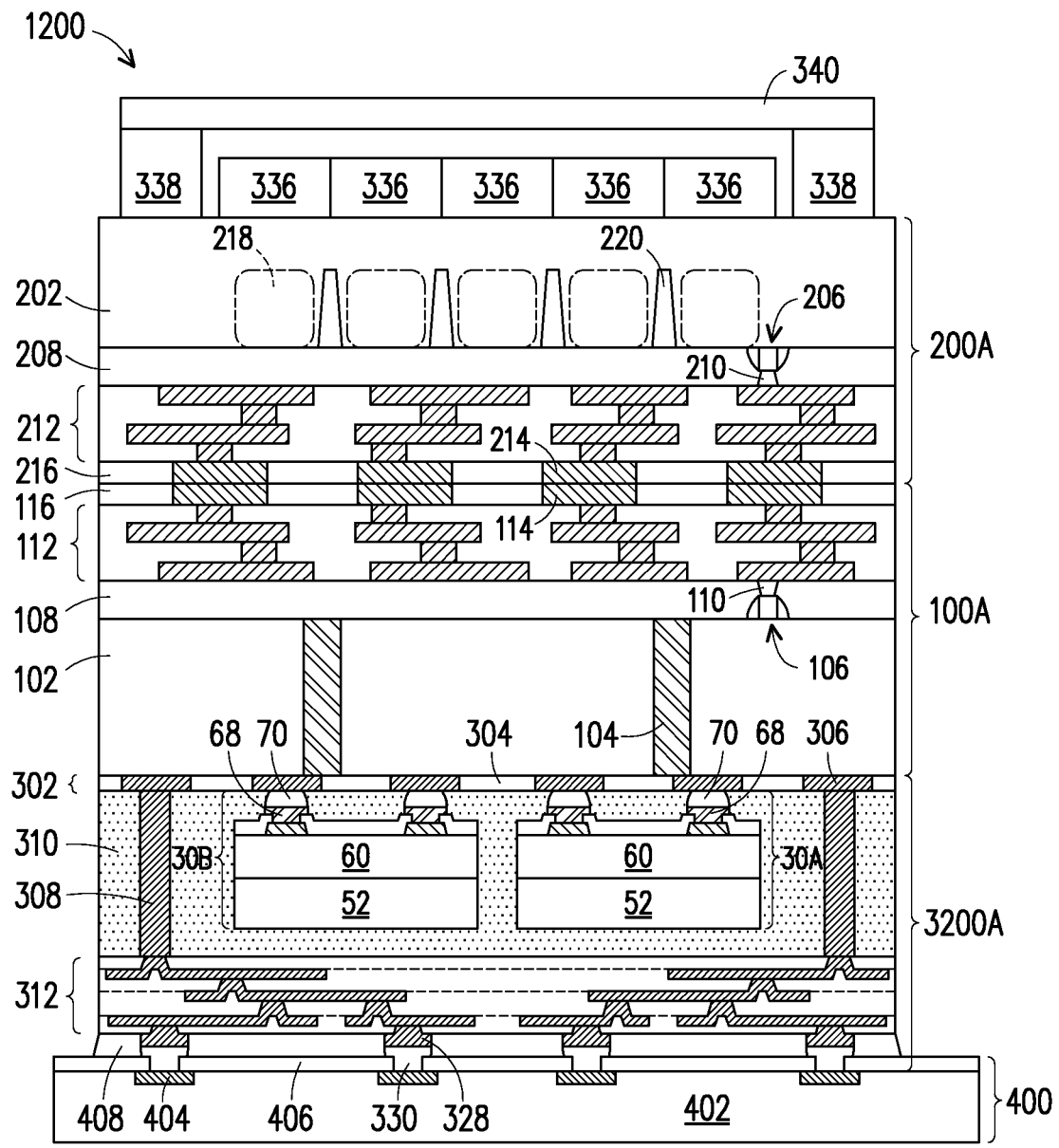
FIG. 20 illustrates a cross-sectional view of a package in accordance with some embodiments.

FIG. 20 illustrates a cross-sectional view of a package 1200 bonded to a package substrate 400 in accordance with some embodiments. In some embodiments, the package 1200 is similar to the package 1000 illustrated in FIG. 18, with similar features being labeled by similar numerical reference, and the detailed descriptions of the similar features are not repeated herein. In some embodiments, the package 1200 may be formed using process steps described above with reference to FIGS. 5-18 and the description is not repeated herein. The die region 3200A of the package 1200 is similar to the die region 3000A of the package 1000, with the distinction that the integrated circuited dies 30 (see FIG. 3) are packaged instead of the integrated circuited dies 10. In the illustrated embodiment, the integrated circuited dies 30 (such as the first integrated circuit die 30A and the second integrated circuit die 30B) are bonded to the backside of the die region 100A adjacent one another. The integrated circuit dies 30A and 30B are bonded to pads 306 of the redistribution structure 302 using the conductive connectors 70. The first integrated circuit die 30A may be a logic device, such as a CPU, GPU, SoC, microcontroller, or the like. In some embodiments, the first integrated circuit die 30A may comprise integrated circuits that are configured for edge AI applications.

The second integrated circuit die 30B may be a memory device, such as a DRAM die, SRAM die, HMC module, a high bandwidth memory HBM module, or the like. In some embodiments, the integrated circuit dies 30A and 30B may be the same type of dies, such as SoC dies. The first integrated circuit die 30A and the second integrated circuit die 30B may be formed in processes of a same technology node, or may be formed in processes of different technology nodes. For example, the first integrated circuit die 30A may be of a more advanced process node than the second integrated circuit die 30B. The integrated circuit dies 30A and 30B may have different sizes (e.g., different heights and/or surface areas), or may have the same size (e.g., same heights and/or surface areas).

Figure 21:
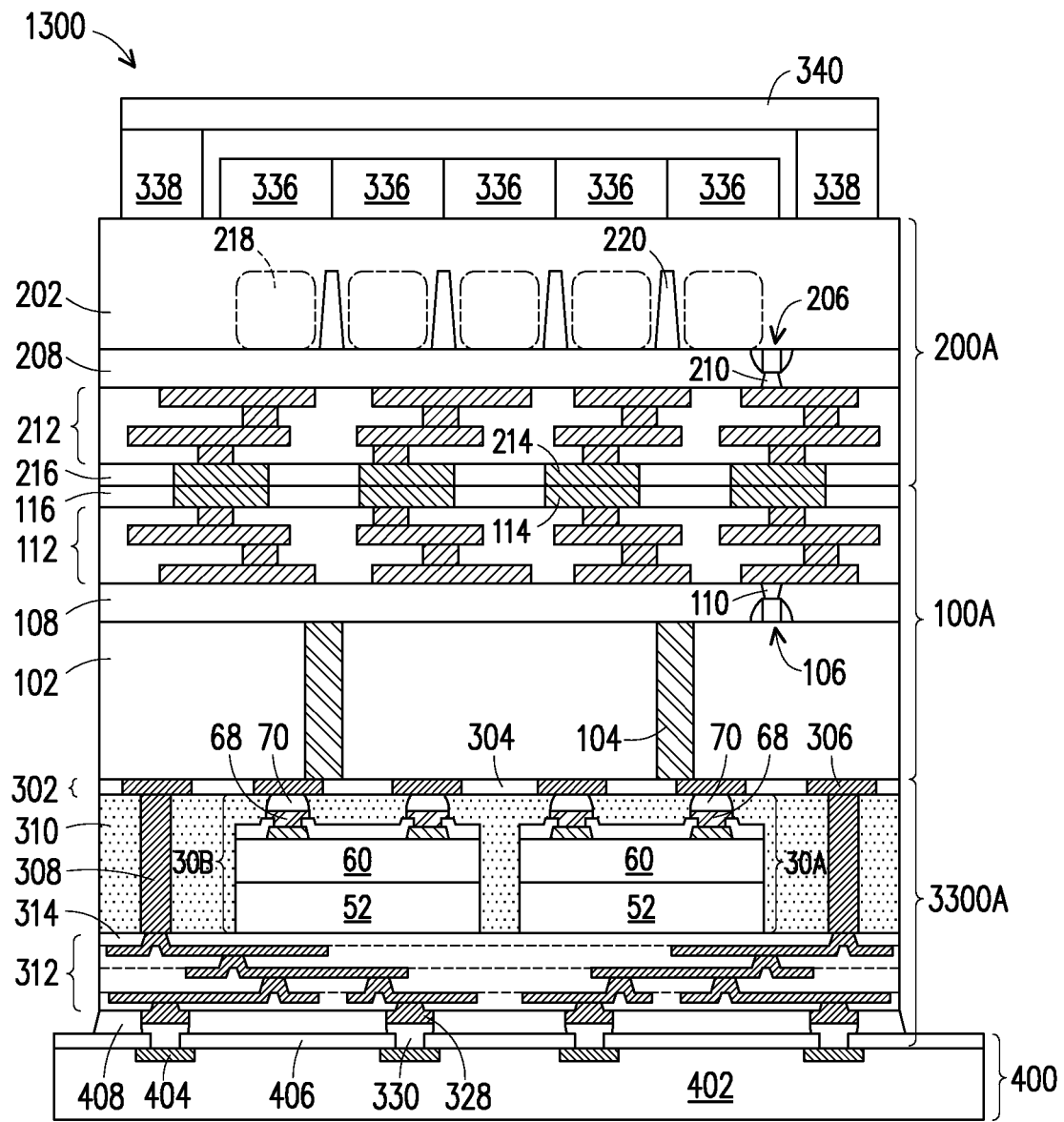
FIG. 21 illustrates a cross-sectional view of a package in accordance with some embodiments.

FIG. 21 illustrates a cross-sectional view of a package 1300 bonded to a package substrate 400 in accordance with some embodiments. In some embodiments, the package 1300 is similar to the package 1200 illustrated in FIG. 20, with similar features being labeled by similar numerical reference, and the detailed descriptions of the similar features are not repeated herein. In some embodiments, the package 1300 may be formed using process steps described above with reference to FIGS. 5-18 and 20, and the description is not repeated herein. The die region 3300A of the package 1300 is similar to the die region 3200A of the package 1200, with the distinction that a lower surface of the encapsulant 310 of the die region 3300A is substantially level with lower surfaces of the through vias 308 and the backside surfaces of the integrated circuit dies 30A and 30B within process variations. In the illustrated embodiment, the insulating layer 314 of the redistribution structure 312 is in physical contact with the backside surfaces of the integrated circuit dies 30A and 30B. In some embodiments, the encapsulant 310 is planarized such that, in addition to the through vias 308, the backside surfaces of the integrated circuit dies 30A and 30B are also exposed.

Figure 22:
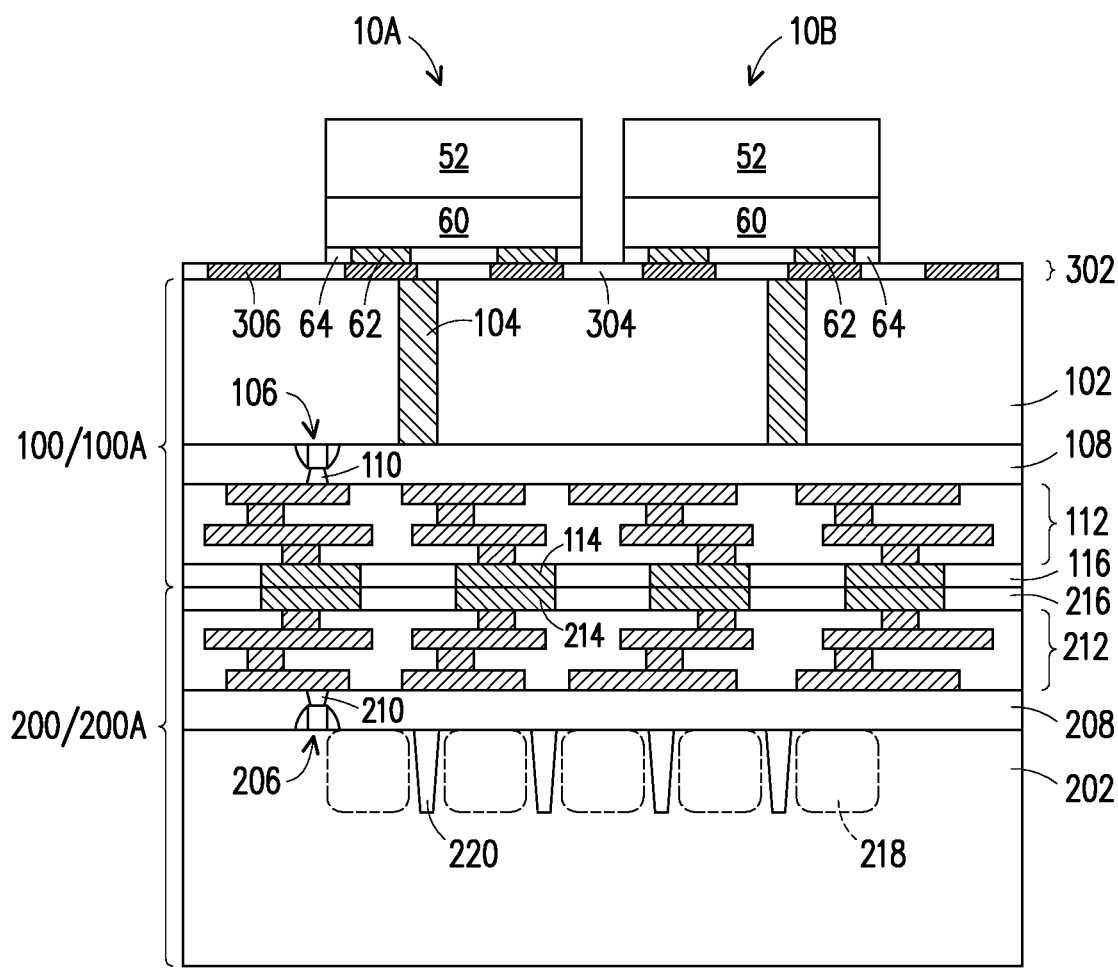
FIGS. 22-27 illustrate cross-sectional views of intermediate steps during a process for forming a package in accordance with some embodiments.
Figure 23:
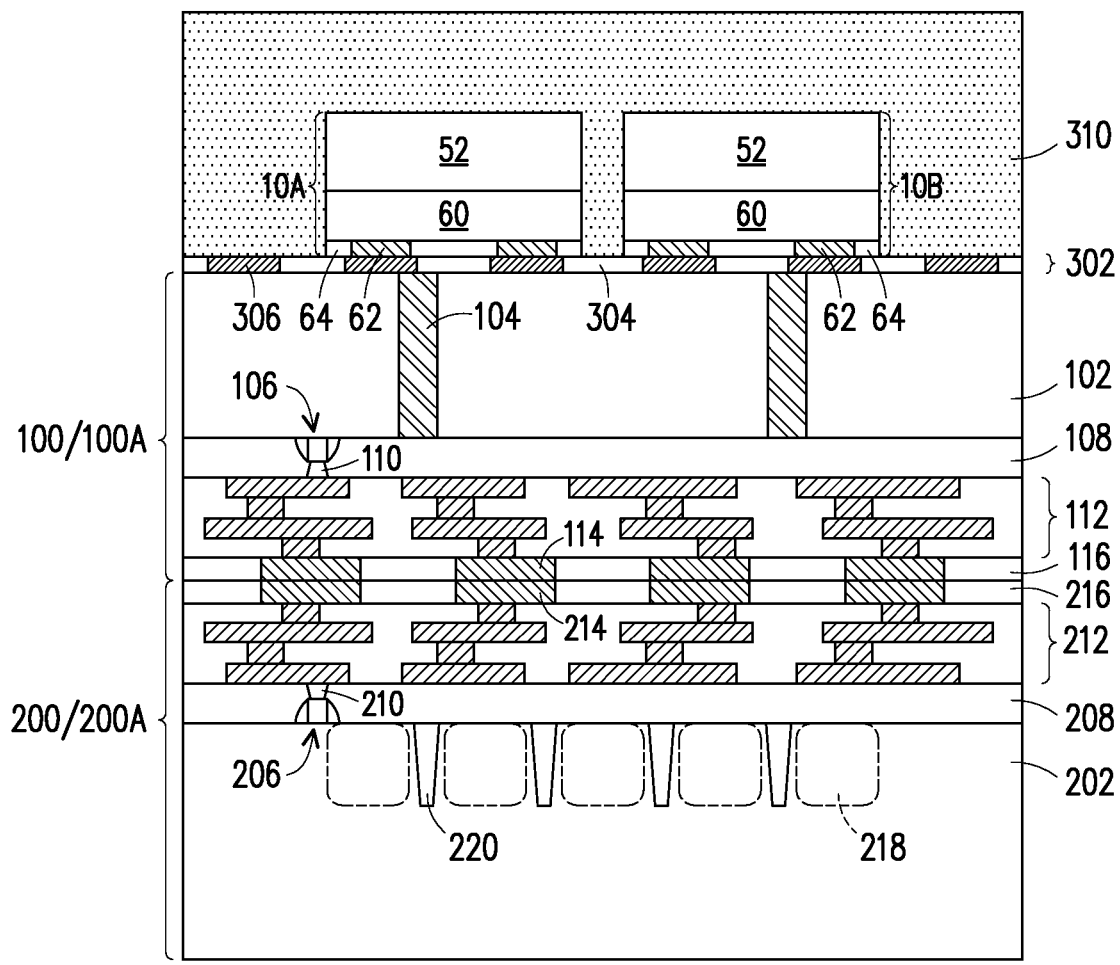
Figure 24:
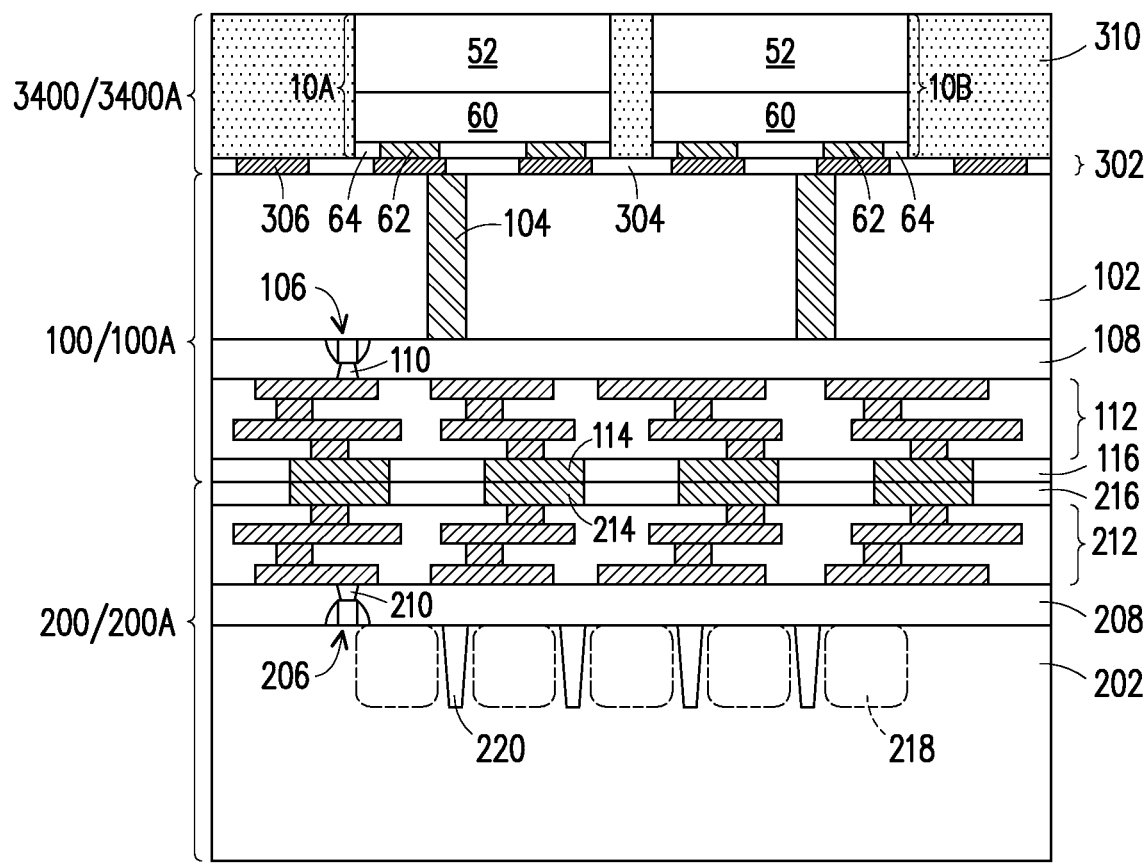

FIGS. 22-27 illustrate cross-sectional views of intermediate steps during a process for forming a package 1400 in accordance with some embodiments. Some features and process steps described with reference to FIGS. 22-27 may be similar to the features and the process steps described above with reference to FIGS. 5-18, and the descriptions of the similar features and process steps are not repeated herein. FIGS. 22-24 illustrate a formation of a wafer-level packaged structure 3400 on the backside of the wafer 100 after bonding the wafer 100 to the wafer 200. The wafer 100 may be bonded to the wafer 200 as described above with reference to FIG. 7 and the description is not repeated herein.

In FIG. 22, the backside surface of the wafer 100 is thinned to expose the TSVs 104 and the redistribution structure 302 comprising an insulating layer 304 and pads 306 is formed on the backside of the wafer 100. In some embodiments, the backside surface of the wafer 100 is thinned as described above with reference to FIG. 8 and the description is not repeated herein. In some embodiments, the redistribution structure 302 is formed as described above with reference to FIG. 9 and the description is not repeated herein. Subsequently, a plurality of integrated circuit dies 10 (e.g., a first integrated circuit die 10A and a second integrated circuit die 10B) are bonded to the backside of the wafer 100 using the insulating layer 304 and the pads 306 of the redistribution structure 302. In some embodiments, the first integrated circuit die 10A and the second integrated circuit die 10B are bonded to the backside of the wafer 100 as described above with reference to FIG. 11 and the description is not repeated herein.

In FIG. 23, an encapsulant 310 is formed on and around the integrated circuit dies 10A and 10B as described above with reference to FIG. 12 and the description is not repeated herein.

In FIG. 24, a planarization process is performed on the encapsulant 310 to expose the backside surfaces of the integrated circuit dies 10A and 10B. The planarization process may also remove portions of the backsides of the integrated circuit dies 10A and 10B. Top surface of the encapsulant 310 and the backside surfaces of the integrated circuit dies 10A and 10B are substantially coplanar or substantially level within process variations of the planarization process. The planarization process may comprise CMP, grinding, etching, a combination thereof, or the like.

Figure 25:
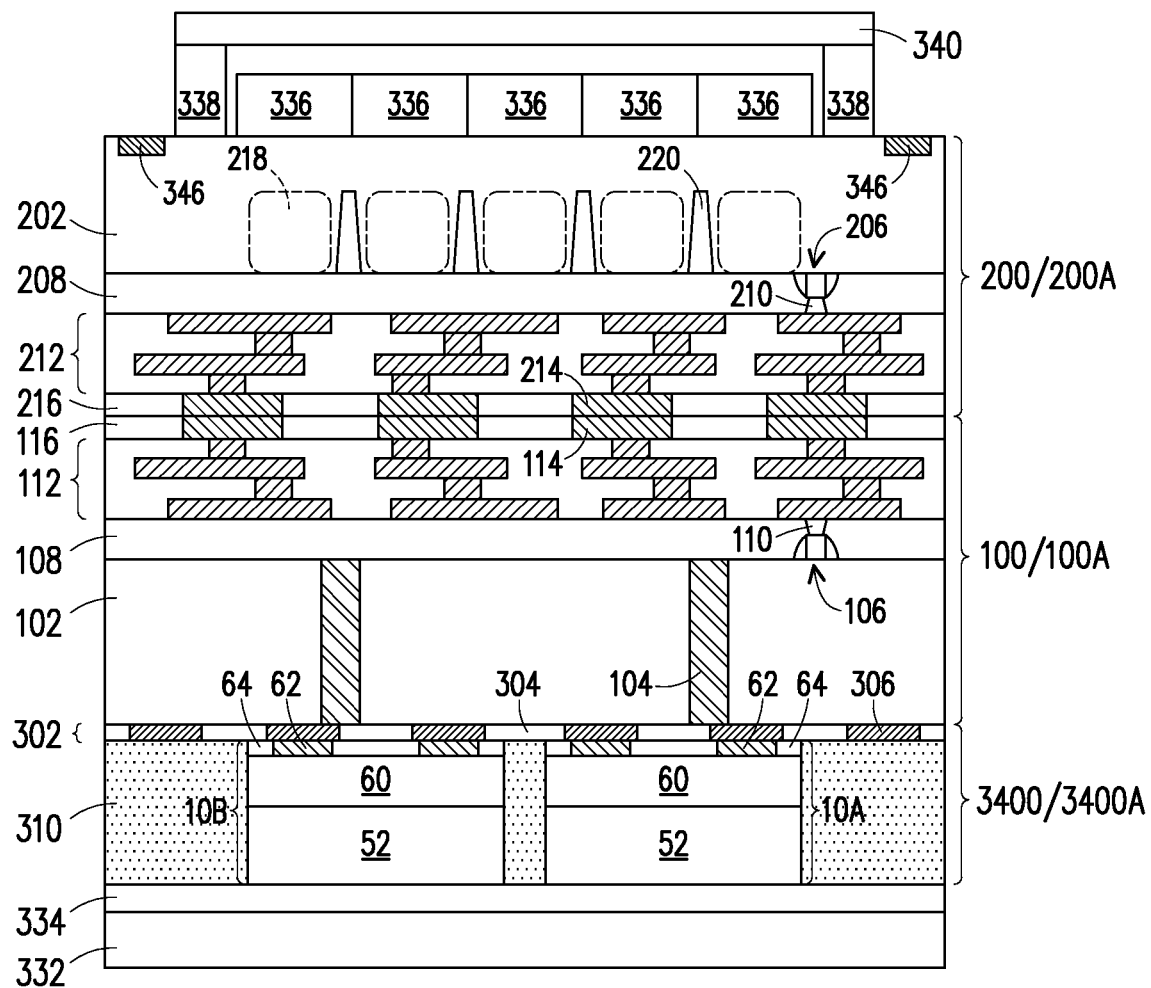

In FIG. 25, the stacked wafer-level structure of FIG. 24 is flipped and is attached to a carrier substrate 332 using an adhesive 334. Subsequently, a thinning process is performed on the backside of the substrate 202 of the wafer 200 as described above with reference to FIG. 15 and the description is not repeated herein. After performing the thinning process, color filters 336 are formed over the backside surface of the substrate 202 of the wafer 200 as described above with reference to FIG. 16 and the description is not repeated herein. In some embodiments, a dam structure 338 is formed over the backside surface of the substrate 202 of the wafer 200 and surrounding the color filters 336 as described above with reference to FIG. 16 and the description is not repeated herein. Subsequently, a cover 340 is attached to the dam structure 338 as described above with reference to FIG. 16 and the description is not repeated herein. In some embodiments, pads 346 are formed on the backside of the substrate 202 of the wafer 200. In some embodiments, the pads 346 are disposed outside of the dam structure 338 but within the die region 200A of the wafer 200. In some embodiments, the pads 346 may comprise similar materials as the pads 62 described above with reference to FIG. 1 and the description is not repeated herein. The pads 346 may be used to couple the resulting package to external devices.

Figure 26:
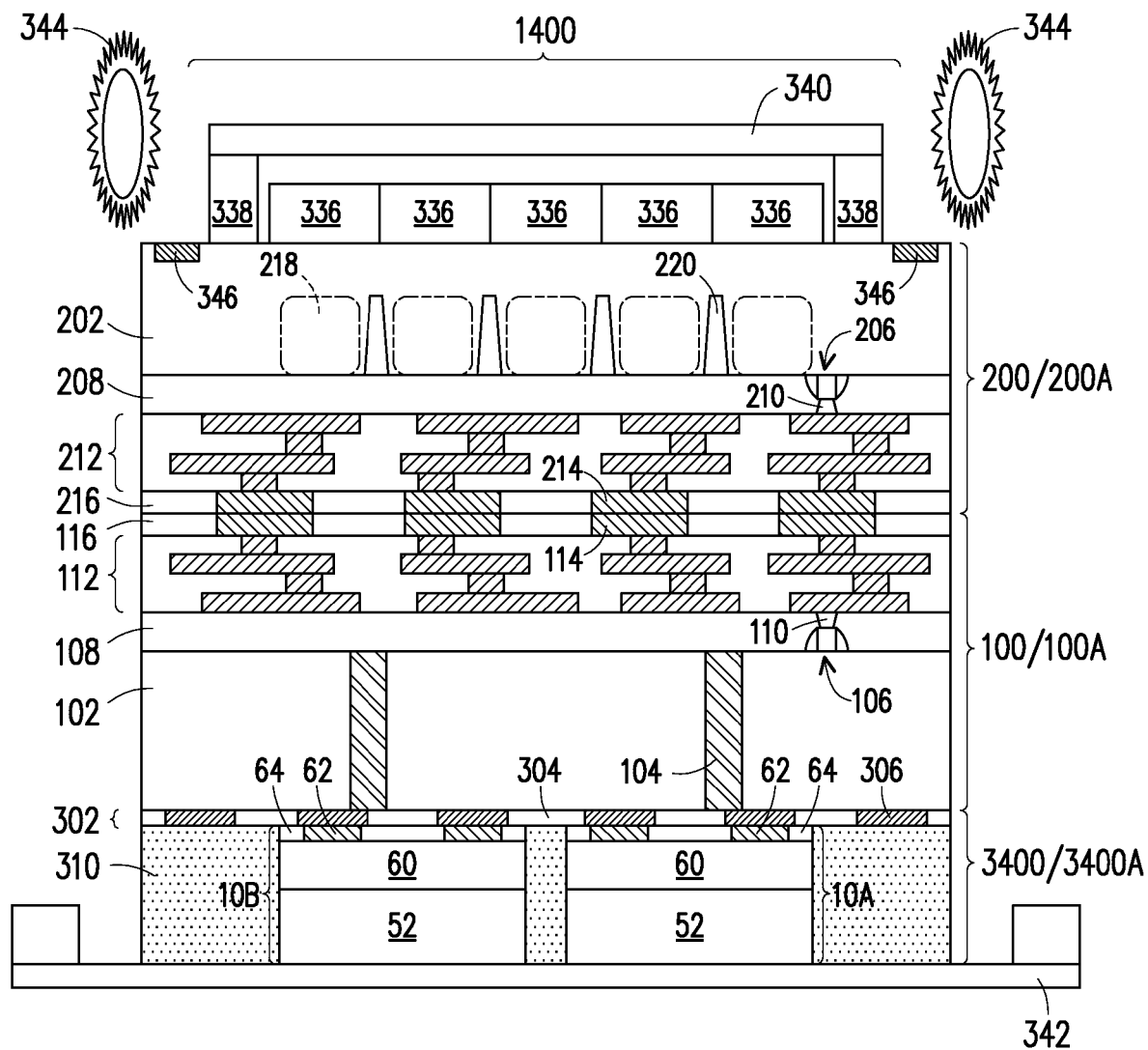

In FIG. 26, the stacked wafer-level structure of FIG. 25 is debonded from the carrier substrate 332 (see FIG. 25) and is placed on a dicing tape 342. Subsequently, a singulation process 344 is performed by sawing along scribe line regions, e.g., between adjacent die regions of the stacked wafer-level structure. The sawing singulates the die regions from the stacked wafer-level structure and forms packages 1400. Each of the packages 1400 comprises the die region 100A of the wafer 100, the die region 200A of the wafer 200, and the die region 3400A of the wafer-level packaged structure 3400.

Figure 27:
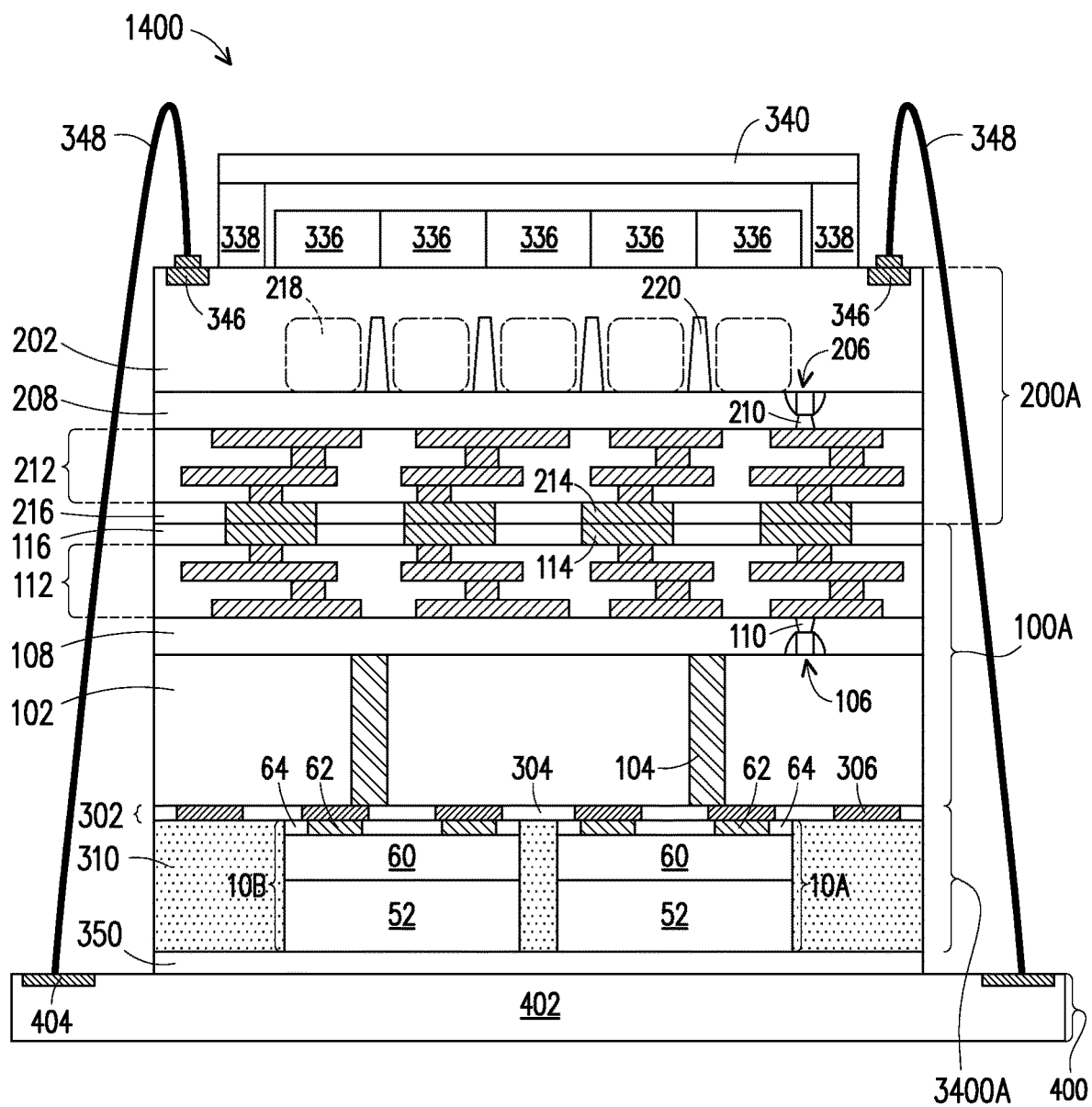

In FIG. 27, the package 1400 is attached to a package substrate 400 using an adhesive 350. In some embodiments, the package 1400 is electrically coupled to the package substrate 400 by coupling the pads 346 of the package 1400 to bond pads 404 of the package substrate 400 using wire connectors 348. In some embodiments, the wire connectors 348 are bonded to the pads 346 and 404 using thermocompression bonding, ultrasonic bonding, thermosonic bonding, or the like.

Figure 28:
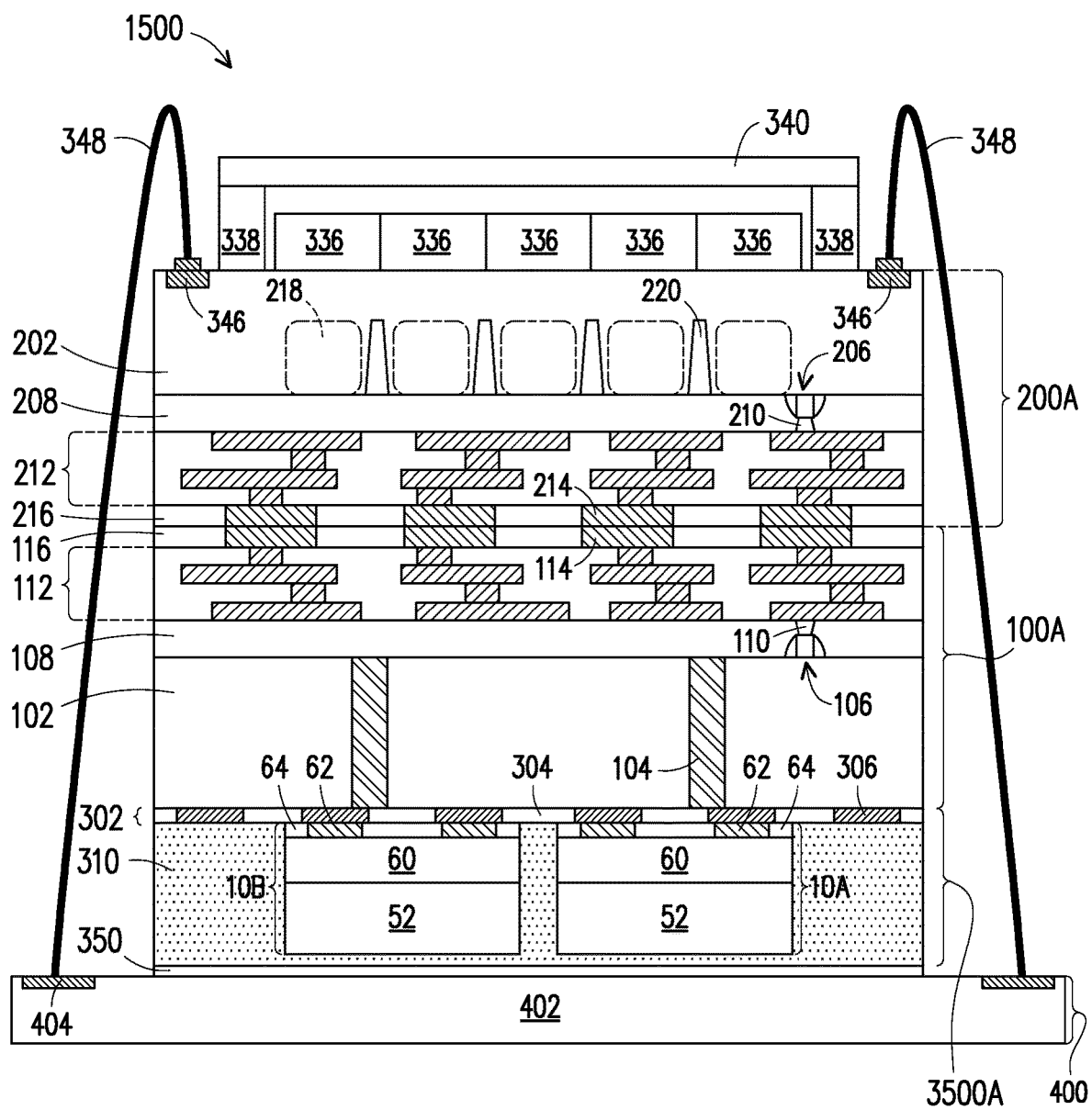
FIG. 28 illustrates a cross-sectional view of a package in accordance with some embodiments.

FIG. 28 illustrates a cross-sectional view of a package 1500 bonded to a package substrate 400 in accordance with some embodiments. In some embodiments, the package 1500 is similar to the package 1400 illustrated in FIG. 27, with similar features being labeled by similar numerical reference, and the detailed descriptions of the similar features are not repeated herein. In some embodiments, the package 1500 may be formed using process steps described above with reference to FIGS. 22-27 and the description is not repeated herein. The die region 3500A of the package 1500 is similar to the die region 3400A of the package 1400, with the distinction that a portion of the encapsulant 310 is interposed between the adhesive 350 and the backsides of the integrated circuit dies 10A and 10B. In such embodiments, the encapsulant 310 is planarized such that the backsides of the integrated circuit dies 10A and 10B are not exposed after performing the planarization process.

Figure 29:
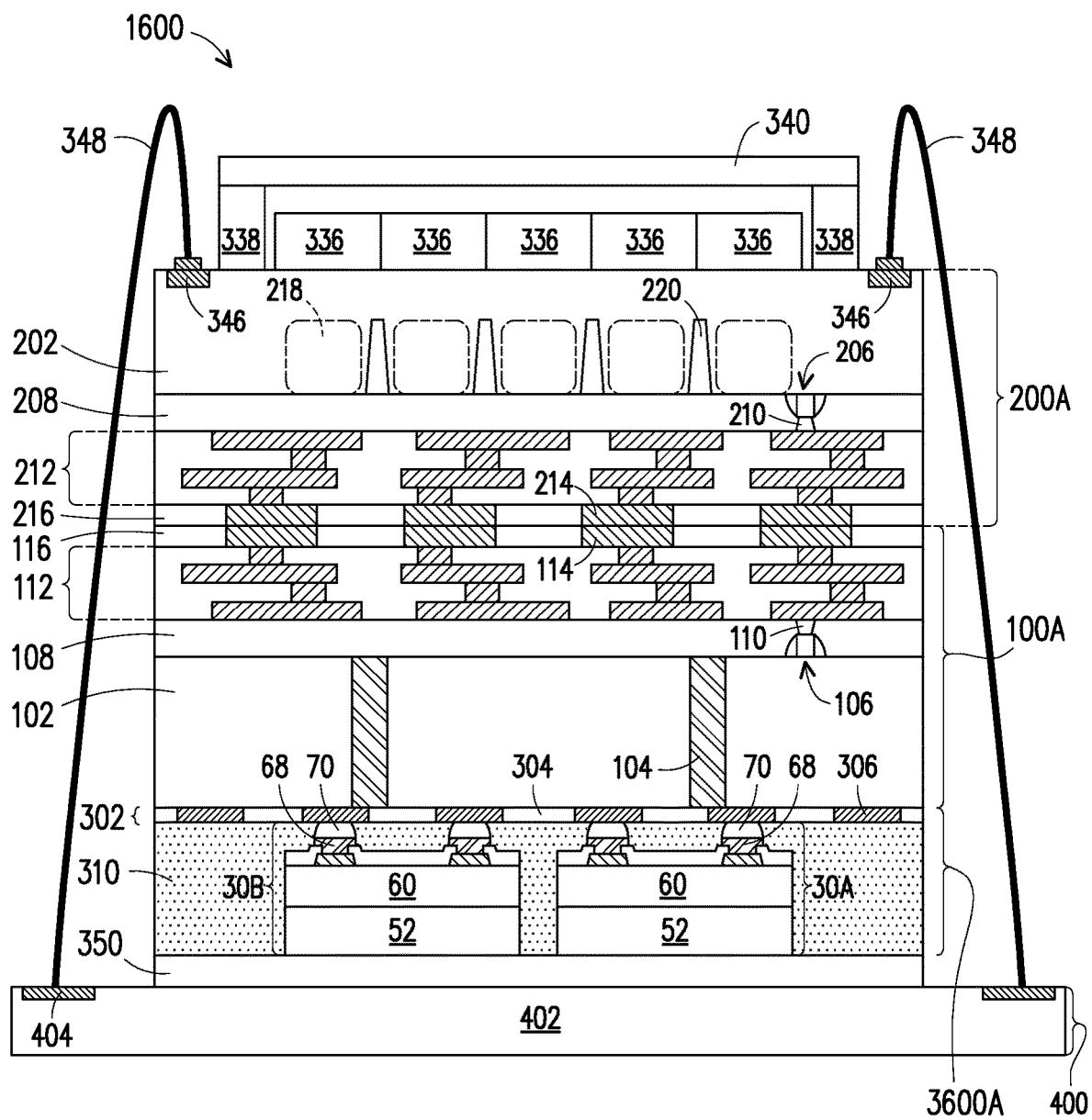
FIG. 29 illustrates a cross-sectional view of a package in accordance with some embodiments.

FIG. 29 illustrates a cross-sectional view of a package 1600 bonded to a package substrate 400 in accordance with some embodiments. In some embodiments, the package 1600 is similar to the package 1400 illustrated in FIG. 27, with similar features being labeled by similar numerical reference, and the detailed descriptions of the similar features are not repeated herein. In some embodiments, the package 1600 may be formed using process steps described above with reference to FIGS. 22-27 and the description is not repeated herein. The die region 3600A of the package 1600 is similar to the die region 3400A of the package 1400, with the distinction that the integrated circuited dies 30 (see FIG. 3) are packaged instead of the integrated circuited dies 10. In the illustrated embodiment, the integrated circuited dies 30 (such as the first integrated circuit die 30A and the second integrated circuit die 30B) are bonded to the backside of the die region 100A adjacent one another. The integrated circuit dies 30A and 30B are bonded to pads 306 of the redistribution structure 302 using the conductive connectors 70. The first integrated circuit die 30A may be a logic device, such as a CPU, GPU, SoC, microcontroller, or the like. In some embodiments, the first integrated circuit die 30A may comprise integrated circuits that are configured for edge AI applications.

The second integrated circuit die 30B may be a memory device, such as a DRAM die, SRAM die, HMC module, a high bandwidth memory HBM module, or the like. In some embodiments, the integrated circuit dies 30A and 30B may be the same type of dies, such as SoC dies. The first integrated circuit die 30A and the second integrated circuit die 30B may be formed in processes of a same technology node, or may be formed in processes of different technology nodes. For example, the first integrated circuit die 30A may be of a more advanced process node than the second integrated circuit die 30B. The integrated circuit dies 30A and 30B may have different sizes (e.g., different heights and/or surface areas), or may have the same size (e.g., same heights and/or surface areas).

Figure 30:
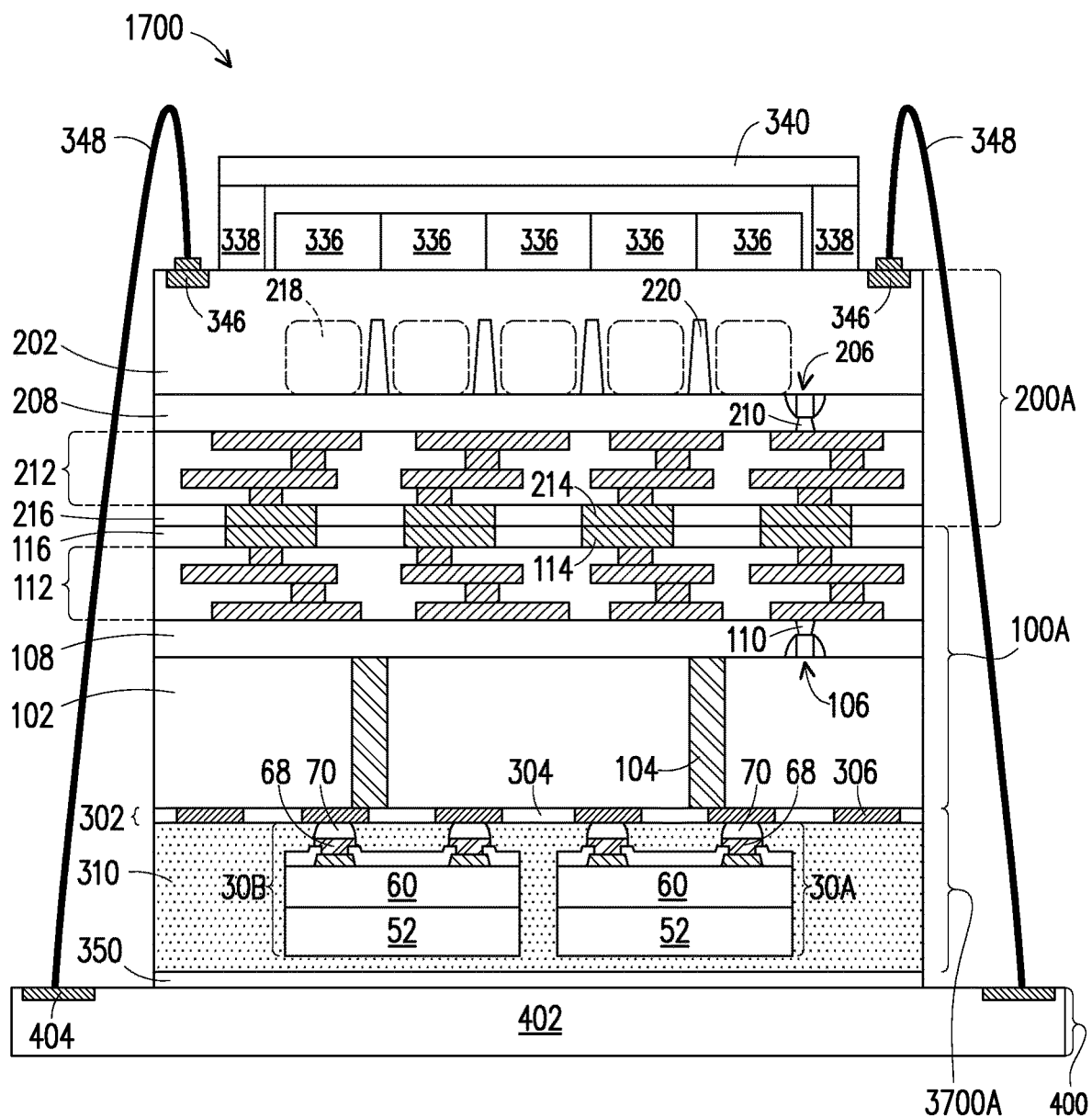
FIG. 30 illustrates a cross-sectional view of a package in accordance with some embodiments.

FIG. 30 illustrates a cross-sectional view of a package 1700 bonded to a package substrate 400 in accordance with some embodiments. In some embodiments, the package 1700 is similar to the package 1600 illustrated in FIG. 29, with similar features being labeled by similar numerical reference, and the detailed descriptions of the similar features are not repeated herein. In some embodiments, the package 1700 may be formed using process steps described above with reference to FIGS. 22-27 and 29, and the description is not repeated herein. The die region 3700A of the package 1700 is similar to the die region 3600A of the package 1600 (see FIG. 29), with the distinction that a portion of the encapsulant 310 is interposed between the adhesive 350 and the backsides of the integrated circuit dies 30A and 30B. In such embodiments, the encapsulant 310 is planarized such that the backsides of the integrated circuit dies 30A and 30B are not exposed after performing the planarization process.

Figure 31:
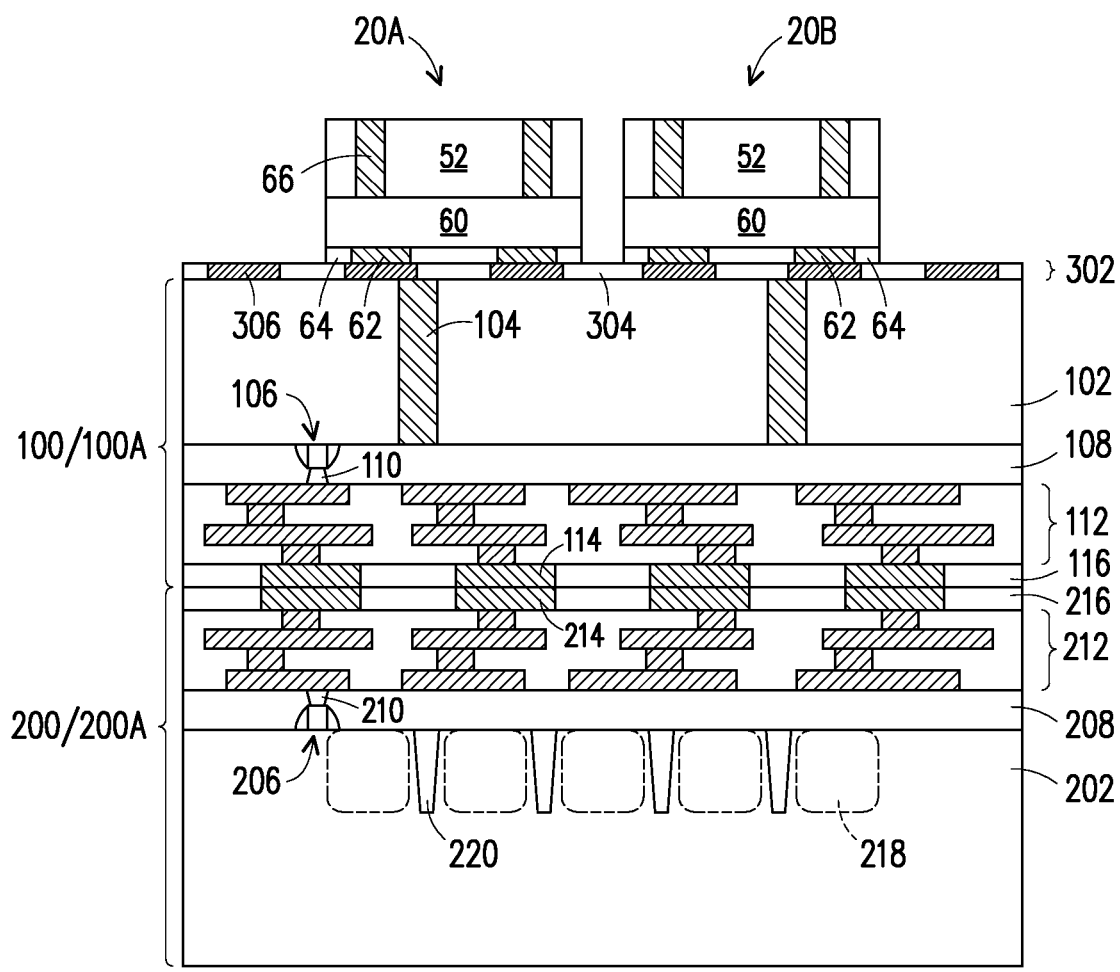
FIGS. 31-36 illustrate cross-sectional views of intermediate steps during a process for forming a package in accordance with some embodiments.
Figure 32:
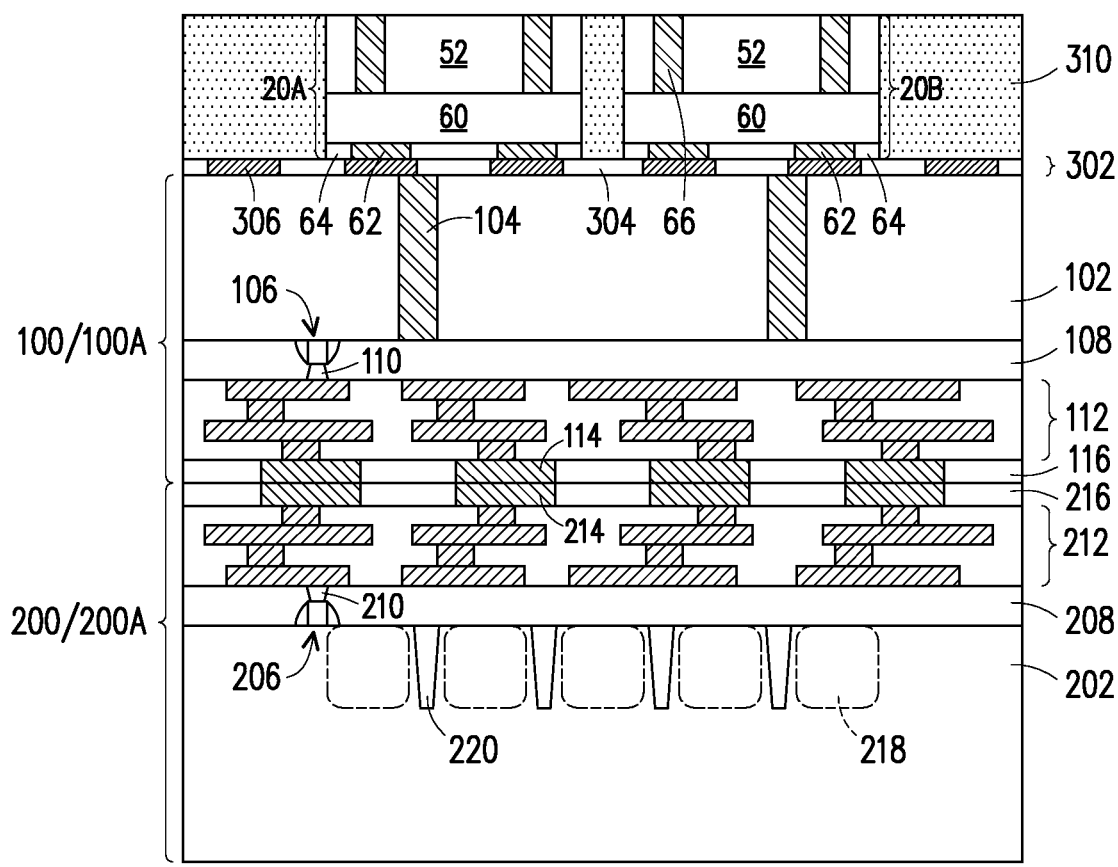
Figure 33:
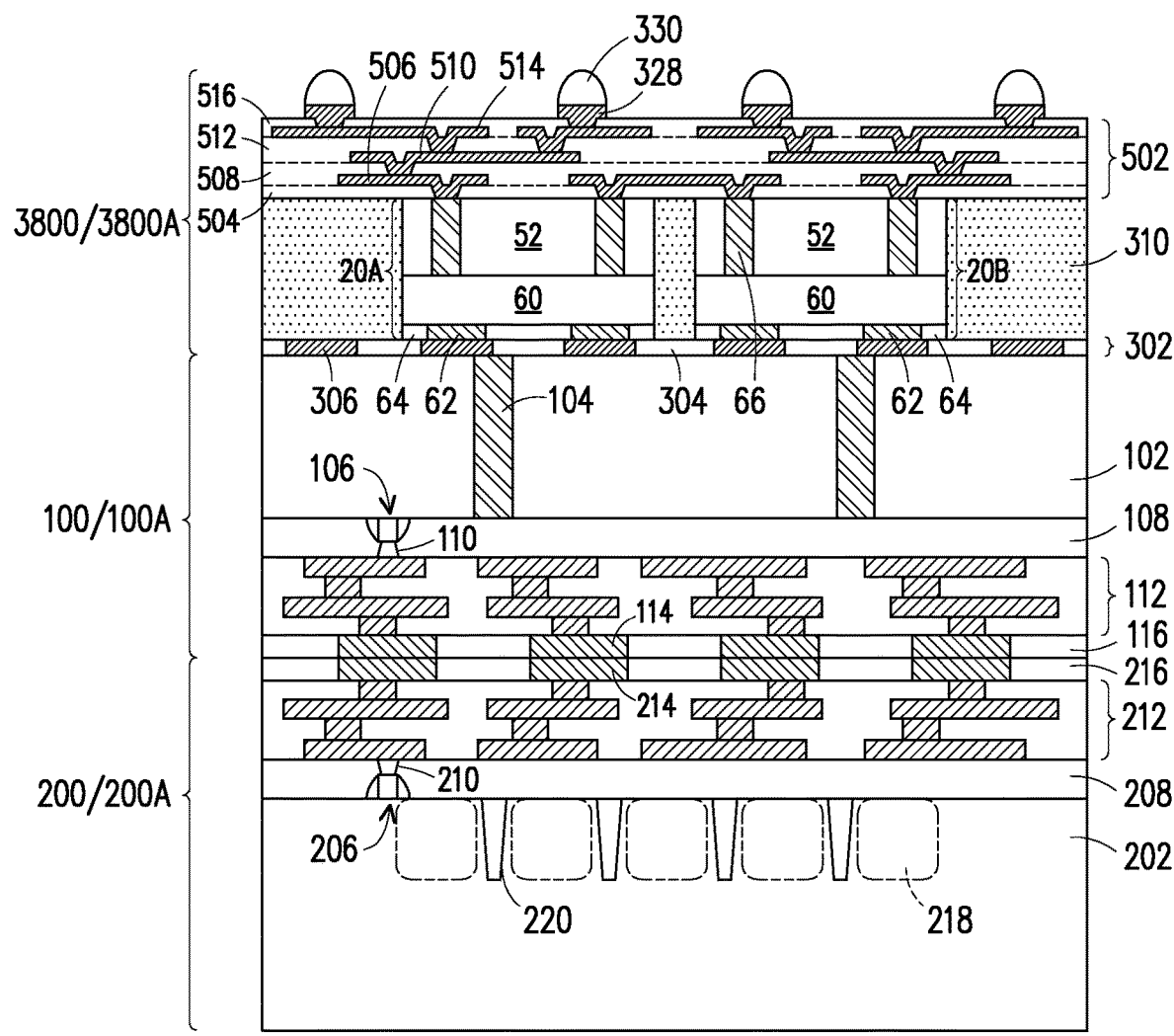

FIGS. 31-36 illustrate cross-sectional views of intermediate steps during a process for forming a package 1800 in accordance with some embodiments. Some features and process steps described with reference to FIGS. 31-36 may be similar to the features and the process steps described above with reference to FIGS. 5-18, and the description of the similar features and process steps are not repeated herein. FIG. 31-33 illustrate a formation of a wafer-level packaged structure 3800 on the backside of the wafer 100 after bonding the wafer 100 to the wafer 200. The wafer-level packaged structure 3800 may be also referred to as a wafer-level integrated fan-out (InFO) structure. The wafer 100 may be bonded to the wafer 200 as described above with reference to FIG. 7 and the description is not repeated herein.

In FIG. 31, a backside surface of the wafer 100 is thinned to expose the TSVs 104 and the redistribution structure 302 comprising an insulating layer 304 and pads 306 are formed on the backside of the wafer 100 after the thinning. In some embodiments, the backside surface of the wafer 100 is thinned as described above with reference to FIG. 8 and the description is not repeated herein. In some embodiments, the redistribution structure 302 is formed as described above with reference to FIG. 9 and the description is not repeated herein.

Subsequently, a plurality of integrated circuit dies 20 (see FIG. 2), such as a first integrated circuit die 20A and a second integrated circuit die 20B, are bonded to the backside of the wafer 100. A desired type and quantity of integrated circuit dies 20 are bonded in each of the die regions (such as the die region 100A) of the wafer 100. In the illustrated embodiment, the first integrated circuit die 20A and the second integrated circuit die 20B are bonded adjacent one another. The first integrated circuit die 20A may be a logic device, such as a CPU, GPU, SoC, microcontroller, or the like. In some embodiments, the first integrated circuit die 20A may comprise integrated circuits that are configured for edge AI applications.

The second integrated circuit die 20B may be a memory device, such as a DRAM die, SRAM die, HMC module, HBM module, or the like. In some embodiments, the integrated circuit dies 20A and 20B may be the same type of dies, such as SoC dies. The first integrated circuit die 20A and the second integrated circuit die 20B may be formed in processes of a same technology node, or may be formed in processes of different technology nodes. For example, the first integrated circuit die 20A may be of a more advanced process node than the second integrated circuit die 20B. The integrated circuit dies 20A and 20B may have different sizes (e.g., different heights and/or surface areas), or may have the same size (e.g., same heights and/or surface areas).

In some embodiments, the integrated circuit dies 20A and 20B are bonded to the insulating layer 304 and the pads 306 of the redistribution structure 302 using a hybrid bonding method. The hybrid bonding method includes direct bonding the pads 62 of the integrated circuit dies 20A and 20B to the respective pads 306 of the redistribution structure 302 and direct boding the insulating layers 64 of the integrated circuit dies 20A and 20B to the insulating layer 304 of the redistribution structure 302.

In FIG. 32, an encapsulant 310 is formed on and around the integrated circuit dies 20A and 20B as described above with reference to FIG. 12 and the description is not repeated herein. Subsequently, a planarization process is performed on the encapsulant 310 to expose the backside surfaces of the integrated circuit dies 20A and 20B. The planarization process also exposes the TSVs 66 of the integrated circuit dies 20A and 20B. The planarization process may also remove portions of the backsides of the integrated circuit dies 20A and 20B and portions of the TSVs 66. Top surface of the encapsulant 310, the backside surfaces of the integrated circuit dies 20A and 20B, and exposed surface of the TSVs 66 are substantially coplanar or substantially level within process variations of the planarization process. The planarization process may comprise CMP, grinding, etching, a combination thereof, or the like.

In FIG. 33, a redistribution structure 502 is formed over the encapsulant 310 and the integrated circuit dies 20A and 20B. The redistribution structure 502 includes insulating layers 504, 508, 512, and 516; and metallization patterns 506, 510, and 514. The metallization patterns may also be referred to as redistribution layers or redistribution lines. The redistribution structure 502 is shown as an example having three layers of metallization patterns. More or fewer insulating layers and metallization patterns may be formed in the redistribution structure 502. The redistribution structure 502 may be formed using similar materials and methods as the redistribution structure 312 described above with reference to FIG. 14 and the description is not repeated herein. The insulating layers 504, 508, 512, and 516 may be formed using similar materials and methods as the insulating layer 314 described above with reference to FIG. 14 and the description is not repeated herein. The metallization patterns 506, 510, and 514 may be formed using similar materials and methods as the metallization pattern 316 described above with reference to FIG. 14 and the description is not repeated herein. After forming the redistribution structure 502, UBMs 328 and corresponding conductive connectors 330 are formed over the redistribution structure 502 as described above with reference to FIG. 14 and the description is not repeated herein.

Figure 34:
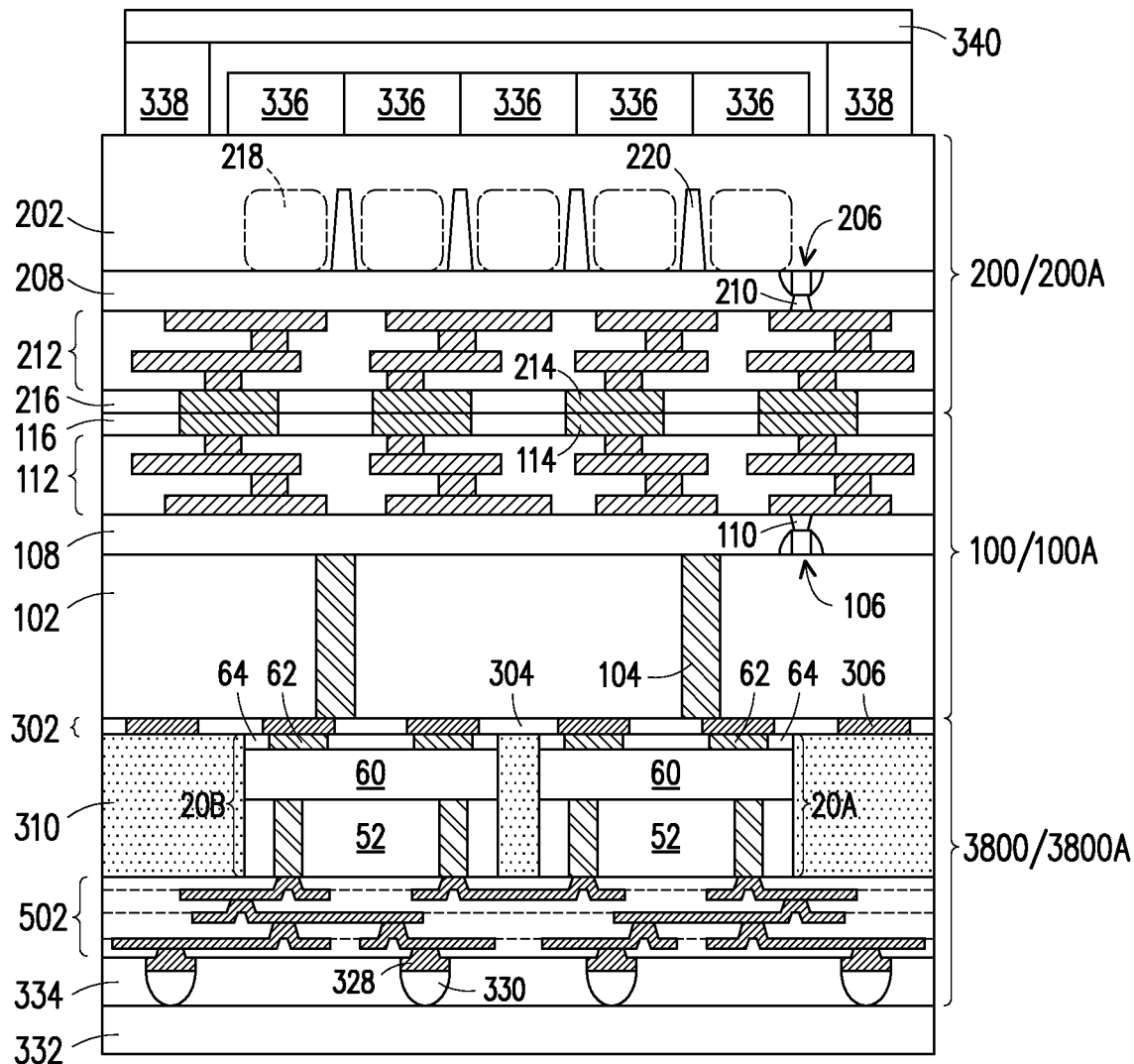

In FIG. 34, the stacked wafer-level structure of FIG. 33 is flipped and is attached to a carrier substrate 332 using an adhesive 334. Subsequently, a thinning process is performed on the backside of the substrate 202 of the wafer 200 as described above with reference to FIG. 15 and the description is not repeated herein. After performing the thinning process, color filters 336 are formed over the backside surface of the substrate 202 of the wafer 200 as described above with reference to FIG. 16 and the description is not repeated herein. In some embodiments, a dam structure 338 is formed over the backside surface of the substrate 202 of the wafer 200 and surrounding the color filters 336 as described above with reference to FIG. 16 and the description is not repeated herein. Subsequently, a cover 340 is attached to the dam structure 338 as described above with reference to FIG. 16 and the description is not repeated herein.

Figure 35:
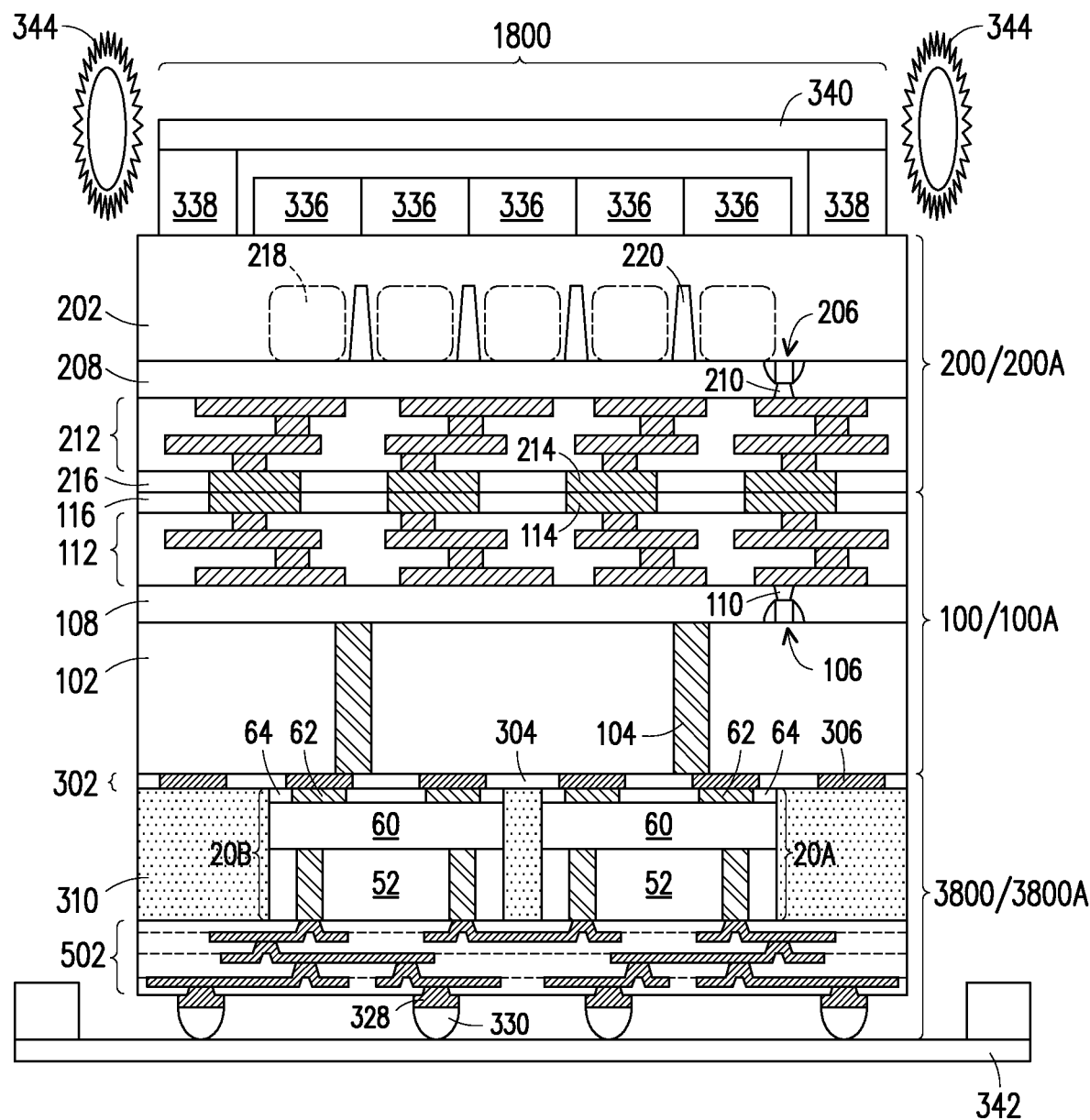

In FIG. 35, the stacked wafer-level structure of FIG. 34 is debonded from the carrier substrate 332 (see FIG. 34) and is placed on a dicing tape 342. Subsequently, a singulation process 344 is performed by sawing along scribe line regions, e.g., between adjacent die regions of the stacked wafer-level structure. The sawing singulates the die regions from the stacked wafer-level structure and forms packages 1800. Each of the packages 1800 comprises the die region 100A of the wafer 100, the die region 200A of the wafer 200, and the die region 3800A of the wafer-level packaged structure 3800.

Figure 36:
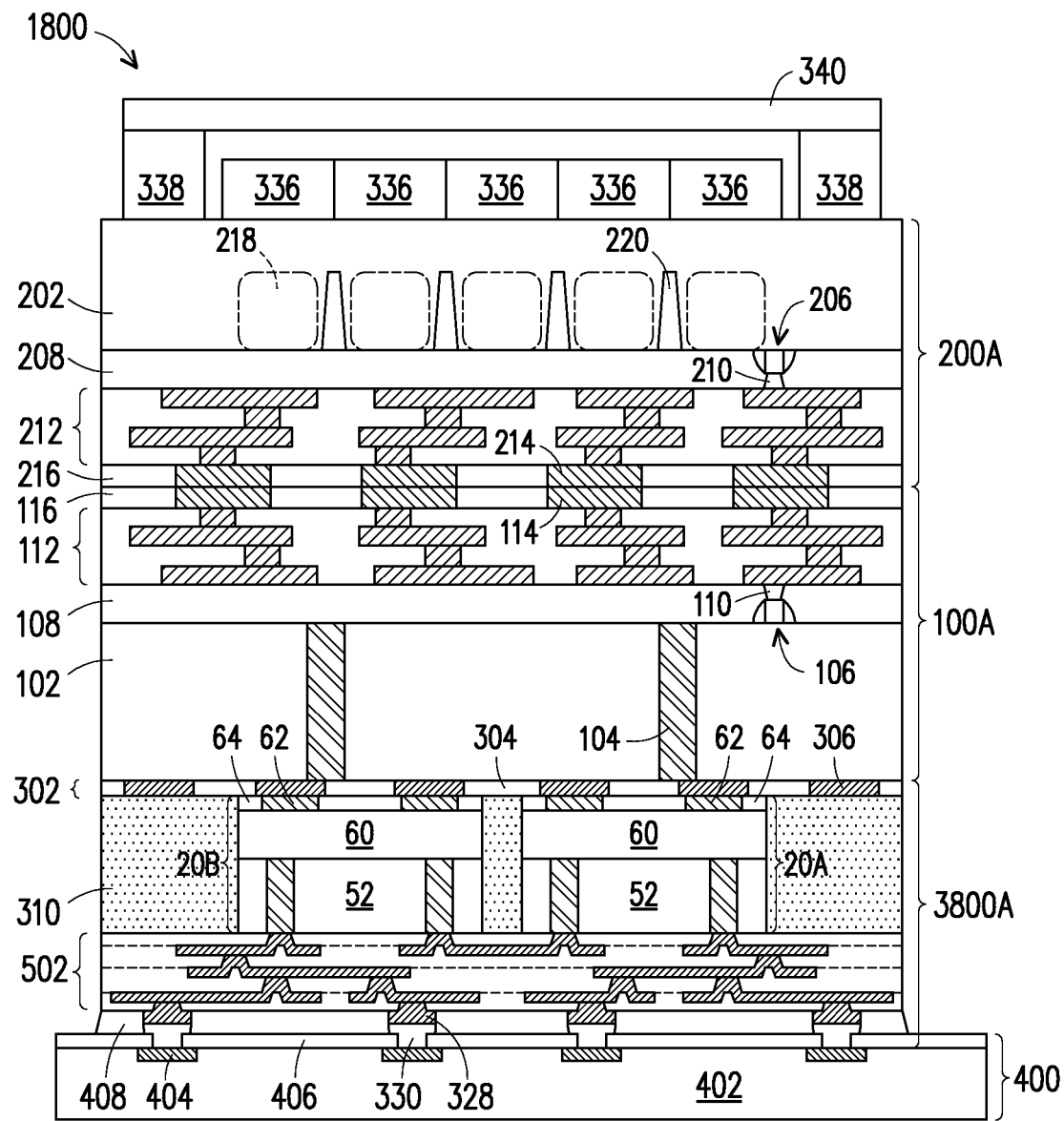

In FIG. 36, the package 1800 is attached to a package substrate 400 using connectors 330 as described above with reference to FIG. 18. Subsequently, an underfill 408 is formed between the package 1800 and the package substrate 400 and surrounding the conductive connectors 330 as described above with reference to FIG. 18.

Figure 37:
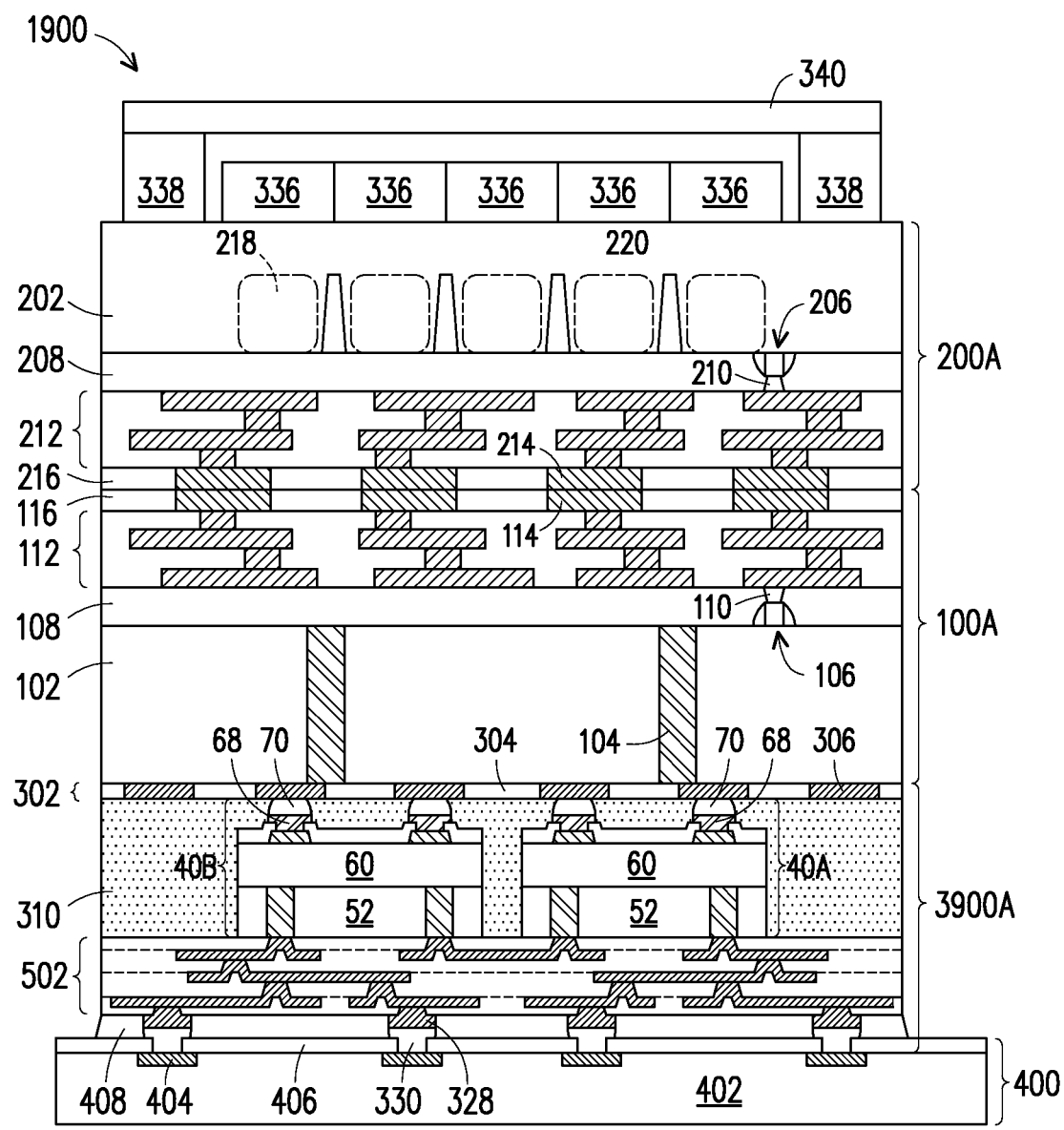
FIG. 37 illustrates a cross-sectional view of a package in accordance with some embodiments.

FIG. 37 illustrates a cross-sectional view of a package 1900 bonded to a package substrate 400 in accordance with some embodiments. In some embodiments, the package 1900 is similar to the package 1800 illustrated in FIG. 36, with similar features being labeled by similar numerical reference, and the detailed descriptions of the similar features are not repeated herein. In some embodiments, the package 1900 may be formed using process steps described above with reference to FIGS. 31-36 and the description is not repeated herein. The die region 3900A of the package 1900 is similar to the die region 3800A of the package 1800, with the distinction that the integrated circuited dies 40 (see FIG. 4) are packaged instead of the integrated circuited dies 10. In the illustrated embodiment, the integrated circuited dies 40 (such as the first integrated circuit die 40A and the second integrated circuit die 40B) are bonded to the backside of the die region 100A adjacent one another. The integrated circuit dies 40A and 40B are bonded to pads 306 of the redistribution structure 302 using the conductive connectors 70. The first integrated circuit die 40A may be a logic device, such as a CPU, GPU, SoC, microcontroller, or the like. In some embodiments, the first integrated circuit die 40A may comprise integrated circuits that are configured for edge AI applications.

The second integrated circuit die 40B may be a memory device, such as a DRAM die, SRAM die, HMC module, a high bandwidth memory HBM module, or the like. In some embodiments, the integrated circuit dies 40A and 40B may be the same type of dies, such as SoC dies. The first integrated circuit die 40A and the second integrated circuit die 40B may be formed in processes of a same technology node, or may be formed in processes of different technology nodes. For example, the first integrated circuit die 40A may be of a more advanced process node than the second integrated circuit die 40B. The integrated circuit dies 40A and 40B may have different sizes (e.g., different heights and/or surface areas), or may have the same size (e.g., same heights and/or surface areas).

Figure 38:
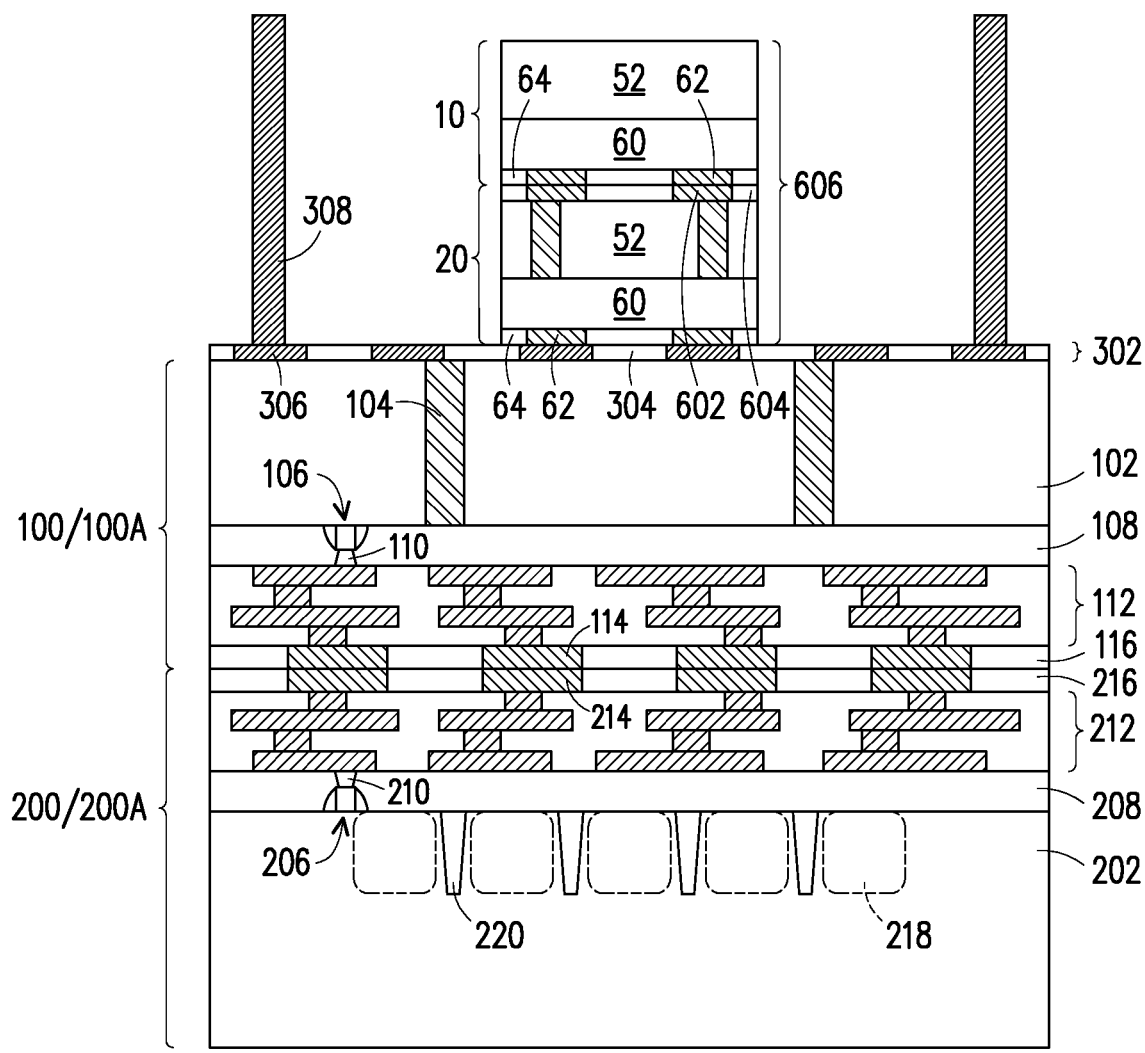
FIGS. 38-43 illustrate cross-sectional views of intermediate steps during a process for forming a package in accordance with some embodiments.
Figure 39:
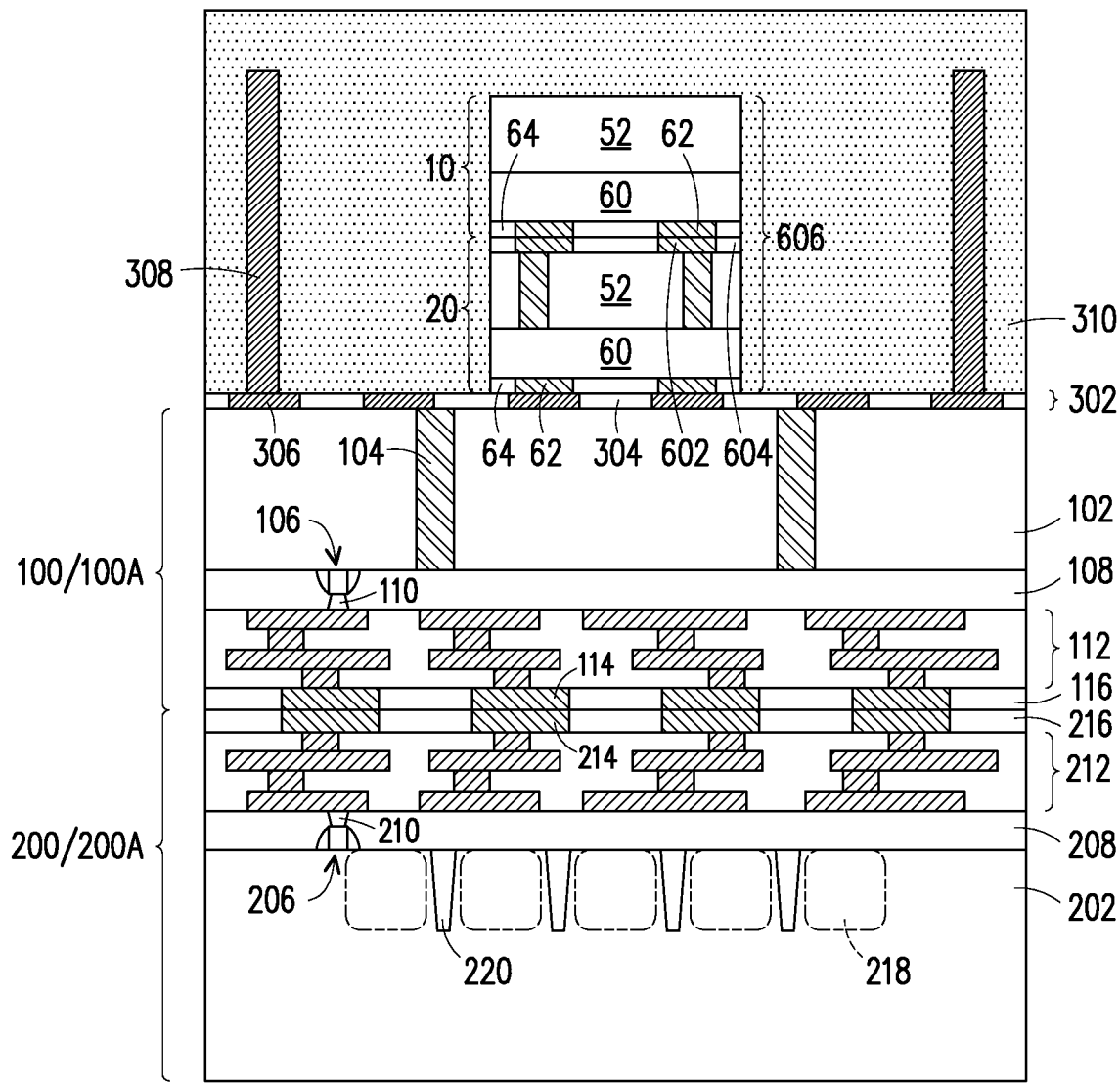
Figure 40:
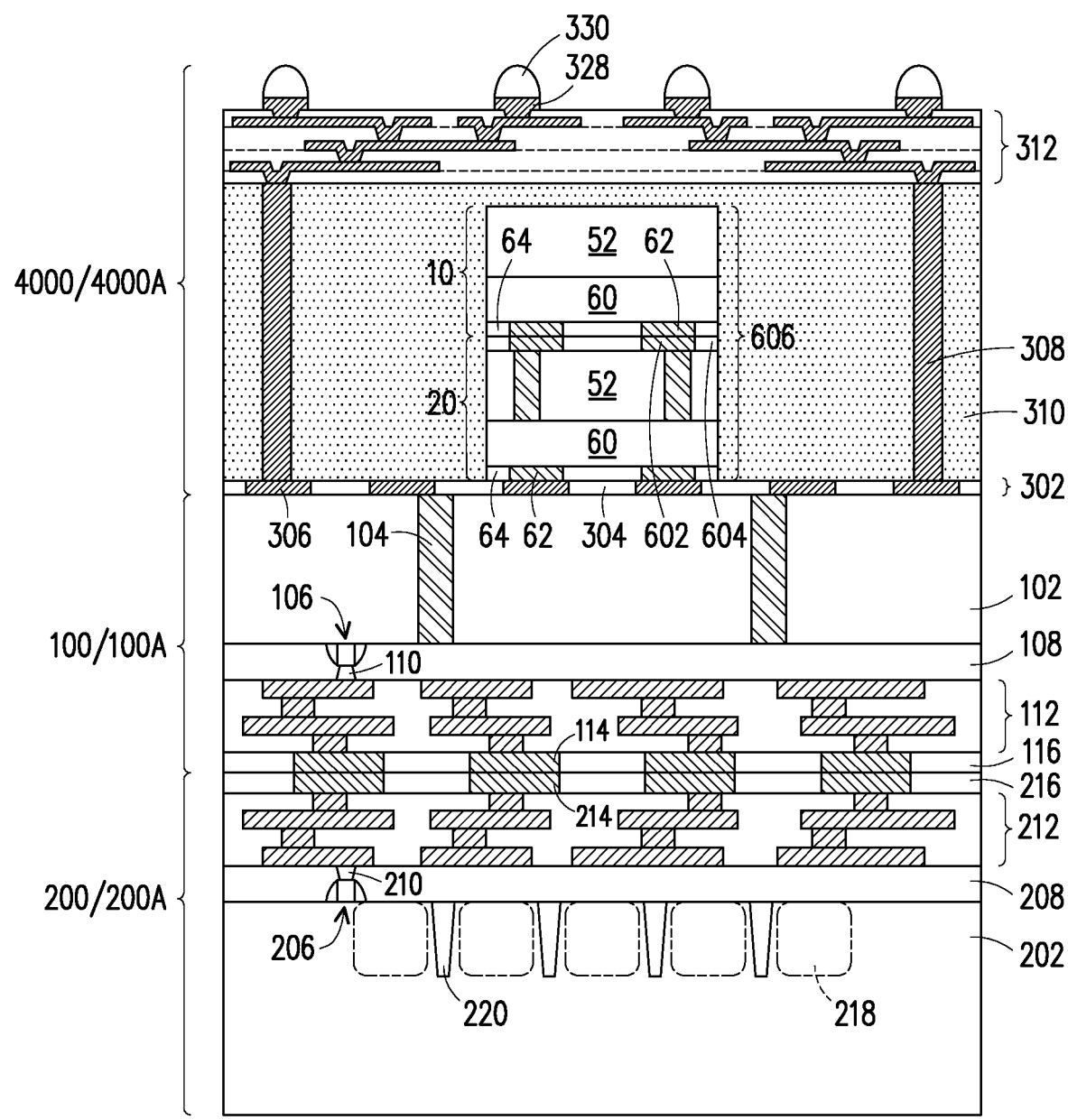

FIGS. 38-43 illustrate cross-sectional views of intermediate steps during a process for forming a package 2000 in accordance with some embodiments. Some features and process steps described with reference to FIGS. 33-43 may be similar to the features and the process steps described above with reference to FIGS. 5-18, and the description of the similar features and process steps are not repeated herein. FIGS. 38-40 illustrate a formation of a wafer-level package structure 4000 on the backside of the wafer 100 after bonding the wafer 100 to the wafer 200. The wafer-level packaged structure 4000 may be also referred to as a wafer-level integrated fan-out (InFO) structure. The wafer 100 may be bonded to the wafer 200 as described above with reference to FIG. 7 and the description is not repeated herein.

In FIG. 38, a backside surface of the wafer 100 is thinned to expose the TSVs 104 and a redistribution structure 302 comprising an insulating layer 304 and pads 306 are formed on the backside of the wafer 100 after the tinning. In some embodiments, the backside surface of the wafer 100 is thinned as described above with reference to FIG. 8 and the description is not repeated herein. In some embodiments, the redistribution structure 302 is formed as described above with reference to FIG. 9 and the description is not repeated herein. After forming the redistribution structure 302, through vias 308 are formed over the pads 306 of the redistribution structure 302 as described above with reference to FIG. 10 and the description is not repeated herein.

Subsequently, a plurality of die stacks (such as a die stack 606 comprising integrated circuit dies 10 and 20) is bonded to the backside of the wafer 100. The integrated circuit die 20 may be a logic device, such as a CPU, GPU, SoC, microcontroller, or the like. In some embodiments, the integrated circuit die 20 may comprise integrated circuits that are configured for edge AI applications. The integrated circuit die 10 may be a memory device, such as a DRAM die, SRAM die, HMC module, HBM module, or the like. The integrated circuit die 10 and the integrated circuit die 20 may be formed in processes of a same technology node, or may be formed in processes of different technology nodes. For example, the integrated circuit die 20 may be of a more advanced process node than the integrated circuit die 10. The integrated circuit dies 10 and 20 may have different sizes (e.g., different heights and/or surface areas), or may have the same size (e.g., same heights and/or surface areas).

In some embodiments, the die stack 606 is formed by bonding the integrated circuit die 10 to the integrated circuit die 20. In some embodiments, an insulating layer 604 and pads 602 are formed on the backside of the integrated circuit die 20. The insulating layer 604 and the pads 602 may be formed using similar materials and methods as the insulating layer 64 and the pads 62, respectively, described above with reference to FIG. 1 and the description is not repeated herein. The integrated die 10 may be bonded to the integrated die 20 using a hybrid bonding method. The hybrid bonding method includes direct bonding the pads 62 of the integrated circuit die 10 to the respective pads 602 of the integrated circuit die 20, and direct boding the insulating layer 64 of the integrated circuit die 10 to the insulating layer 604 of the integrated circuit die 20.

After forming the die stack 606, the die stack 606 is attached to the backside of the wafer 100 using a hybrid bonding method. The hybrid bonding method includes direct bonding the pads 62 of the integrated circuit die 20 to the respective pads 306 of the redistribution structure 302, and direct boding the insulating layer 64 of the integrated circuit die 20 to the insulating layer 304 of the redistribution structure 302.

In FIG. 39, an encapsulant 310 is formed on and around the die stack 606 and the through vias 308 as described above with reference to FIG. 12 and the description is not repeated herein.

In FIG. 40, a planarization process is performed on the encapsulant 310 to expose through vias 308. In some embodiments, a portion of the encapsulant 310 covers the backside of the integrated circuit die 10 after performing the planarization process. The planarization process may also remove portions of the through vias 308. Top surface of the encapsulant 310 and exposed surfaces of the through vias 308 are substantially coplanar or substantially level within process variations of the planarization process. The planarization process may comprise CMP, grinding, etching, a combination thereof, or the like. After performing the planarization process, a redistribution structure 312 is formed over the encapsulant 310 and the through vias 308 as describe above with reference to FIG. 14 and the description is not repeated herein. After forming the redistribution structure 312, UBMs 328 and corresponding conductive connectors 330 are formed over the redistribution structure 312 as described above with reference to FIG. 14 and the description is not repeated herein.

Figure 41:
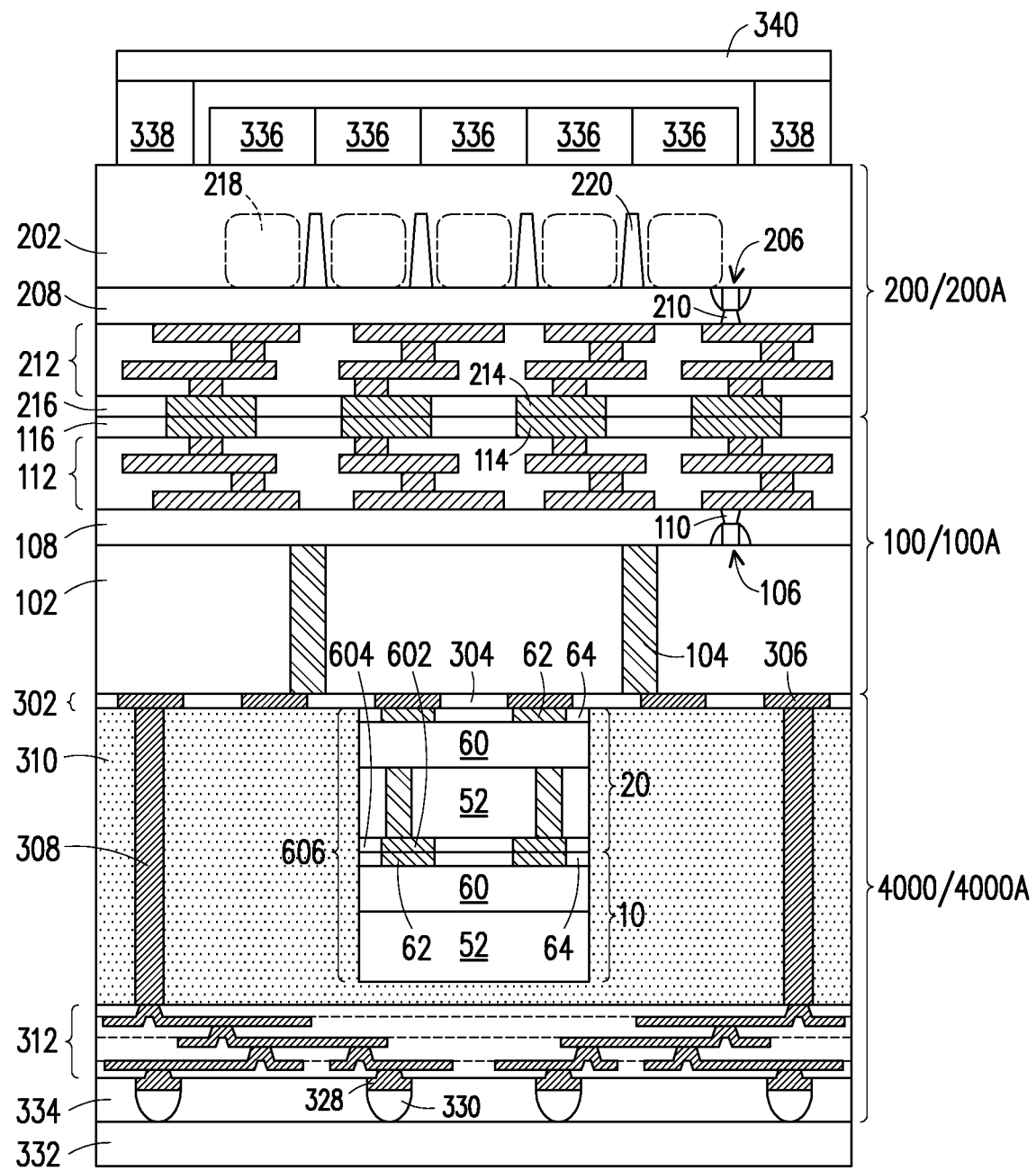

In FIG. 41, the stacked wafer-level structure of FIG. 40 is flipped and is attached to a carrier substrate 332 using an adhesive 334. Subsequently, a thinning process is performed on the backside of the substrate 202 of the wafer 200 as described above with reference to FIG. 15 and the description is not repeated herein. After performing the thinning process, color filters 336 are formed over the backside surface of the substrate 202 of the wafer 200 as described above with reference to FIG. 16 and the description is not repeated herein. In some embodiments, a dam structure 338 is formed over the backside surface of the substrate 202 of the wafer 200 and surrounding the color filters 336 as described above with reference to FIG. 16 and the description is not repeated herein. Subsequently, a cover 340 is attached to the dam structure 338 as described above with reference to FIG. 16 and the description is not repeated herein.

Figure 42:
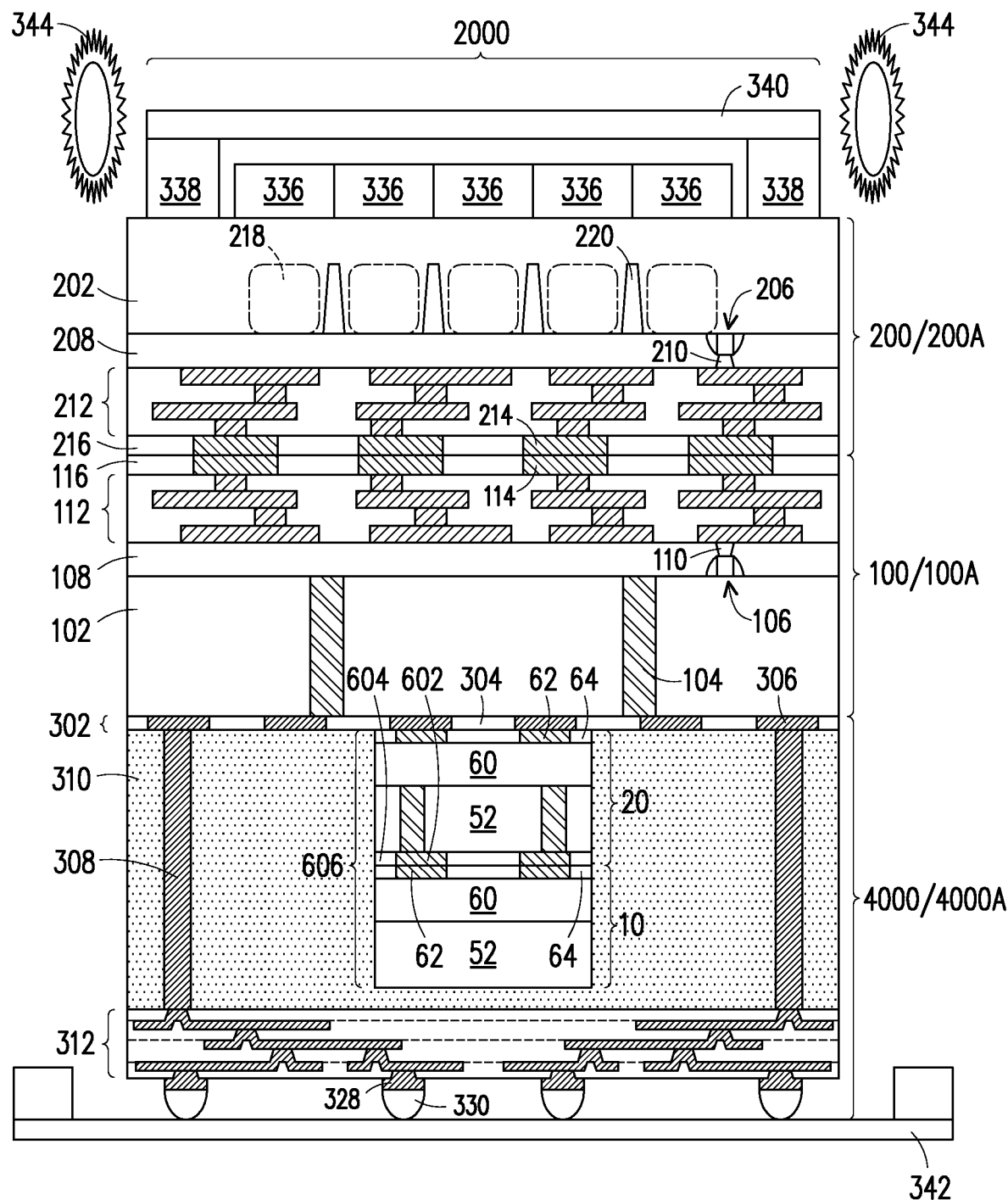

In FIG. 42, the stacked wafer-level structure of FIG. 41 is debonded from the carrier substrate 332 (see FIG. 41) and is placed on a dicing tape 342. Subsequently, a singulation process 344 is performed by sawing along scribe line regions, e.g., between adjacent die regions of the stacked wafer-level structure. The sawing singulates the die regions from the stacked wafer-level structure and forms packages 2000. Each of the packages 2000 comprises the die region 100A of the wafer 100, the die region 200A of the wafer 200, and the die region 4000A of the wafer-level packaged structure 4000.

Figure 43:
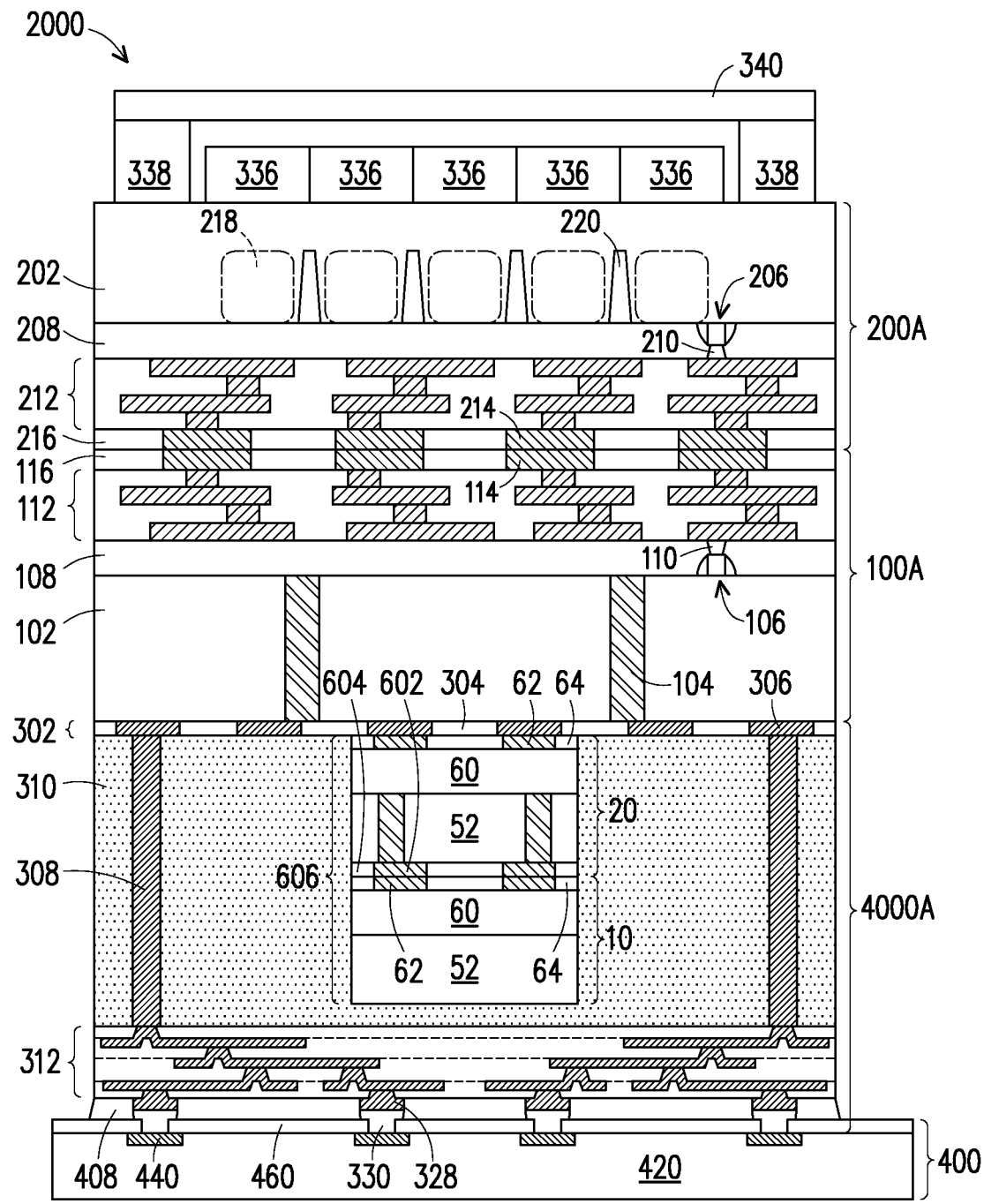

In FIG. 43, the package 2000 is attached to a package substrate 400 using conductive connectors 330 as described above with reference to FIG. 18. Subsequently, an underfill 408 is formed between the package 2000 and the package substrate 400 and surrounding the conductive connectors 330 as described above with reference to FIG. 18.

Figure 44:
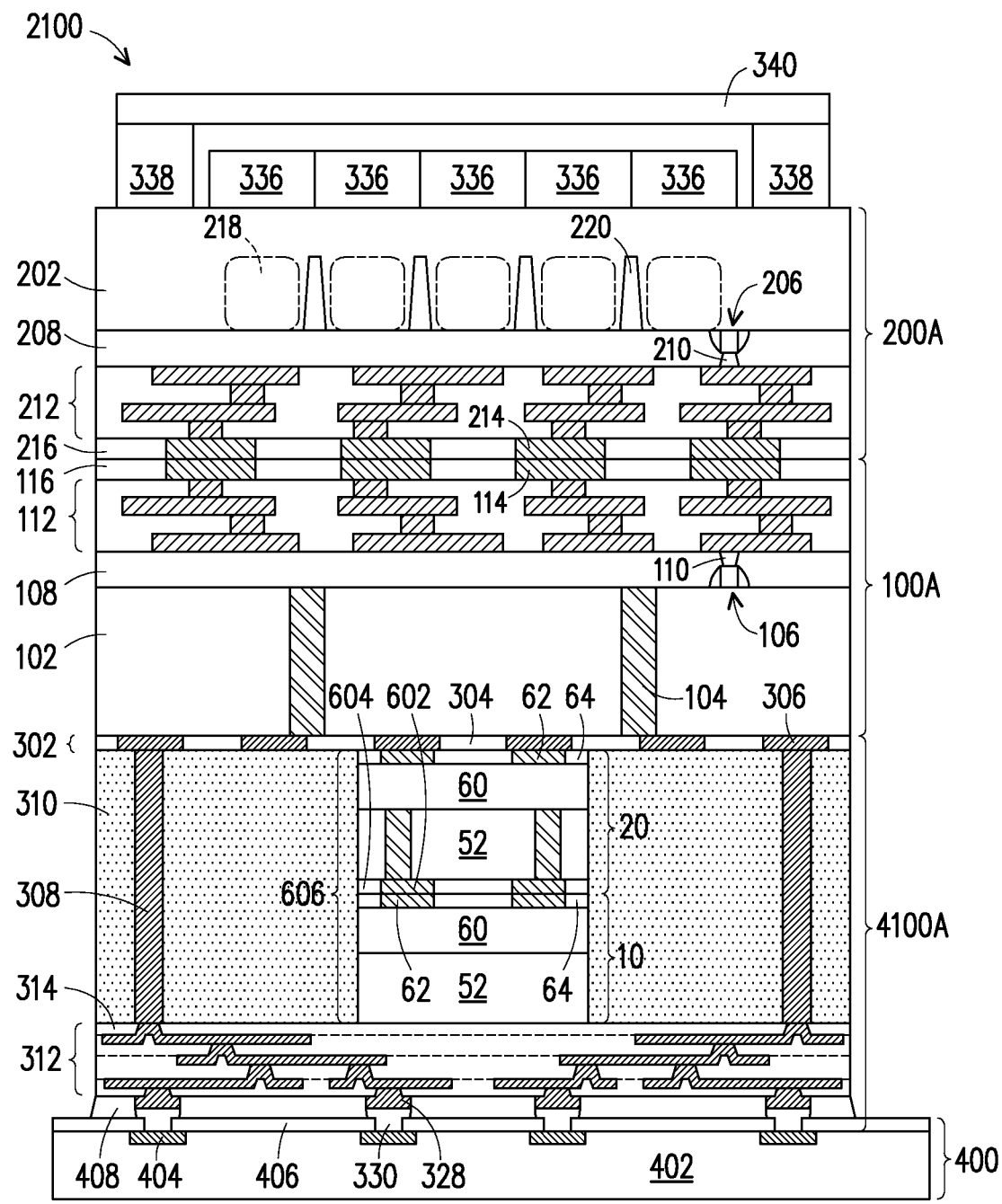
FIG. 44 illustrates a cross-sectional view of a package in accordance with some embodiments.

FIG. 44 illustrates a cross-sectional view of a package 2100 bonded to a package substrate 400 in accordance with some embodiments. In some embodiments, the package 2100 is similar to the package 2000 illustrated in FIG. 43, with similar features being labeled by similar numerical reference, and the detailed descriptions of the similar features are not repeated herein. In some embodiments, the package 2100 may be formed using process steps described above with reference to FIGS. 38-43 and the description is not repeated herein. The die region 4100A of the package 2100 is similar to the die region 4000A of the package 2000, with the distinction that a lower surface of the encapsulant 310 of die region 4100A is substantially coplanar or substantially level with lower surfaces of the through vias 308 and the backside surfaces of the integrated circuit die 10 of the die stack 606. In the illustrated embodiment, the insulating layer 314 of the redistribution structure 312 is in physical contact with the backside surface of the integrated circuit die 10. In such embodiments, the encapsulant 310 is planarized such that, in addition to the through vias 308, the backside surfaces of the integrated circuit die 10 is also exposed.

Figure 45:
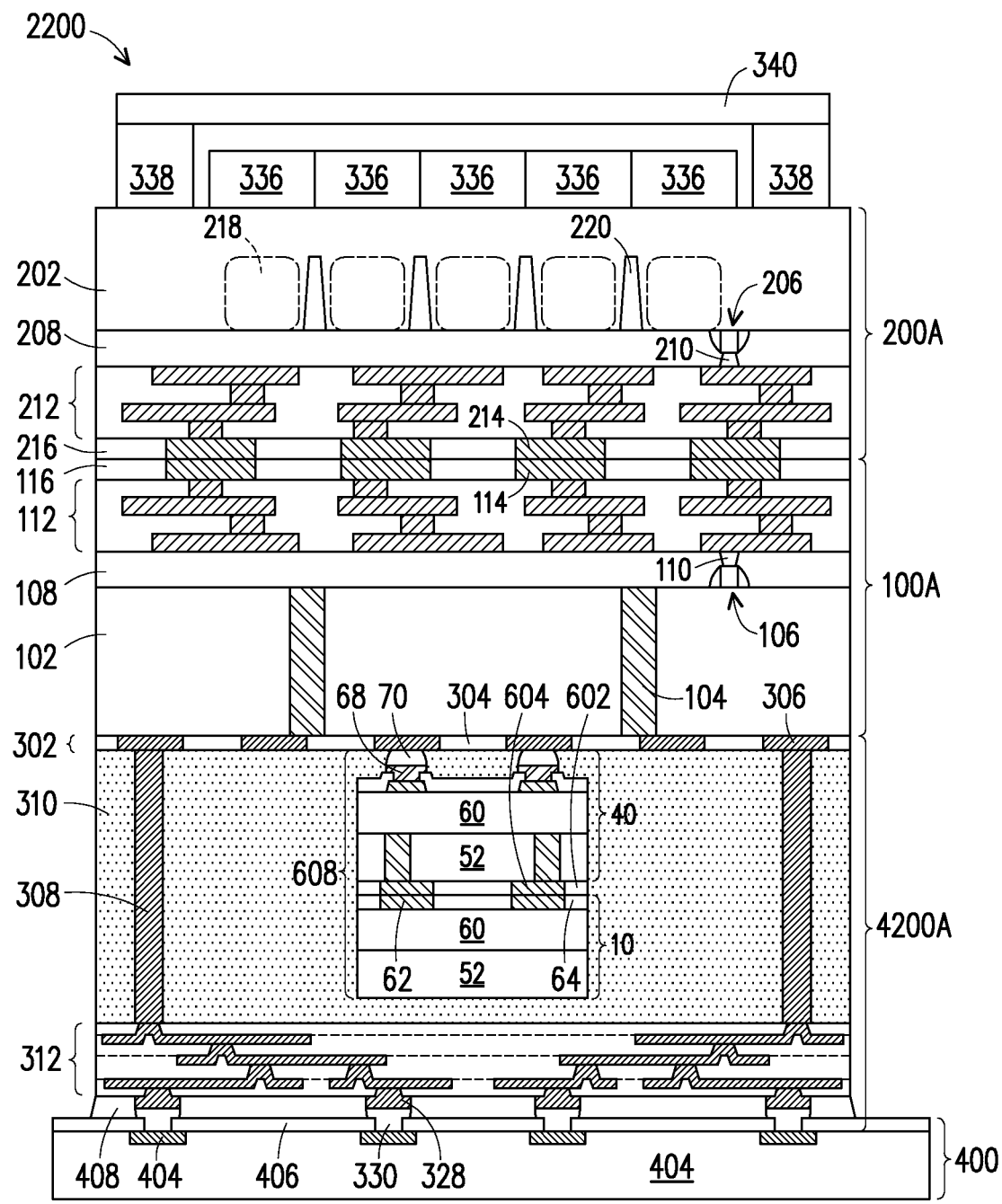
FIG. 45 illustrates a cross-sectional view of a package in accordance with some embodiments.

FIG. 45 illustrates a cross-sectional view of a package 2200 bonded to a package substrate 400 in accordance with some embodiments. In some embodiments, the package 2200 is similar to the package 2000 illustrated in FIG. 43, with similar features being labeled by similar numerical reference, and the detailed descriptions of the similar features are not repeated herein. In some embodiments, the package 2200 may be formed using process steps described above with reference to FIGS. 38-43 and the description is not repeated herein. The die region 4200A of the package 2200 is similar to the die region 4000A of the package 2000, with the distinction that the die stack 608 is packaged instead of the die stack 606. The die stack 608 comprises an integrated circuit die 10 (see FIG. 1) bonded to an integrated circuit die 40 (see Figure). In some embodiments, the integrated circuit die 10 is bonded to the integrated circuit die 40 using a hybrid bonding method as described above with reference to FIG. 38 and the description is not repeated herein. The die stack 608 is bonded to the pads 306 of the redistribution structure 302 using conductive connectors 70 of the integrated circuit die 40. The integrated circuit die 40 may be a logic device, such as a CPU, GPU, SoC, microcontroller, or the like. In some embodiments, the integrated circuit die 40 may comprise integrated circuits that are configured for edge AI applications.

The integrated circuit die 10 may be a memory device, such as a DRAM die, SRAM die, HMC module, a high bandwidth memory HBM module, or the like. In some embodiments, the integrated circuit dies 10 and 40 may be the same type of dies, such as SoC dies. The integrated circuit die 10 and the integrated circuit die 40 may be formed in processes of a same technology node, or may be formed in processes of different technology nodes. For example, the integrated circuit die 40 may be of a more advanced process node than the integrated circuit die 10. The integrated circuit dies 10 and 40 may have different sizes (e.g., different heights and/or surface areas), or may have the same size (e.g., same heights and/or surface areas).

Figure 46:
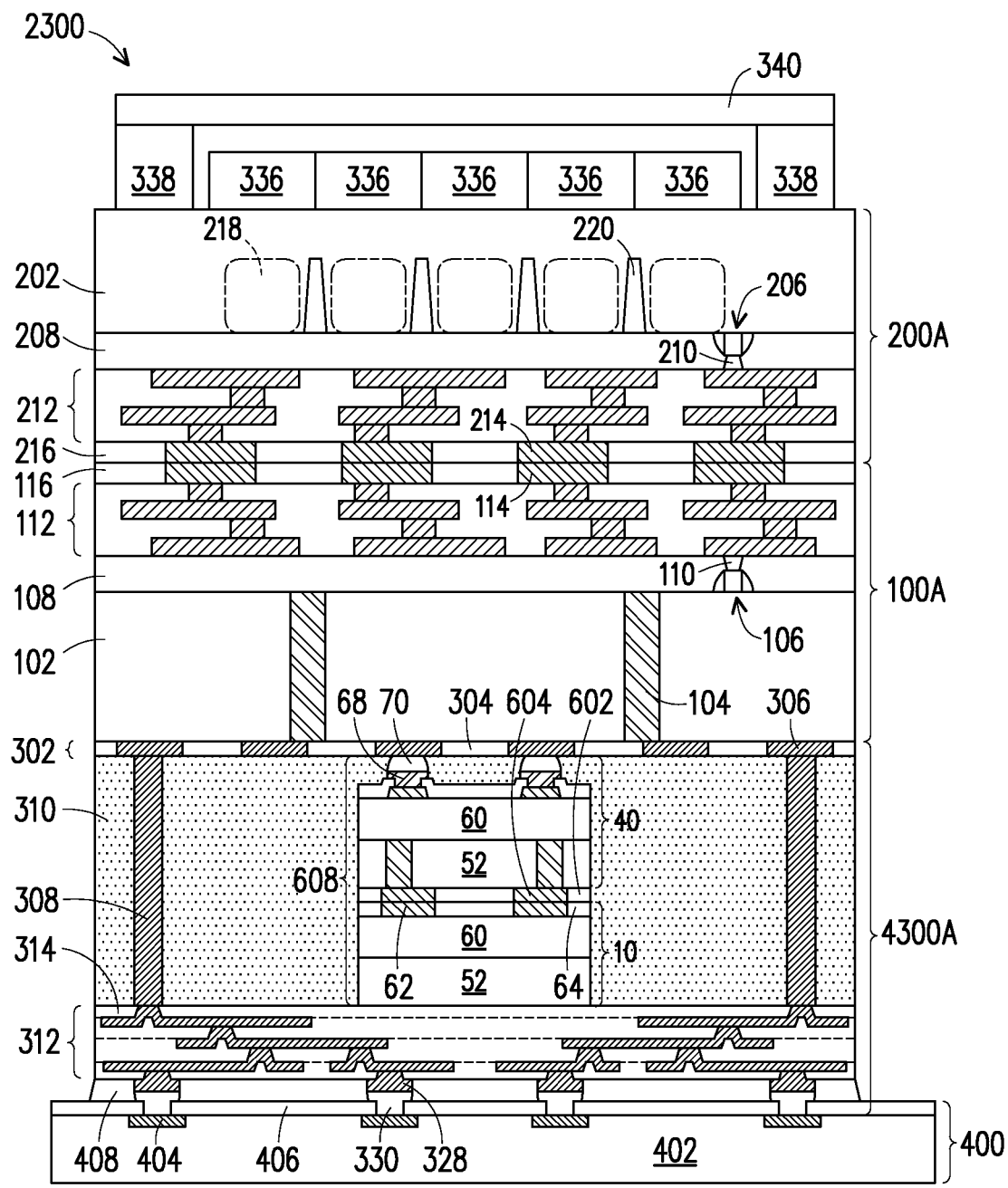
FIG. 46 illustrates a cross-sectional view of a package in accordance with some embodiments.

FIG. 46 illustrates a cross-sectional view of a package 2300 bonded to a package substrate 400 in accordance with some embodiments. In some embodiments, the package 2300 is similar to the package 2200 illustrated in FIG. 45, with similar features being labeled by similar numerical reference, and the detailed descriptions of the similar features are not repeated herein. In some embodiments, the package 2300 may be formed using process steps described above with reference to FIGS. 38-43 and 45, and the description is not repeated herein. The die region 4300A of the package 2300 is similar to the die region 4200A of the package 2200, with the distinction that a lower surface of the encapsulant 310 of die region 4300A is substantially coplanar or substantially level with lower surfaces of the through vias 308 and the backside surfaces of the integrated circuit die 10 of the die stack 608. In the illustrated embodiment, the insulating layer 314 of the redistribution structure 312 is in physical contact with the backside surface of the integrated circuit die 10. In such embodiments, the encapsulant 310 is planarized such that, in addition to the through vias 308, the backside surface of the integrated circuit die 10 is also exposed.

Figure 47:
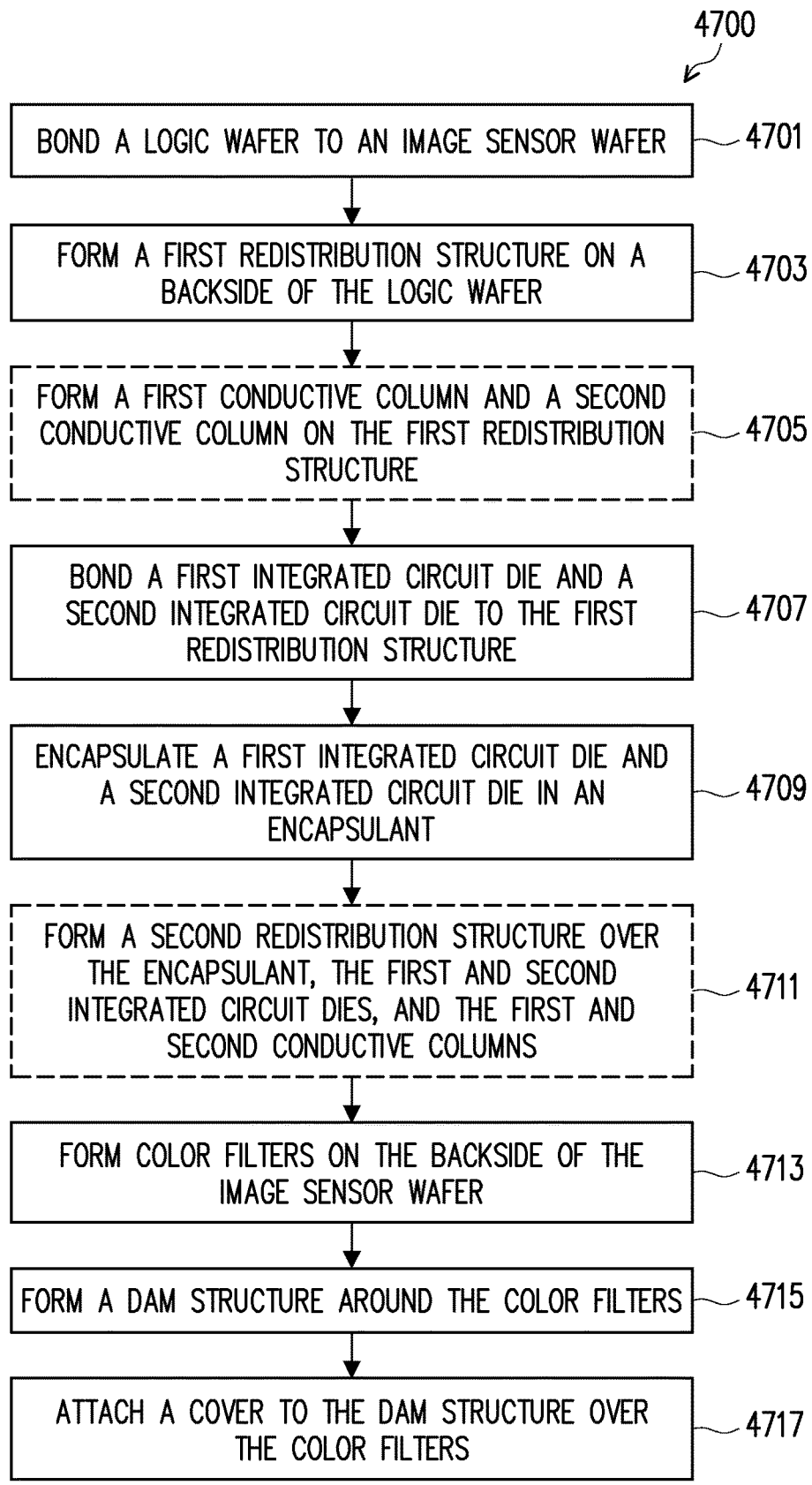
FIG. 47 is a flow diagram illustrating a method of forming a package in accordance with some embodiments.

FIG. 47 is a flow diagram illustrating a method 4700 of forming a package in accordance with some embodiments. The method 4700 starts with step 4701, where a logic wafer (such as the wafer 100 illustrated in FIG. 7) is bonded to an image sensor wafer (such as the wafer 200 illustrated in FIG. 7) as described above with reference to FIG. 7. In step 4703, a first redistribution structure (such as the redistribution structure 302 illustrated in FIG. 9) is formed on a backside of the logic wafer as described above with reference to FIG. 9. In step 4705, a first conductive column (such as the through via 308 illustrated in FIG. 10) and a second conductive column (such as the through via 308 illustrated in FIG. 10) are formed on the first redistribution structure as described above with reference to FIG. 10. In step 4707, a first integrated circuit die (such as the integrated circuit die 10A illustrated in FIG. 11) and a second integrated circuit die (such as the integrated circuit die 10B illustrated in FIG. 11) are bonded to the first redistribution structure as described above with reference to FIG. 11. In some embodiments, the first integrated circuit die is a logic die. In some embodiments, the first integrated circuit die and the second integrated circuit die are bonded to the first redistribution structure using a hybrid bonding method. In other embodiments, the first integrated circuit die and the second integrated circuit die are bonded to the first redistribution structure using conductive connectors. In yet other embodiments, the first integrated circuit die and the second integrated circuit die are bonded to the first redistribution structure such that the first integrated circuit die and the second integrated circuit die form a die stack over the first redistribution structure. In step 4709, the first integrated circuit die and the second integrated circuit die are encapsulated in an encapsulant (such as the encapsulant illustrated in FIG. 12) as described above with reference to FIG. 12. In step 4711, a second redistribution structure (such as the redistribution structure 302 illustrated in FIG. 14) is formed over the encapsulant, the first and second integrated circuit dies, and the first and second conductive columns as described above with reference to FIG. 14. In step 4713, color filters (such as the color filters 336 illustrated in FIG. 16) are formed on the backside of the image sensor wafer as described above with reference to FIG. 16. In step 4715, a dam structure (such as the dam structure 338 illustrated in FIG. 16) is formed around the color filters as described above with reference to FIG. 16. In step 4717, a cover (such as the cover 340 illustrated in FIG. 16) is attached to the dam structure over the color filters as described above with reference to FIG. 16. In other embodiments, the step 4705 may be omitted. In yet other embodiments, the steps 4705 and 4711 may be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment, a semiconductor device includes: a first logic die including a first through via; an image sensor die hybrid bonded to the first logic die, a front side of the first logic die facing a front side of the image sensor die; and a second logic die bonded to the first logic die, a front side of the second logic die facing a backside of the first logic die, the second logic die including a first conductive pad electrically coupled to the first through via. In an embodiment, the second logic die is hybrid bonded to the first logic die. In an embodiment, the second logic die is bonded to the first logic die using a plurality of first connectors. In an embodiment, the semiconductor device further includes a memory die bonded to the first logic die, a front side of the memory die facing the backside of the first logic die. In an embodiment, a memory die is hybrid bonded to the first logic die. In an embodiment, a memory die is bonded to the first logic die using a plurality of second connectors. In an embodiment, the semiconductor device further includes a memory die hybrid bonded to the second logic die, a front side of the memory die facing a backside of the second logic die.

In accordance with another embodiment, a semiconductor device includes: a first logic die, a front side of the first logic die including a first insulating layer and a first conductive pad, a backside of the first logic die including a second insulating layer and a second conductive pad; an image sensor die bonded to the first logic die, a front side of the image sensor die including a third insulating layer and a third conductive pad, the third conductive pad being in physical contact with the first conductive pad, the third insulating layer being in physical contact with the first insulating layer; and a second logic die bonded to the first logic die, a front side of the second logic die including a fourth insulating layer and a fourth conductive pad, the fourth insulating layer facing the second insulating layer. In an embodiment, the second insulating layer is in physical contact with the fourth insulating layer, and the second conductive pad is in physical contact with the fourth conductive pad. In an embodiment, the semiconductor device further includes a conductive connector, the conductive connector electrically and mechanically coupling the second conductive pad to the fourth conductive pad. In an embodiment, the semiconductor device further includes an encapsulant extending along sidewalls of the second logic die. In an embodiment, the semiconductor device further includes a through via extending though the encapsulant adjacent the second logic die. In an embodiment, the semiconductor device further includes a redistribution structure electrically coupled to the through via, the second logic die being interposed between the redistribution structure and the first logic die. In an embodiment, a portion of the encapsulant is interposed between the second logic die and the redistribution structure.

In accordance with yet another embodiment, a method includes bonding a logic wafer to an image sensor wafer. A front side of the logic wafer includes a first conductive pad. A front side of the image sensor wafer includes a second conductive pad. Bonding the logic wafer to the image sensor wafer includes direct bonding the first conductive pad to the second conductive pad. A first redistribution structure is formed on a backside of the logic wafer. A logic die is bonded to the first redistribution structure. A front side of the logic die includes a third conductive pad. The third conductive pad is electrically coupled to the first redistribution structure. In an embodiment, bonding the logic die to the first redistribution structure includes direct bonding the third conductive pad of the logic die to a fourth conductive pad of the first redistribution structure. In an embodiment, bonding the logic die to the first redistribution structure includes electrically and mechanically coupling the third conductive pad of the logic die to a fourth conductive pad of the first redistribution structure using a conductive connector. In an embodiment, the method further includes forming an encapsulant on the first redistribution structure and around the logic die. In an embodiment, the method further includes forming a second redistribution structure in electrical contact with the first redistribution structure, the logic die being interposed between the first redistribution structure and the second redistribution structure. In an embodiment, the method further includes, before bonding the logic die to the first redistribution structure, forming a conductive column over the first redistribution structure, the conductive column electrically coupling the first redistribution structure to the second redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
bonding a logic wafer to an image sensor wafer, a front side of the logic wafer comprising a first conductive pad, a front side of the image sensor wafer comprising a second conductive pad, wherein the logic wafer comprises a plurality of first dies on a single continuous semiconductor substrate, wherein the logic wafer comprises through vias, wherein bonding the logic wafer to the image sensor wafer comprises direct bonding the first conductive pad to the second conductive pad;
after bonding the logic wafer to the image sensor wafer, forming a first redistribution structure on a backside of the logic wafer, the backside of the logic wafer facing away from the image sensor wafer, wherein the first redistribution structure comprises a plurality of conductive layers and a plurality of insulating layers, wherein the through vias of the logic wafer contact respective conductive features of the first redistribution structure, wherein the first redistribution structure is free of a semiconductor substrate, the first redistribution structure comprising a third conductive pad;
after forming the first redistribution structure, bonding a die stack to the first redistribution structure, a width of the die stack being less than a width of one of the first dies of the plurality of first dies of the logic wafer, the die stack comprising:
a logic die, a front side of the logic die comprising a fourth conductive pad and a first dielectric layer, wherein the fourth conductive pad is directly bonded to the third conductive pad of the first redistribution structure, wherein the first dielectric layer is directly bonded to a first insulating layer of the plurality of insulating layers, a backside of the logic die comprising a fifth conductive pad; and
a memory die bonded to the logic die, a front side of the memory die comprising a sixth conductive pad, the sixth conductive pad being directly bonded to the fifth conductive pad, the logic die being bonded to the memory die using direct dielectric-to-dielectric bonds; and
after bonding the die stack to the first redistribution structure, forming an encapsulant on the first redistribution structure and around the die stack, the die stack having a first height as measured from the first redistribution structure, the encapsulant having a second height as measured from the first redistribution structure, the first height of the die stack being less than the second height of the encapsulant, the first redistribution structure completely separating the encapsulant from the logic wafer.

2. The method of claim 1, further comprising forming a second redistribution structure in electrical contact with the first redistribution structure, the die stack being interposed between the first redistribution structure and the second redistribution structure.

3. The method of claim 2, further comprising, before bonding the die stack to the first redistribution structure, forming a conductive column over the first redistribution structure, the conductive column electrically coupling the first redistribution structure to the second redistribution structure.

4. The method of claim 3, wherein a third height of the conductive column is greater than the first height of the die stack.

5. The method of claim 4, wherein the encapsulant completely covers a backside of the die stack.

6. The method of claim 2, further comprising forming external connectors on the second redistribution structure, wherein a back side of the image sensor wafer is free of electrical contacts.

7. The method of claim 1, further comprising:
after forming the encapsulant, singulating the logic wafer and the image sensor wafer.

8. A method of forming a semiconductor device, the method comprising:
bonding a first logic die wafer to an image sensor die wafer, the first logic die wafer comprising a first through via, a front side of the first logic die wafer facing a front side of the image sensor die wafer, the image sensor die wafer comprising a first semiconductor substrate, the first semiconductor substrate completely covering external contacts of the image sensor die wafer, the first logic die wafer having a single continuous semiconductor substrate, the single continuous semiconductor substrate having a plurality of dies;
after bonding the first logic die wafer to the image sensor die wafer, forming a first redistribution structure on a back side of the first logic die wafer;
after forming the first redistribution structure, directly bonding a second logic die to the first redistribution structure using direct metal-to-metal bonds and direct dielectric-to-dielectric bonds, a front side of the second logic die facing a backside of the first logic die wafer, the second logic die comprising a first conductive pad electrically coupled to the first through via;
after forming the first redistribution structure, directly bonding a memory die to the first redistribution structure using direct metal-to-metal bonds and direct dielectric-to-dielectric bonds, a front side of the memory die facing the backside of the first logic die wafer;
forming a first conductive column and a second conductive column over the first redistribution structure, the second logic die being interposed between the first conductive column and the second conductive column, wherein a height of the first conductive column is greater than a height of the second logic die;
after bonding the second logic die to the first logic die wafer and after forming the first conductive column and the second conductive column, forming an encapsulant along sidewalls of the second logic die, a first surface of the encapsulant being spaced apart from the first logic die wafer by a greater distance than a backside of the second logic die, the first surface of the encapsulant and the backside of the second logic die facing away from the first logic die wafer;
after forming the encapsulant, forming a second redistribution structure on the first surface of the encapsulant, the second logic die being interposed between the first logic die wafer and the second redistribution structure, a portion of the encapsulant being interposed between the backside of the second logic die and the second redistribution structure, the backside of the second logic die facing the second redistribution structure; and
after forming the encapsulant, singulating the first logic die wafer and the image sensor die wafer to form a bonded structure having a first logic die and an image sensor die, wherein the first logic die is one die of the plurality of dies of the single continuous semiconductor substrate of the first logic die wafer, wherein after singulating a width of the second logic die is less than a width of the first logic die, a width of the encapsulant being equal to the width of the first logic die, wherein after singulating sidewalls of the first logic die and sidewalls of the image sensor die are free of the encapsulant.

9. The method of claim 8, further comprising attaching a dam structure to a backside of the image sensor die.

10. The method of claim 9, further comprising attaching a cover to the dam structure.

11. The method of claim 10, wherein a width of the cover is less than a width of the image sensor die.

12. The method of claim 8, further comprising forming an external connection of the first redistribution structure, and after singulating, electrically coupling the second redistribution structure to a package substrate.

13. The method of claim 8, wherein the encapsulant extends between the second logic die and the memory die.

14. The method of claim 12, wherein the second redistribution structure is attached to the package substrate using solder balls.

15. A method of forming a semiconductor device, the method comprising:
bonding a first wafer to a second wafer, the first wafer comprising a plurality of logic dies, the plurality of logic dies comprising a first logic die, a front side of the first logic die comprising a first insulating layer, a first conductive pad, and a first through via, the second wafer comprising an image sensor die, a front side of the image sensor die comprising a second insulating layer and a second conductive pad, the second conductive pad being in physical contact with the first conductive pad, the second insulating layer being in physical contact with the first insulating layer;
after bonding the first wafer to the second wafer, forming a third insulating layer and a third conductive pad on a backside of the first logic die;
bonding a memory die to a second logic die, a width of the memory die being less than a width of the first logic die, a backside of the second logic die comprising a fourth insulating layer and a fourth conductive pad, a front side of the memory die comprising a fifth insulating layer and a fifth conductive pad, the fifth conductive pad being in physical contact with the fourth conductive pad, the fifth insulating layer being in physical contact with the fourth insulating layer;
directly bonding the second logic die to the first wafer using direct metal-to-metal bonds and direct dielectric-to-dielectric bonds, the second logic die being bonded to the first logic die, a width of the second logic die being less than a width of the first logic die, a front side of the second logic die comprising a sixth insulating layer and a sixth conductive pad, the sixth insulating layer facing the third insulating layer; and
after bonding the second logic die to the first wafer, forming an encapsulant extending along sidewalls of the second logic die and along sidewalls of the memory die, a portion of the encapsulant extending along and being in physical contact with a backside of the memory die, the backside of the memory die being opposite to the front side of the memory die, wherein sidewalls of the first wafer and sidewalls of the second wafer are free of the encapsulant.

16. The method of claim 15, wherein, after bonding the second logic die to the first logic die, the sixth insulating layer directly contacts the third insulating layer.

17. The method of claim 15, further comprising a second through via extending from the first logic die, wherein forming the encapsulant comprises forming the encapsulant along sidewalls of the second through via.

18. The method of claim 17, further comprising forming a redistribution structure over the encapsulant, the redistribution structure comprising a conductive line electrically coupled to the second through via, the second logic die being interposed between the redistribution structure and the first logic die.

19. The method of claim 18, further comprising:
   forming external connectors on the redistribution structure; and
   attaching the external connectors to a substrate.

\* \* \* \* \*